US011744092B2

(12) United States Patent
Sato

(10) Patent No.: US 11,744,092 B2
(45) Date of Patent: Aug. 29, 2023

(54) SOLID-STATE IMAGE SENSOR

(71) Applicant: SONY SEMICONDUCTOR SOLUTIONS CORPORATION, Kanagawa (JP)

(72) Inventor: Yusuke Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 290 days.

(21) Appl. No.: 17/260,869

(22) PCT Filed: Jul. 16, 2019

(86) PCT No.: PCT/JP2019/027890
§ 371 (c)(1),
(2) Date: Jan. 15, 2021

(87) PCT Pub. No.: WO2020/022119
PCT Pub. Date: Jan. 30, 2020

(65) Prior Publication Data
US 2021/0273018 A1    Sep. 2, 2021

(30) Foreign Application Priority Data

Jul. 26, 2018    (JP) .................. 2018-140218

(51) Int. Cl.
*H01L 27/146*    (2006.01)
*H10K 39/32*    (2023.01)
(Continued)

(52) U.S. Cl.
CPC ............. *H10K 39/32* (2023.02); *H04N 25/79* (2023.01); *H10K 19/20* (2023.02); *H10K 30/30* (2023.02);
(Continued)

(58) Field of Classification Search
CPC . H01L 27/307; H01L 27/286; H01L 51/4253; H01L 51/442; H01L 27/14647;
(Continued)

(56) References Cited

U.S. PATENT DOCUMENTS

2013/0313410 A1    11/2013    Goto
2015/0076326 A1    3/2015    Ohtsuki
(Continued)

FOREIGN PATENT DOCUMENTS

JP    2012-151771    8/2012
JP    2015-177323    10/2015
(Continued)

OTHER PUBLICATIONS

International Search Report prepared by the Japan Patent Office dated Sep. 30, 2019, for International Application No. PCT/JP2019/027890.

*Primary Examiner* — Samuel Park
(74) *Attorney, Agent, or Firm* — Sheridan Ross P.C.

(57) ABSTRACT

A solid-state image sensor includes a plurality of imaging element blocks each configured from a plurality of imaging elements. Each of the imaging elements includes a first electrode, a charge accumulating electrode arranged in a spaced relation from the first electrode, a photoelectric conversion portion contacting with the first electrode and formed above the charge accumulating electrode with an insulating layer interposed therebetween, and a second electrode formed on the photoelectric conversion portion. The first electrode and the charge accumulating electrode are provided on an interlayer insulating layer, and the first electrode is connected to a connection portion provided in the interlayer insulating layer.

17 Claims, 47 Drawing Sheets

(51) Int. Cl.
*H04N 25/79* (2023.01)
*H10K 19/20* (2023.01)
*H10K 30/30* (2023.01)
*H10K 30/82* (2023.01)
*H04N 23/10* (2023.01)

(52) U.S. Cl.
CPC ........ *H10K 30/82* (2023.02); *H01L 27/14647* (2013.01); *H04N 23/10* (2023.01)

(58) Field of Classification Search
CPC ........... H01L 27/14612; H01L 27/1463; H01L 27/14638; H01L 27/1464; H01L 27/14665; H01L 27/14641; H01L 27/14636; H04N 5/379; H04N 9/045; H04N 5/369; Y02E 10/549
See application file for complete search history.

(56) References Cited

U.S. PATENT DOCUMENTS

| | | |
|---|---|---|
| 2015/0349008 A1 | 12/2015 | Yamaguchi |
| 2016/0037098 A1* | 2/2016 | Lee ...................... H01L 27/307 257/292 |
| 2017/0019618 A1 | 1/2017 | Koga |
| 2017/0062499 A1* | 3/2017 | Yanagita ........... H01L 27/14636 |

FOREIGN PATENT DOCUMENTS

| | | | |
|---|---|---|---|
| JP | 2017055085 A | * | 3/2017 |
| JP | 2018-085402 | | 5/2018 |
| WO | WO 2014/002366 | | 1/2014 |
| WO | WO 2014/112279 | | 7/2014 |
| WO | WO-2018096980 A2 | | 5/2018 |

* cited by examiner

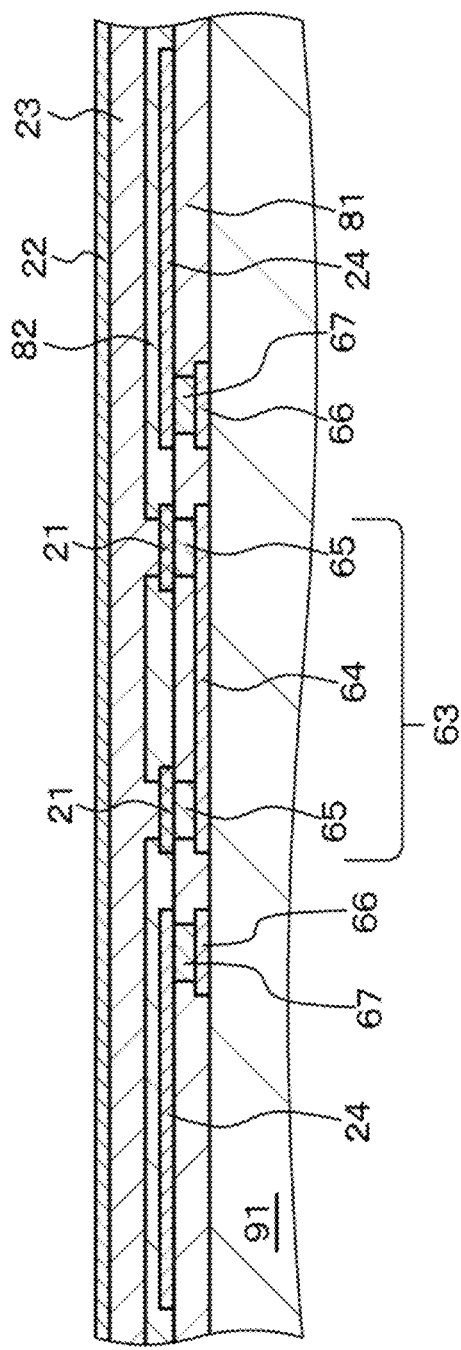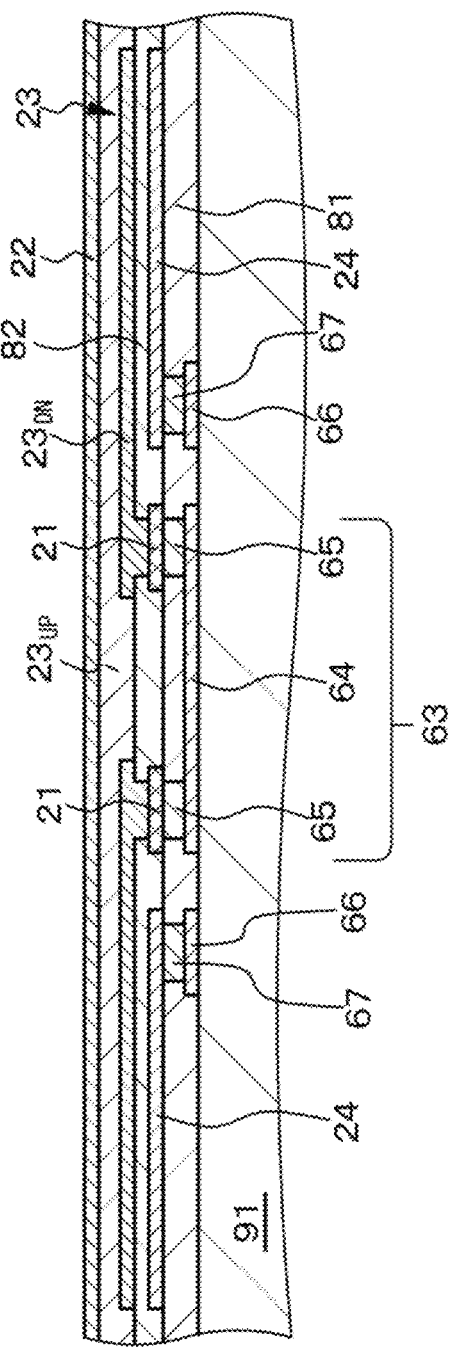

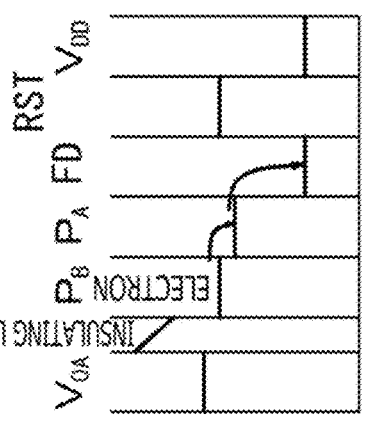
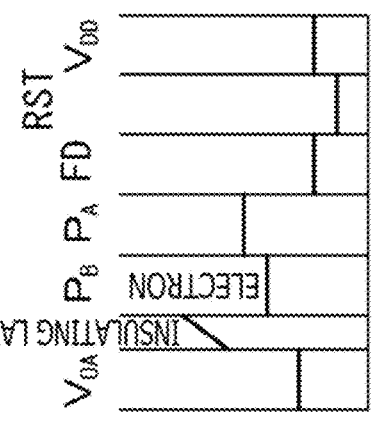
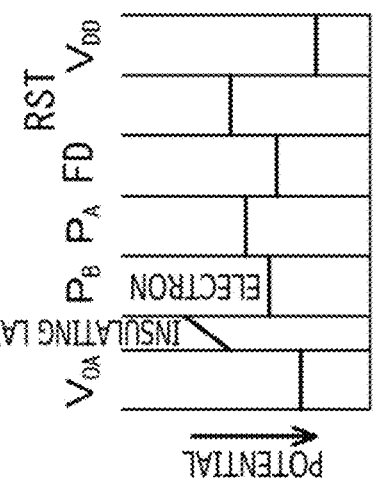
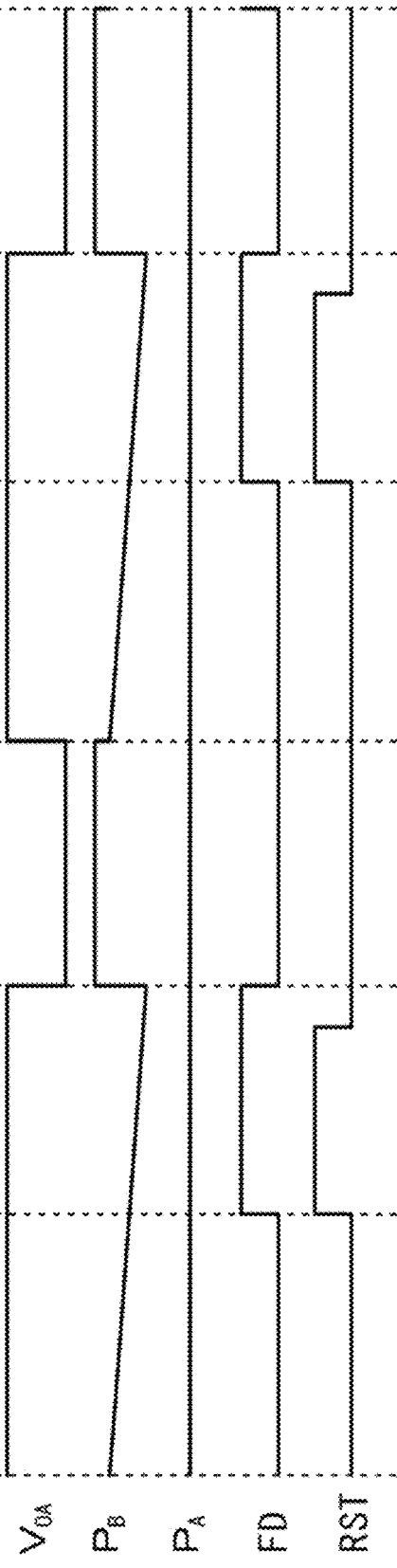

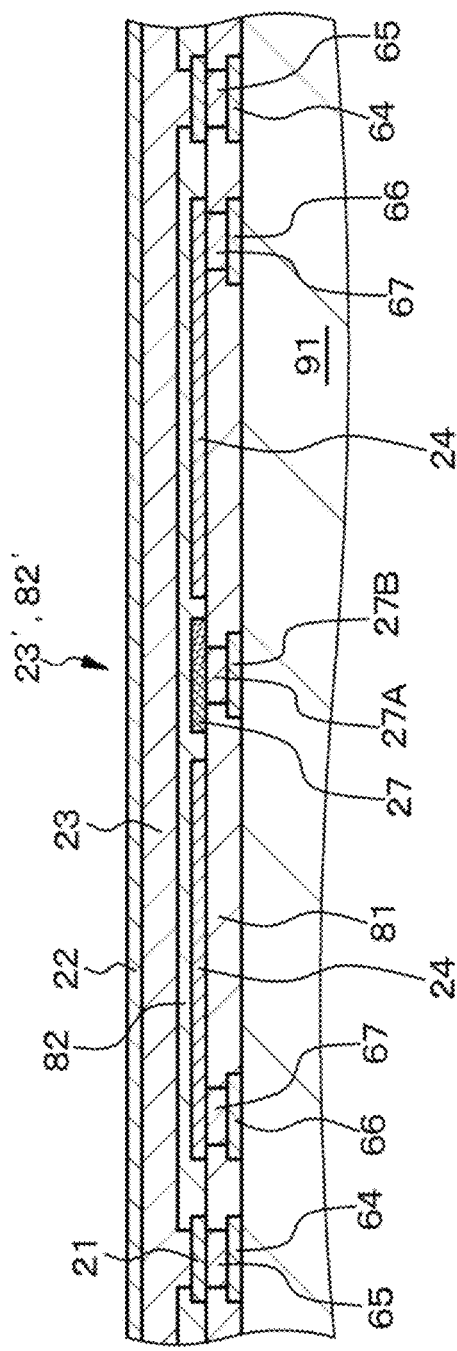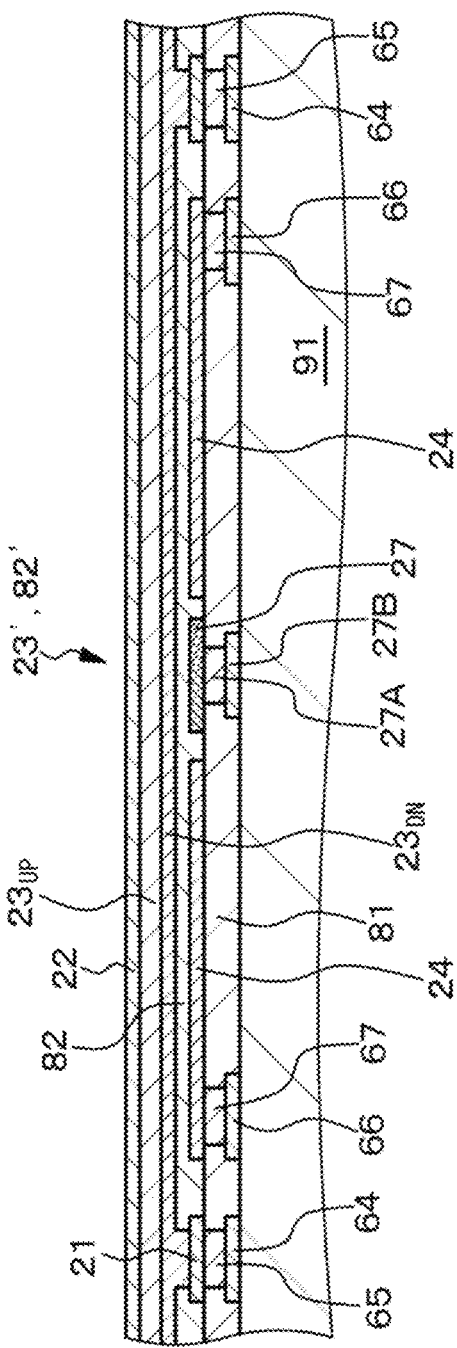

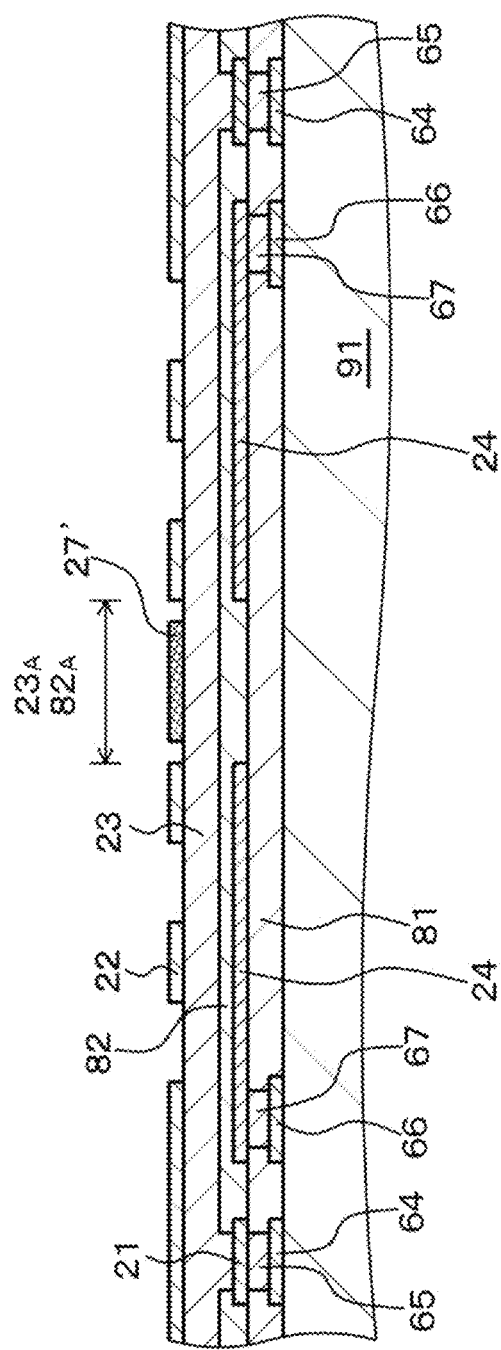
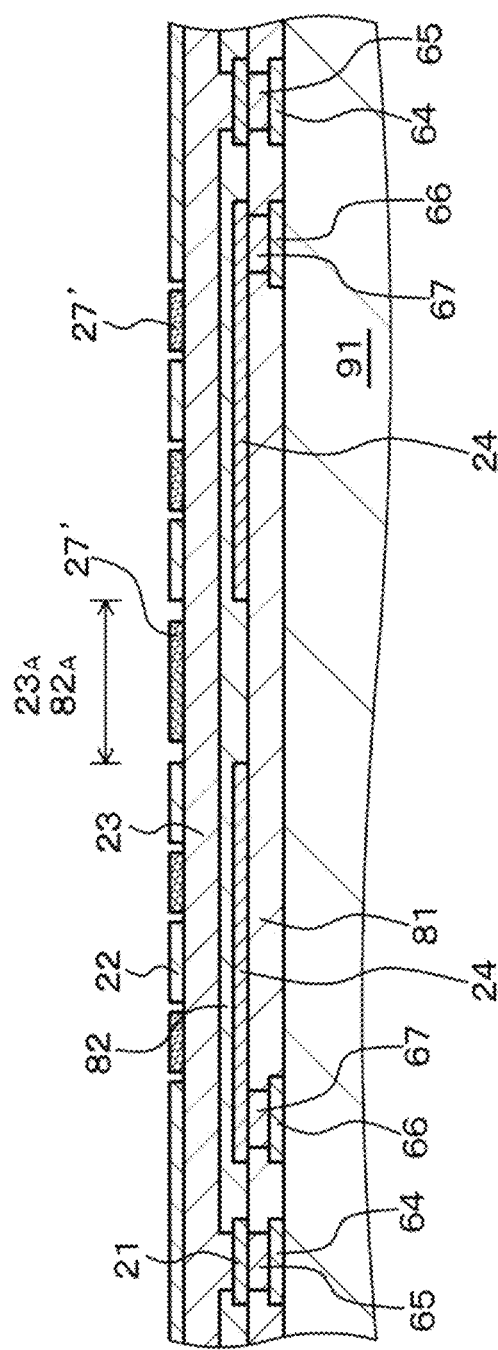
FIG. 21A
FIG. 21B

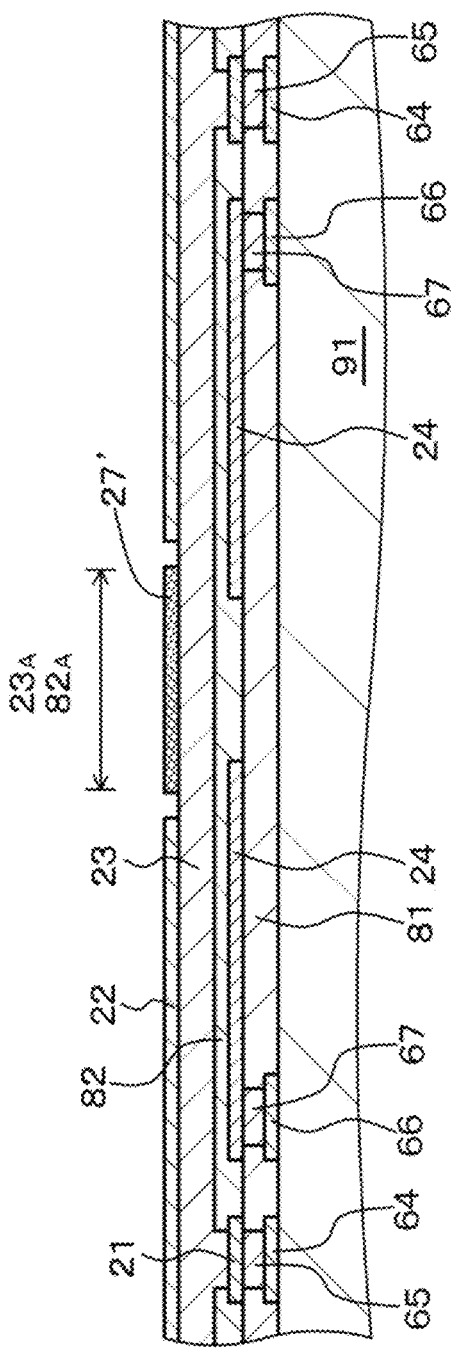
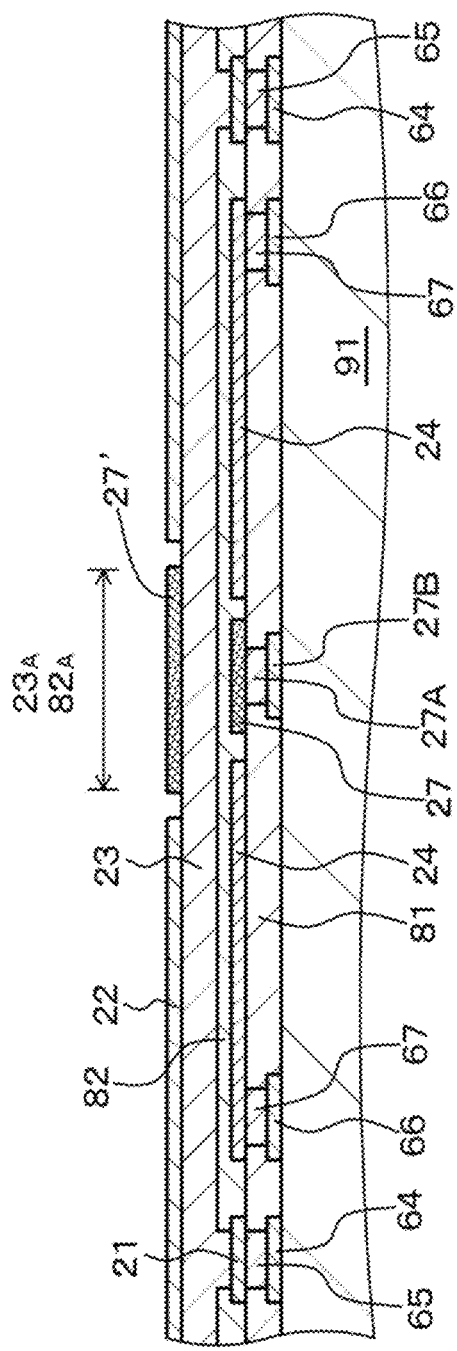
FIG. 22A
FIG. 22B

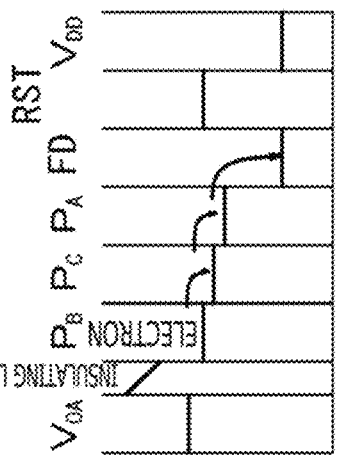
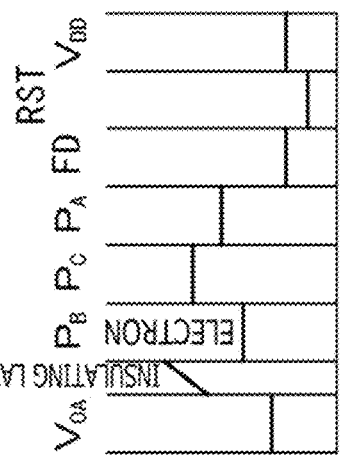
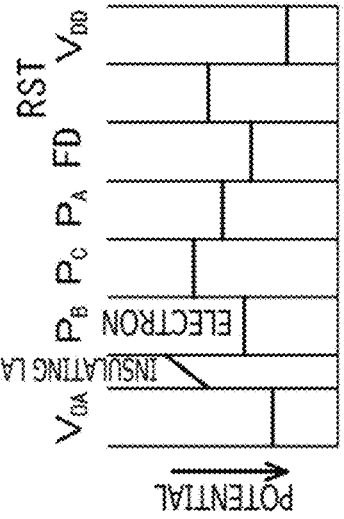
FIG. 32

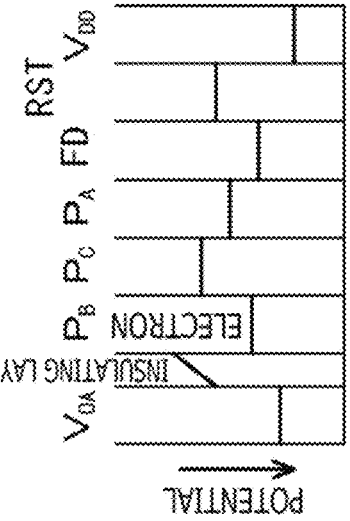
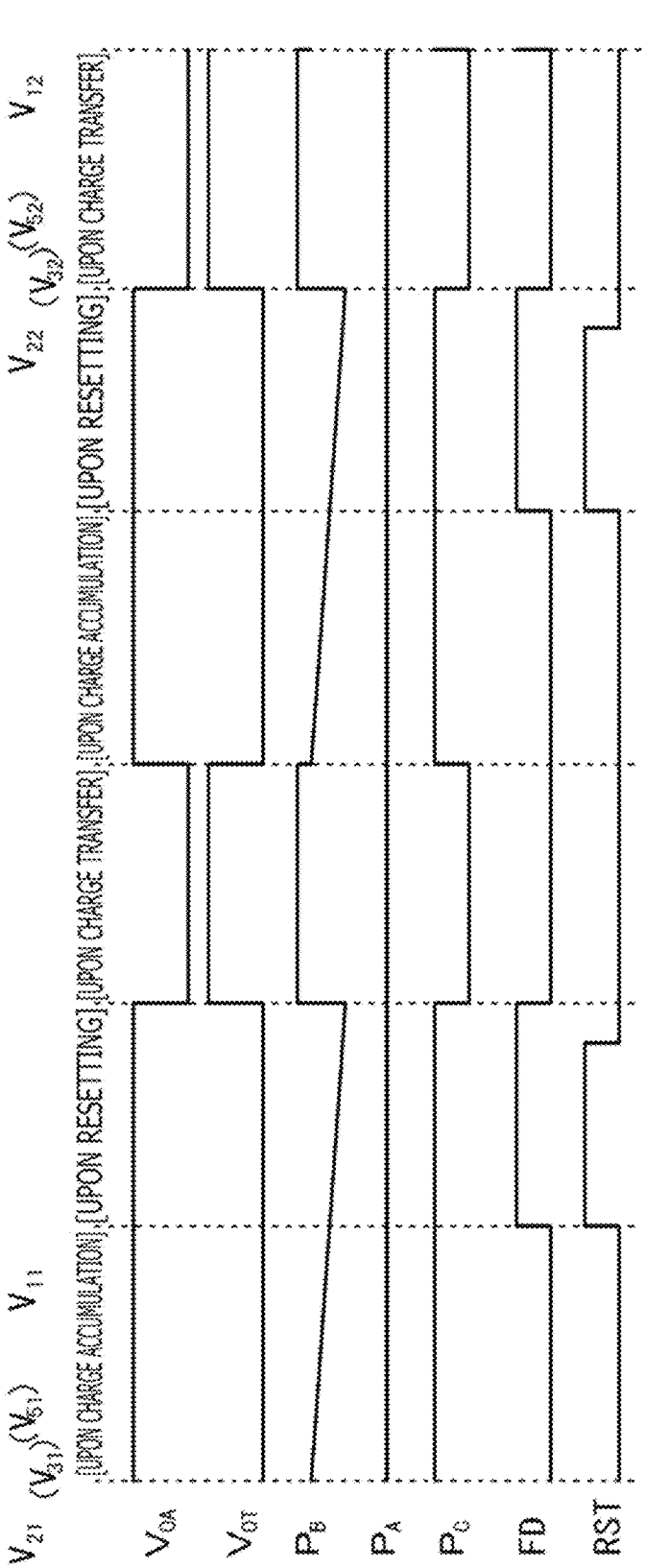
FIG. 33

SOLID-STATE IMAGE SENSOR

CROSS REFERENCE TO RELATED APPLICATIONS

This application is a national stage application under 35 U.S.C. 371 and claims the benefit of PCT Application No. PCT/JP2019/027890 having an international filing date of 16 Jul. 2019, which designated the United States, which PCT application claimed the benefit of Japanese Patent Application No. 2018-140218, filed 26 Jul. 2018, the entire disclosures of each of which are incorporated herein by reference.

TECHNICAL FIELD

The present disclosure relates to a solid-state image sensor.

BACKGROUND ART

An imaging element in which an organic semiconductor material is used for a photoelectric conversion layer can perform photoelectric conversion of a specific color (wavelength band). Further, since the imaging element has such a feature as just described, in a case where it is used as an imaging element in a solid-state image sensor, it is possible to obtain a structure (stacked type imaging element) in which a subpixel is configured from a combination of an on-chip color filter (OCCF) and the imaging element, such subpixels being arrayed two-dimensionally, and with which stacking of the subpixels that cannot be implemented by a conventional solid-state image sensor is implemented (for example, refer to PTL 1). Further, the imaging elements is advantageous in that, since a demosaic process is not demanded, a false color does not appear. It is to be noted that, in the following description, an imaging element including a photoelectric conversion portion provided on or above a semiconductor substrate is sometimes referred to as "first type imaging element" for the convenience of description, a photoelectric conversion portion configuring the first type imaging element is sometimes referred to as "first type photoelectric conversion portion" for the convenience of description, an imaging element provided in a semiconductor substrate is sometimes referred to as "second type imaging element" for the convenience of description, and a photoelectric conversion portion configuring the second type imaging element is sometimes referred to as "second type photoelectric conversion portion" for the convenience of description.

An example of a structure of a stacked type imaging element (stacked type solid-state image sensor) disclosed in PTL 1 is depicted in FIG. 9. In the example depicted in FIG. 9, the imaging element is formed by stacking, in a semiconductor substrate 70, a third photoelectric conversion portion 43 and a second photoelectric conversion portion 41 that are second type photoelectric conversion portions configuring a third imaging element 15 and a second imaging element 13 that are second type imaging elements. Further, a first type photoelectric conversion portion configuring the first imaging element (referred to as "first photoelectric conversion portion" for the convenience of description) is arranged above the semiconductor substrate 70 (particularly, above the second imaging element 13). Here, the first photoelectric conversion portion includes a first electrode 21, a photoelectric conversion portion 23 formed from an organic material, and a second electrode 22, and configures a first imaging element 11 that is a first type imaging element. Further, a charge accumulating electrode 24 is provided in a spaced relation from the first electrode 21, and a photoelectric conversion portion 23 is positioned above the charge accumulating electrode 24 with an insulating layer 82 interposed therebetween. In the second photoelectric conversion portion 41 and the third photoelectric conversion portion 43, for example, blue light and red light are photoelectrically converted depending upon the difference in absorption coefficient. Further, in the first photoelectric conversion portion, for example, green light is photoelectrically converted.

Charge generated by photoelectric conversion in the second photoelectric conversion portion 41 and the third photoelectric conversion portion 43 is accumulated into the second photoelectric conversion portion 41 and third photoelectric conversion portion 43 once, and then is transferred to a second floating diffusion layer (Floating Diffusion) $FD_2$ and a third floating diffusion layer $FD_3$ by a vertical type transistor (whose gate portion 45 is depicted) and a transfer transistor (whose gate portion 46 is depicted). Further, the generated charge is outputted to an external reading out circuit (not depicted). The transistors and floating diffusion layers $FD_2$ and $FD_3$ are also formed on the semiconductor substrate 70.

Charge generated by photoelectric conversion in the first photoelectric conversion portion is attracted to the charge accumulating electrode 24 upon charge accumulation and is accumulated into the photoelectric conversion portion 23. Upon charge transfer, the charge accumulated in the photoelectric conversion portion 23 is accumulated into the first floating diffusion layer $FD_1$ formed on the semiconductor substrate 70 through the first electrode 21, a contact hole portion 61, and a wiring layer 62. Further, the first photoelectric conversion portion is connected also to a gate portion 52 of an amplification transistor for converting a charge amount into a voltage through the contact hole portion 61 and the wiring layer 62. Further, the first floating diffusion layer $FD_1$ configures part of a reset transistor (whose gate portion 51 is depicted). It is to be noted that the other components are described in connection with an embodiment 1.

CITATION LIST

Patent Literature

[PTL 1]
Japanese Patent Laid-Open No. 2017-157816

SUMMARY

Technical Problems

Although hereinafter described in detail, such a first problem occurs that, depending upon the angle of light incident to the first imaging element 11, a difference appears in movement state of charge generated in the photoelectric conversion portion 23 of each first imaging element 11 to the first electrode 21 between first imaging elements 11 adjacent to each other and, as a result, there is the possibility that picture quality may degrade in an obtained image. Further, such a second problem occurs that it is not considered that there is no possibility that, during operation of the first imaging element 11, charge accumulated in the photoelectric conversion portion 23 may move to the adjacent first imaging element 11 and that it is not considered that there is no possibility that charge accumulated in the photoelectric conversion portion 23 may not be transferred smoothly to the first electrode 21. This gives rise to a result of characteristic degradation of the solid-state image sensor.

Accordingly, it is a first object of the present disclosure to provide a solid-state image sensor in which a difference does not occur in movement state of charge generated in an imaging element to a first electrode depending upon the angle of light incident to the imaging element. Further, it is a second object of the present disclosure to provide a solid-state image sensor that includes an imaging element having a configuration and a structure by which movement of charge between imaging elements adjacent to each other can be suppressed with certainty during operation of the imaging elements and charge accumulated in a photoelectric conversion portion is transferred smoothly to a first electrode.

Solution to Problems

In order to attain the first object described above, a solid-state image sensor of the present disclosure includes a plurality of imaging element blocks each configured from a plurality of imaging elements. Each of the imaging elements includes a first electrode, a charge accumulating electrode arranged in a spaced relation from the first electrode, a photoelectric conversion portion contacting with the first electrode and formed above the charge accumulating electrode with an insulating layer interposed therebetween, and a second electrode formed on the photoelectric conversion portion. The first electrode and the charge accumulating electrode are provided on an interlayer insulating layer. The first electrode is connected to a connection portion provided in the interlayer insulating layer.

BRIEF DESCRIPTION OF DRAWINGS

FIGS. 10A and 10B are schematic sectional views of part of imaging elements (two imaging elements arranged side by side) configuring the solid-state image sensor of the embodiment 1 and the modification of the embodiment 1.

FIG. 14 is a view schematically depicting a state of a potential at each portion upon operation of the imaging element of the embodiment 1.

FIGS. 19A and 19B are schematic sectional views of part of the imaging elements (two imaging elements arranged side by side) configuring the solid-state image sensor of the embodiment 2 and a modification of the embodiment 2.

FIGS. 21A and 21B are schematic sectional views of part of a modification of the imaging elements (two imaging elements arranged side by side) of the embodiment 5.

FIGS. 22A and 22B are schematic sectional views of part of a modification of the imaging elements (two imaging elements arranged side by side) of the embodiment 5.

FIG. 32 is a view schematically depicting a state of a potential at each portion upon operation of the imaging element of the embodiment 8.

FIG. 33 is a view schematically depicting a state of a potential at each portion upon different operation of the imaging element of the embodiment 8.

DESCRIPTION OF EMBODIMENTS

Figure 1A:
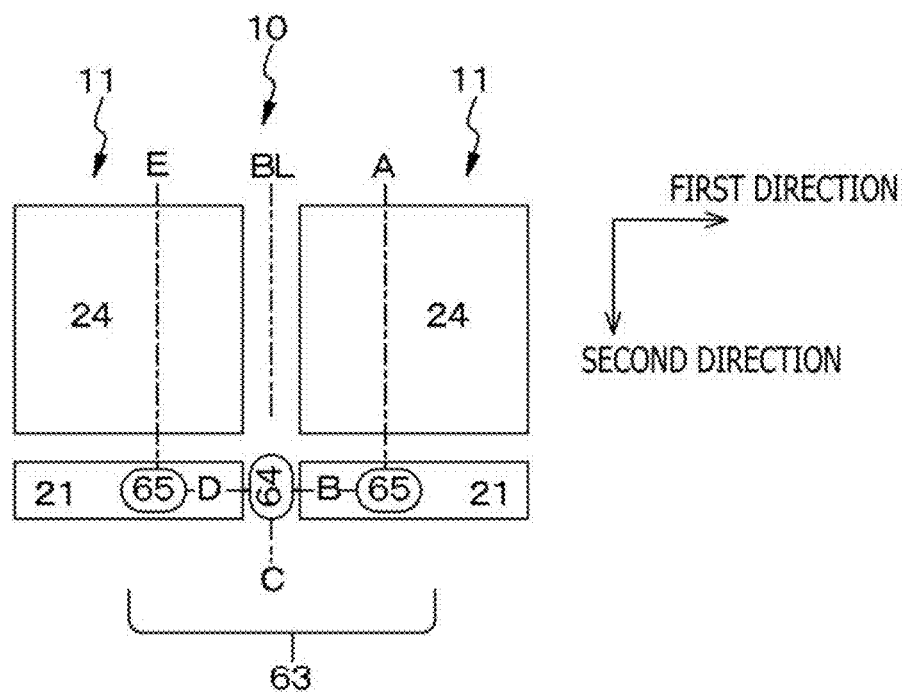
FIGS. 1A and 1B are views schematically depicting an arrangement state of a charge accumulating electrode, a first electrode, and so forth in a solid-state image sensor of an embodiment 1 and a solid-state image sensor of an embodiment 2, respectively.

In the following, the present disclosure is described on the basis of embodiments with reference to the drawings. However, the present disclosure is not limited to the embodiments and various values and materials in the embodiments are exemplary. It is to be noted that the description is given in the following order.

1. Description of Solid-State Image Sensor in General of Present Disclosure
2. Embodiment 1 (Solid-State Image Sensor of Present Disclosure and Solid-State Image Sensor of First Configuration)
3. Embodiment 2 (Modification to Embodiment 1)
4. Embodiment 3 (Modification of Embodiment 1 and Embodiment 2 and Solid-State Image Sensor of Second Configuration)
5. Embodiment 4 (Another Modification of Embodiment 1 and Embodiment 2 and Solid-State Image Sensor of Third Configuration)
6. Embodiment 5 (Modification of Embodiment 1 to Embodiment 4 and Upper Isolation Electrode)
7. Embodiment 6 (Modification of Embodiment 1 to Embodiment 5 and Front-Illuminated Type Solid-State Image Sensor)
8. Embodiment 7 (Modification of Embodiment 1 to Embodiment 6)
9. Embodiment 8 (Embodiment 1 to Embodiment 7 and Transfer Controlling Electrode)
10. Embodiment 9 (Embodiment 1 to Embodiment 8 and Charge Discharging Electrode)
11. Others <Description of Solid-State Image Sensor in General of Present Disclosure>

The solid-state image sensor of the present disclosure can be formed such that a imaging element block is configured from P×Q (where, P≥2 and Q≥1) imaging elements including P imaging elements along a first direction and Q imaging elements along a second direction different from the first direction.

The above-described preferred form of the solid-state image sensor of the present disclosure can be configured such that, in order to attain the second object described above, P=2 and Q=1 are satisfied, and the first electrodes individually configuring two imaging elements along the first direction are connected to a connection portion provided in the interlayer insulating layer. Here, the solid-state image sensor having such a configuration as just described is referred to "solid-state image sensor of the first configuration" for the convenience of description. In the two imaging elements, the first electrodes are connected to each other through the connection portion. Further, the solid-state image sensor of the first configuration can be configured such that the imaging element block is surrounded by a continuous isolation electrode (sometimes referred to as "first isolation electrode" for the convenience of description) and can be further configured such that a continuous second isolation electrode extending along the second direction from the isolation electrode (first isolation electrode) is provided between the two imaging elements along the first direction. The first isolation electrode and the second isolation electrode are connected to each other. Alternatively, the solid-state image sensor of the first configuration can be configured such that a second isolation electrode extending along the second direction is provided between the two imaging elements along the first direction.

Alternatively, in order to attain the second object described above, the preferred form described above of the solid-state image sensor of the present disclosure can be configured such that P=2 is satisfied and Q is a natural number equal to or greater than 2, and the first electrodes individually configuring the two imaging elements along the first direction are connected to a connection portion provided in the interlayer insulating layer. Here, a solid-state image sensor having such a configuration as just described is referred to as "solid-state image sensor of the second configuration" for the convenience of description. In the P×Q imaging elements, the first electrodes are connected to each other through the connection portion. Further, the solid-state image sensor of the second configuration can be configured such that the imaging element block is surrounded by a continuous isolation electrode (first isolation electrode) and can be further configured such that a continuous second isolation electrode extending along the second direction from the isolation electrode (first isolation electrode) is provided between the two imaging elements along the first direction. The first isolation electrode and the second isolation electrode are connected to each other. Alternatively, the solid-state image sensor of the second configuration can be configured such that a second isolation electrode extending along the second direction is provided between the two imaging elements along the first direction.

Alternatively, in order to attain the second object described above, the preferred mode described above of the solid-state image sensor of the present disclosure can be configured such that P=2 and Q=2 are satisfied, the first electrode configuring the two imaging elements along the second direction is shared, and the shared first electrode is connected to a connection portion provided in the interlayer insulating layer. Here, the solid-state image sensor having such a configuration as just described is referred to as "solid-state image sensor of the 3Ath configuration" for the convenience of description. Alternatively, in order to attain the second object described above, the preferred mode described above of the solid-state image sensor of the present disclosure can be configured such that P=2 and Q=2 are satisfied, the first electrode configuring the two imaging elements along the first direction is shared, and the shared first electrode is connected to a connection portion provided in the interlayer insulating layer. Here, the solid-state image sensor having such a configuration as just described is referred to as "solid-state image sensor of the 3Bth configuration" for the convenience of description. In the 2×2 imaging elements, the first electrodes are connected to each other through the connection portion. Then, the solid-state image sensor of the 3Ath configuration or the solid-state image sensor of the 3Bth configuration can be configured such that the imaging element block is surrounded by a continuous isolation electrode (first isolation electrode). Further, the solid-state image sensor of the 3Ath configuration or the solid-state image sensor of the 3Bth configuration can be configured such that a continuous second isolation electrode extending along the second direction from the isolation electrode (first isolation electrode) is provided between the two imaging elements along the first direction. The first isolation electrode and the second isolation electrode are connected to each other. Alternatively, the solid-state image sensor of the 3Ath configuration or the solid-state image sensor of the 3Bth configuration can be configured such that a second isolation electrode extending along the second direction is provided between the two imaging elements along the first direction.

Further, the solid-state image sensor of the present disclosure including the preferred forms and configurations described above can be formed such that the imaging elements are arranged line-symmetrically with respect to a boundary line extending in the second direction between the imaging elements configuring the imaging element block.

Furthermore, the solid-state image sensor of the present disclosure including the preferred forms and configurations described above can be formed such that the potential of the isolation electrode (first isolation electrode) (in a case where the second isolation electrode is provided, the potential of the second isolation electrode also) has a fixed value $V_{ES}$.

If the first electrode is shared in the P×Q imaging elements configuring one imaging element block in this manner, then the configuration and the structure in a pixel region in which a plurality of imaging elements is arrayed can be simplified and refined. Further, the solid-state image sensor can be formed such that the plurality of (particularly, P×Q) imaging elements configuring the imaging element block includes a shared floating diffusion layer. In other words, one floating diffusion layer is provided for one imaging element block configured from P×Q imaging elements. Further, the solid-state image sensor can be formed such that each imaging element block includes a control portion, the control portion is configured at least from a floating diffusion layer, and an amplification transistor and the shared first electrode is connected to the control portion through the connection portion. The P×Q imaging elements may be configured from a plurality of first type imaging elements hereinafter described or may be configured from at least one first type imaging element and one, two or more second type imaging elements hereinafter described.

The solid-state image sensor according to the present disclosure may adopt, in a case where the imaging element block is configured from four imaging elements and the first electrodes of the four imaging elements are shared, a reading out method by which charge accumulated in the four imaging elements is read out individually by totaling four times or may adopt another reading out method by which charge accumulated in the four imaging elements is read out simultaneously by totaling one time. The former method is sometimes referred to as "first mode reading out method" for the convenience of description and the latter method is sometimes referred to as "second mode reading out method" for the convenience of description. By the first mode reading out method, refinement of an image to be obtained by the solid-state image sensor can be achieved. By the second mode reading out method, signals obtained by the four imaging elements are added in order to achieve increase of the sensitivity. Switching between the first mode reading out method and the second mode reading out method can be achieved by providing suitable switching means in the solid-state image sensor. In the first mode reading out method, it is possible for P×Q (for example, 2×2) imaging elements to share one floating diffusion layer by suitably controlling the timing of a charge transfer period, and P×Q (for example, 2×2) imaging elements configuring the imaging element block are connected to one driving circuit. However, control of the charge accumulating electrode is performed for each imaging element.

The solid-state image sensor of the present disclosure can be formed such that the first isolation electrode and the second isolation electrode are provided in a region opposed to a region of the photoelectric conversion portion with an insulating layer interposed therebetween. It is to be noted that these isolation electrodes are sometimes referred to as "lower first isolation electrode" and "lower second isolation electrode," respectively, for the convenience of description, and they are sometimes referred to collectively as "lower isolation electrode." Alternatively, the solid-state image sensor can be formed such that the first isolation electrode and the second isolation electrode are provided in a spaced relation from the second electrode on the photoelectric conversion portion. It is to be noted that these isolation electrodes are sometimes referred to as "upper first isolation electrode" and "upper second isolation electrode," respectively, for the convenience of description, and they are sometimes referred to collectively as "upper isolation electrode." In a case where the solid-stage image sensor of the 3Bth configuration is configured such that the second isolation electrode is provided, it is necessary to configure the first isolation electrode and the upper second isolation electrode from the upper first isolation electrode and the upper second isolation electrode.

In the solid-state image sensor of the present disclosure, the lower first isolation electrode is arranged in a spaced relation from the first electrode and the charge accumulating electrode and surrounds the charge accumulating electrode. Meanwhile, an orthogonal projection image of the upper first isolation electrode is positioned in a spaced relation from orthogonal projection images of the first electrode and the charge accumulating electrode and surrounds an orthogonal projection image of the charge accumulating electrode. In some cases, part of the orthogonal projection image of the upper second isolation electrode and part of the orthogonal projection image of the charge accumulating electrode may overlap with each other.

Reference characters representing potentials applied to the various electrodes in the following description are indicated in a table 1 below.

TABLE 1

|  | Charge accumulation period | Charge transfer period |
|---|---|---|
| First electrode | $V_{11}$ | $V_{12}$ |
| Second electrode | $V_{21}$ | $V_{22}$ |
| Charge accumulation electrode | $V_{31}$ | $V_{32}$ |
| First isolation electrode | $V_{ES}$ | $V_{ES}$ |
| Second isolation electrode | $V_{ES}$ | $V_{ES}$ |
| Transfer controlling electrode | $V_{41}$ | $V_{42}$ |
| Charge discharging electrode | $V_{51}$ | $V_{52}$ |

The solid-state image sensor of the present disclosure including the preferred forms and configurations described above can be formed such that it further includes a semiconductor substrate and the photoelectric conversion portion is arranged above the semiconductor substrate. It is to be noted that the first electrode, charge accumulating electrode, second electrode, various isolation electrodes, and various electrodes are connected to a driving circuit hereinafter described.

Further, the solid-state image sensor of the present disclosure including the preferred forms and configurations described above can be formed such that the size of the charge accumulating electrode is greater than that of the first electrode. Where the area of the charge accumulating electrode is $S_1'$ and the area of the first electrode is $S_1$, though not restrictive, preferably $4 \leq S_1'/S_1$ is satisfied.

The second electrode positioned on the light incidence side may be made common to a plurality of imaging elements except for a case in which an upper isolation electrode is formed. In other words, the second electrodes can be formed as what is generally called a solid electrode. The photoelectric conversion layer configuring the photoelectric conversion portion can be made common to a plurality of imaging elements. In other words, the solid-state image sensor of the present disclosure can be formed such that one photoelectric conversion layer is formed in a plurality of imaging elements.

Further, the solid-state image sensor of the present disclosure including the various preferred forms and configurations described above can be formed such that the first electrode extends in an opening provided in an insulating layer and is connected to the photoelectric conversion portion. Alternatively, the solid-state image sensor of the present disclosure can be formed such that the photoelectric conversion portion extends in an opening provided in an insulating layer and is connected to the first electrode, and, in this case, the solid-state image sensor of the present disclosure can be formed such that an edge portion of a top face of the first electrode is covered with the insulating layer, the first electrode is exposed from a bottom face of the opening, and where a face of the insulating layer contacting with the top face of the first electrode is a first face and another face of the insulating layer contacting with a portion of the photoelectric conversion portion opposed to the charge accumulating electrode is a second face, a side face of the opening has an inclination that expands from the first face toward the second face. Further, the solid-state image sensor of the present disclosure can be formed such that the side face of the opening having the inclination expanding from the first face toward the second face is positioned on the charge accumulating electrode side. It is to be noted that this form includes a form in which another layer is formed between the photoelectric conversion portion and the first electrode (for example, a form in which a material layer suitable for charge accumulation is formed between the photoelectric conversion portion and the first electrode).

Further, the solid-state image sensor of the present disclosure including the preferred forms and configurations described above can be configured such that it further includes a control portion provided on a semiconductor substrate and including a driving circuit, and such that the first electrode and the charge accumulating electrode are connected to the driving circuit, during a charge accumulation period, from the driving circuit, a potential $V_{11}$ is applied to the first electrode, a potential $V_{31}$ is applied to the charge accumulating electrode, and charge is accumulated into the photoelectric conversion portion, during a charge transfer period, from the driving circuit, a potential $V_{12}$ is applied to the first electrode, a potential $V_{32}$ is applied to the charge accumulating electrode, and charge accumulated in the photoelectric conversion portion is read out into the control portion via the first electrode. However, in a case where the potential of the first electrode is higher than the potential of the second electrode, $V_{31} \geq V_{11}$ and $V_{32} < V_{12}$ are satisfied, but in a case where the potential of the first electrode is lower than the potential of the second electrode, $V_{31} \leq V_{11}$ and $V_{32} > V_{12}$ are satisfied.

Further, the solid-state image sensor of the present disclosure including the preferred forms and configurations described above can be formed such that it further includes a transfer controlling electrode (charge transfer electrode) arranged, between the first electrode and the charge accumulating electrode, in a spaced relation from the first electrode and the charge accumulating electrode and arranged in an opposed relation to the photoelectric conversion portion with an insulating layer interposed therebetween. It is to be noted that such the solid-state image sensor of the present disclosure of such a form as just described is referred to sometimes as "solid-state image sensor of the present disclosure including a transfer controlling electrode" for the convenience of description. Further, in the solid-state image sensor of the present disclosure including the transfer controlling electrode, when a potential applied to the transfer controlling electrode during a charge accumulation period is $V_{41}$, in the case where the potential of the first electrode is higher than the potential of the second electrode, it is preferable to satisfy $V_{41} \le V_{11}$ and $V_{31} < V_{41}$. Further, when a potential applied to the transfer controlling electrode during a charge transfer period is $V_{42}$, in the case where the potential of the first electrode is higher than the potential of the second electrode, it is preferable to satisfy $V_{32} \le V_{42} \le V_{12}$.

Further, the solid-state image sensor of the present disclosure including the preferred forms and configurations described above can be formed such that it further includes a charge discharging electrode connected to the photoelectric conversion portion and arranged in a spaced relation from the first electrode and the charge accumulating electrode. It is to be noted that the solid-state image sensor of the present disclosure of such a form as just described is referred to as "solid-state image sensor of the present disclosure including the charge discharging electrode" for the convenience of description. Further, the solid-state image sensor of the present disclosure including the charge discharging electrode can be formed such that the charge discharging electrode is arranged so as to surround the first electrode and the charge accumulating electrode (that is, in the form of a picture frame). The charge discharging electrode can be shared by (made common to) a plurality of imaging elements. In a case where the charge discharging electrode is provided, it is preferable to configure the various isolation electrodes from an upper isolation electrode. Then, in this case, the solid-state image sensor can be formed such that the photoelectric conversion portion extends in a second opening provided in the insulating layer and is connected to the charge discharging electrode, an edge portion of a top face of the charge discharging electrode is covered with the insulating layer, the charge discharging electrode is exposed from a bottom face of the second opening, and, when a face of the insulating layer contacting with the top face of the charge discharging electrode is a third face and another face of the insulating layer contacting with a portion of the photoelectric conversion portion opposed to the charge accumulating electrode is a second face, a side face of the second opening has an inclination that expands from the third face toward the second face.

Further, the solid-state image sensor of the present disclosure that includes the charge discharging electrode can be configured such that it further includes a control portion provided on the semiconductor substrate and having a driving circuit, the first electrode, charge accumulating electrode, and charge discharging electrode are connected to the driving circuit, during a charge accumulation period, from the driving circuit, a potential $V_{11}$ is applied to the first electrode, a potential $V_{31}$ is applied to the charge accumulating electrode, and a potential $V_{51}$ is applied to the charge discharging electrode, and charge is accumulated into the photoelectric conversion portion, and during a charge transfer period, from the driving circuit, a potential $V_{12}$ is applied to the first electrode, a potential $V_{32}$ is applied to the charge accumulating electrode, and a potential $V_{52}$ is applied to the charge discharging electrode, and the charge accumulated in the photoelectric conversion portion is read out to the control portion through the first electrode. However, in the case where the potential of the first electrode is higher than the potential of the second electrode, $V_{51} > V_{11}$ and $V_{52} < V_{12}$ are satisfied, but, in the case where the potential of the first electrode is lower than the potential of the second electrode, $V_{51} < V_{11}$ and $V_{52} > V_{12}$ are satisfied.

Further, the solid-state image sensor of the present disclosure including the preferred forms and configurations described above can be configured such that the charge accumulating electrode is configured from a plurality of charge accumulating electrode segments. It is to be noted that the solid-state image sensor of the present disclosure of such a form as just described is sometimes referred to as "solid-state image sensor of the present disclosure including the plurality of charge accumulating electrode segments" for the convenience of description. It is sufficient if the number of charge accumulating electrode segments is two or more. Further, the solid-state image sensor of the present disclosure including the plurality of charge accumulating electrode segments can be formed such that, in a case where potentials different from each other are applied to N charge accumulating electrode segments, in the case where the potential of the first electrode is higher than the potential of the second electrode, the potential applied to the charge accumulating electrode segment positioned nearest to the first electrode (first photoelectric conversion portion segment) during a charge transfer period is higher than the potential applied to the charge accumulating electrode segment positioned remotest from the first electrode (the Nth photoelectric conversion portion segment), and, in the case where the potential of the first electrode is lower than the potential of the second electrode, the potential applied to the charge accumulating electrode segment positioned nearest to the first electrode (first photoelectric conversion portion segment) during a charge transfer period is lower than the potential applied to the charge accumulating electrode segment position remotest from the first electrode (Nth photoelectric conversion portion segment).

Further, the solid-state image sensor of the present disclosure including the preferred forms and configurations described above can be formed such that at least a floating diffusion layer and an amplification transistor that configure a control portion are provided on a semiconductor substrate, and the first electrode is connected to the floating diffusion layer and a gate portion of the amplification transistor. Further, in this case, the solid-state image sensor of the present disclosure including the preferred forms and configurations described above is formed such that a reset transistor and a selection transistor that configure the control portion are further provided on the semiconductor substrate, the floating diffusion layer is connected to one of source/drain regions of the reset transistor, and one of source/drain regions of the amplification transistor is connected to one of source/drain regions of the selection transistor and the other one of the source/drain regions of the selection transistor is connected to a signal line.

Alternatively, as a modification of the solid-state image sensor of the present disclosure including the preferred forms and configurations described above, imaging elements of a first configuration to a sixth configuration described below can be listed. In other words, in the imaging elements of the first configuration to the sixth configuration in the solid-state image sensor of the present disclosure including the preferred forms and configurations described above the photoelectric conversion portion is configured from N (where N≥2) photoelectric conversion portion segments, the photoelectric conversion layer configuring the photoelectric conversion portion is configured from N photoelectric conversion layer segments, the insulating layer is configured from N insulating layer segments, in the imaging elements of the first configuration to the third configuration, the charge accumulating electrode is configured from N charge accumulating electrode segments, in the imaging elements of the fourth configuration and the fifth configuration, the charge accumulating electrode is configured from N charge accumulating electrode segments arranged in a spaced relation from each other, the nth (where n=1, 2, 3 . . . , N) photoelectric conversion layer segment is configured from the nth charge accumulating electrode segment, nth insulating layer segment, and nth photoelectric conversion layer segment, and a photoelectric conversion portion segment having a higher value of n is positioned farther away from the first electrode.

Then, in the imaging element of the first configuration, the thickness of the insulating layer segment gradually changes over a range from the first photoelectric conversion portion segment to the Nth photoelectric conversion portion segment. Meanwhile, in the imaging element of the second configuration, the thickness of the photoelectric conversion layer segment gradually changes over a range from the first photoelectric conversion portion segment to the Nth photoelectric conversion portion segment. Further, in the imaging element of the third configuration, the material configuring the insulating layer segment is different between photoelectric conversion portion segments adjacent to each other. Further, in the imaging element of the fourth configuration, the material configuring the charge accumulating electrode segment is different between photoelectric conversion portion segments adjacent to each other. Further, in the imaging element of the fifth configuration, the area of the charge accumulating electrode segment decreases gradually over a range from the first photoelectric conversion portion segment to the Nth photoelectric conversion portion segment. It is to be noted that the area may decrease continuously or may decrease stepwise.

Alternatively, in the imaging element of the sixth configuration in the solid-state image sensor of the present disclosure including the preferred forms and configurations described above, when the stacking direction of the charge accumulating electrode, insulating layer, and photoelectric conversion portion is a Z direction and the direction away from the first electrode is an X direction, the cross sectional area of the stacked portion when the stacked portion at which the charge accumulating electrode, insulating layer and photoelectric conversion portion are stacked is cut in a YZ virtual plane changes depending upon the distance from the first electrode. It is to be noted that the change of the cross sectional area may be a continuous change or may be a stepwise change.

In the imaging elements of the first configuration and the second configuration, the N photoelectric conversion layer segments are provided continuously, the N insulating layer segments are also provided continuously, and the N charge accumulating electrode segments are also provided continuously. In the imaging elements of the third configuration to the fifth configuration, the N photoelectric conversion layer segments are provided continuously. Further, in the imaging elements of the fourth configuration and the fifth configuration, while the N insulating layer segments are provided continuously, in the imaging element of the third configuration, the N insulating layer segments are provided individually corresponding to the photoelectric conversion portion segments. Further, in the imaging elements of the fourth configuration and the fifth configuration, and in some cases, in the imaging element of the third configuration, the N charge accumulating electrode segments are provided individually corresponding to the photoelectric conversion portion segments. In the imaging elements of the first configuration to the sixth configurations, a same potential is applied to all of the charge accumulating electrode segments. Alternatively, in the imaging elements of the fourth configuration and the fifth configuration, and in some cases, in the imaging element of the third configuration, potentials different from each other may be applied to the N charge accumulating electrode segments.

In the imaging elements of the first configuration to the sixth configuration and the solid-state image sensors of the present disclosure to which such imaging elements are applied, the thickness of the insulating layer segment is defined, the thickness of the photoelectric conversion layer segment is defined, the material configuring the insulating layer segment is different, the material configuring the charge accumulating electrode segment is different, the area of the charge accumulating electrode segment is defined, or the cross sectional area of the stacked portion is defined. Therefore, a kind of charge transfer gradient is formed such that charge generated by photoelectric conversion can be transferred to the first electrode more easily and with certainty. Then, as a result, occurrence of an after-image and occurrence of remaining of charge transfer can be prevented.

As a modification of the solid-state image sensor of the present disclosure, a solid-state image sensor can include a plurality of the imaging elements of the first configuration to the sixth configuration described above.

Although, in the imaging elements of the first configuration to the fifth configuration, a photoelectric conversion portion segment having a higher value of n is positioned farther away from the first electrode, it is decided with reference to the X direction whether or not the photoelectric conversion portion segment is positioned away from the first electrode. Further, although, in the imaging element of the sixth configuration, the direction away from the first electrode is determined as the X direction, the "X direction" is defined in the following manner. In other words, a pixel region in which a plurality of imaging elements or stacked type imaging elements is arrayed is configured from a plurality of pixels that is arrayed in a two-dimensional array, that is, arrayed regularly in the X direction and the Y direction. In a case where the planar shape of a pixel is a rectangle, the direction in which a side of the rectangle nearest to the first electrode extends is defined as Y direction and a direction orthogonal to the Y direction is defined as X direction. Alternatively, in a case where the planar shape of a pixel is a given shape, a general direction in which a line segment or a curved line nearest to the first electrode is included is defined as Y direction and a direction orthogonal to the Y direction is defined as X direction.

In the following, the imaging elements of the first configuration to the sixth configuration are described in regard to the case in which the potential of the first electrode is higher than the potential of the second electrode. However, in the case where the potential of the first electrode is lower than the potential of the second electrode, it is sufficient if the potentials are reversed between high and low levels.

In the imaging element of the first configuration, the thickness of the insulating layer segment gradually changes over a range from the first photoelectric conversion portion segment to the Nth photoelectric conversion portion segment. However, the thickness of the insulating layer segment may gradually increase or gradually decrease, and by this, a kind of charge transfer gradient is formed.

In a case where the charge to be accumulated is electrons, it is sufficient to adopt a configuration that the thickness of the insulating layer segment gradually increases, but in a case where the charge to be accumulated is positive holes, it is sufficient to adopt a configuration that the thickness of the insulating layer segment gradually decreases. In those cases, if such a state as $|V_{31}| \geq |V_{11}|$ is entered during a charge accumulation period, then the nth photoelectric conversion portion segment can accumulate a greater amount of charge than the (n+1)th photoelectric conversion portion segment, and a stronger electric field is applied in the nth photoelectric conversion portion segment than that in the (n+1)th photoelectric conversion portion segment. Therefore, a flow of charge from the first photoelectric conversion portion segment to the first electrode can be prevented with certainty. Then, if such a state as $|V_{32}|<|\leq V_{12}|$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the second configuration, the thickness of the photoelectric conversion layer segment gradually changes over a range from the first photoelectric conversion portion segment to the Nth photoelectric conversion portion segment. However, the thickness of the photoelectric conversion layer segment may gradually increase or gradually decrease. By this, a kind of charge transfer gradient is formed.

In the case where the charge to be accumulated is electrons, it is sufficient to adopt a configuration that the thickness of the photoelectric conversion layer segment gradually increases, and in the case where the charge to be accumulated is positive holes, it is sufficient to adopt a configuration that the thickness of the photoelectric conversion layer segment gradually decreases. Further, in the case where the thickness of the photoelectric conversion layer segment gradually increases, if such a state as $V_{31} \geq V_{11}$ is entered during a charge accumulation period, but in the case where the thickness of the photoelectric conversion layer segment gradually degreases, if such a state as $V_{31} \leq V_{11}$ is entered during a charge accumulation period, then to the nth photoelectric conversion portion segment, a stronger electric field than to the (n+1)th photoelectric conversion portion segment is applied, and a flow of charge from the first photoelectric conversion portion segment to the first electrode can be prevented with certainty. Then, during a charge transfer period, in the case where the thickness of the photoelectric conversion layer segment gradually increases, if such a state as $V_{32}<V_{12}$ is entered, but in the case where the thickness of the photoelectric conversion layer segment gradually decreases, if such a state as $V_{32}>V_{12}$ is entered, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the third configuration, the material configuring the insulating layer segment is different between adjacent photoelectric conversion portion segments, and by this, a kind of charge transfer gradient is formed. However, preferably the value of the relative permittivity of the material configuring the insulating layer segments gradually decreases over a range from the first photoelectric conversion portion segment to the Nth photoelectric conversion portion segment. Further, if, by adopting such a configuration as just described, such a state as $V_{31} \geq V_{11}$ is entered during a charge accumulation period, then the nth photoelectric conversion portion segment can accumulate a greater amount of charge than the (n+1)th photoelectric conversion portion segment. Then, if such a state as $V_{32}<V_{12}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the fourth configuration, the material configuring the charge accumulating electrode segment is different between adjacent photoelectric conversion portion segments, and by this, a kind of charge transfer gradient is formed. However, preferably the value of the work function of the material configuring the insulating layer segment gradually increases in a range from the first photoelectric conversion portion segment to the Nth photoelectric conversion portion segment. Further, by adopting such a configuration as just described, a potential gradient advantageous to signal charge transfer can be formed without relying upon the positive/negative of the voltage (potential).

In the imaging element of the fifth configuration, the area of the charge accumulating electrode segment gradually decreases over a range from the first photoelectric conversion portion segment to the Nth photoelectric conversion portion segment. Since a kind of charge transfer gradient is formed by this, if such a state of $V_{31} \geq V_{11}$ is entered during a charge accumulation period, then the nth photoelectric conversion portion segment can accumulate a greater amount of charge than the (n+1)th photoelectric conversion portion segment. Then, if such a state as $V_{32}<V_{12}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the sixth configuration, the sectional area of the stacked portion changes depending upon the distance from the first electrode, and by this, a kind of charge transfer gradient is formed. In particular, if a configuration is adopted in which the thickness of the cross section of the stacked portion is fixed and the width of the sectional area of the stacked portion decreases away from the first electrode, then similarly as in the description of the imaging element of the fifth configuration, if such a state as $V_{31} \geq V_{11}$ is entered during a charge accumulation period, then a region nearer to the first electrode can accumulate a greater amount of charge than a region remoter to the first electrode. Accordingly, if such a state as $V_{32}<V_{12}$ is entered during a charge transfer period, then a flow of charge from the region nearer to the first electrode to the first electrode and a flow of charge from the remoter region to the nearer region can be assured with certainty. On the other hand, if a configuration is adopted in which the width of the cross section of the stacked portion is fixed and the thickness of the cross section of the stacked portion, more particularly, the thickness of the insulating layer segment, gradually increases, then similarly as in the description of the imaging element of the first configuration, if such a state as $V_{31} \geq V_{11}$ is entered during a charge accumulation period, then the region nearer to the first electrode can accumulate a greater amount of charge than the region remoter to the first electrode and a stronger electric field is applied in the nearer region than that in the remoter region, by which a flow of charge from the region nearer to the first electrode to the first electrode can be prevented with certainty. Then, if such a state as $V_{32}<V_{12}$ is entered during a charge transfer period, then a flow of charge from the region nearer to the first electrode to the first electrode and a flow of charge from the remoter region to the nearer region can be assured with certainty. Further, if a configuration is adopted in which the thickness of the photoelectric conversion layer segment gradually increases, then similarly as in the description of the imaging element of the second configuration, if such a state as $V_{31} \geq V_{11}$ is entered during a charge accumulation period, then a stronger electric field is applied in the region nearer to the first electrode than that in the region remoter to the first electrode, and a flow of charge from the region nearer to the first electrode to the first electrode can be prevented with certainty. Then, if such a state as $V_{32} < V_{12}$ is entered during a charge transfer period, then a flow of charge from the region nearer to the first electrode to the first electrode and a flow of charge from the remoter region to the nearer region can be assured with certainty.

Further, the solid-state image sensor of the present disclosure including the preferred forms and configurations described above can be formed such that light is incident from the second electrode side and a shading layer is formed on the light incidence side rather near to the second electrode. Alternatively, the solid-state image sensor of the present disclosure can be formed such that light is incident from the second electrode side and light is not incident to the first electrode (in some cases, to the first electrode and the transfer controlling electrode). Further, in this case, the solid-state image sensor of the present disclosure can be formed such that a shading layer is formed above the first electrode (in some cases, above the first electrode and the transfer controlling electrode) on the light incidence side rather near to the second electrode or can be formed such that an on-chip microlens is provided above the charge accumulating electrode and the second electrode such that light incident to the on-chip microlens is focused on the charge accumulating electrode. Here, the shading layer may be arranged above a light incidence side face of the second electrode or on the light incident side face of the second electrode. In some cases, the shading layer may be formed on the second electrode. As the material for configuring the shading layer, chromium (Cr), copper (Cu), aluminum (Al), tungsten (W), and a resin that does not transmit light (for example, a polyimide resin) can be exemplified.

As the solid-state image sensor of the present disclosure, particularly an imaging element (referred to as "blue light imaging element of the first type" for the convenience of description) that includes a photoelectric conversion portion (referred to as "blue light photoelectric conversion portion of the first type" for the convenience of description) that absorbs blue light (light of 425 to 495 nm) and has a sensitivity to blue light, an imaging element (referred to as "green light imaging element of the first type" for the convenience of description) that includes a photoelectric conversion portion (referred to as "green light photoelectric conversion portion of the first type" for the convenience of description) that absorbs green light (light of 495 to 570 nm) and has a sensitivity to green light, and an imaging element (referred to as "red light imaging element of the first type" for the convenience of description) that includes a photoelectric conversion portion (referred to as "red light photoelectric conversion portion of the first type" for the convenience of description) that absorbs red light (light of 620 to 750 nm) and has a sensitivity to red light can be listed. In addition, a conventional imaging element that does not include a charge accumulating electrode and has the sensitivity to blue light is referred to as "blue light imaging element of the second type" for the convenience of description, such a conventional imaging element having the sensitivity to green light is referred to as "green light imaging element of the second type" for the convenience of description, and such a conventional imaging element having the sensitivity to red light is referred to as "red light imaging element of the second type" for the convenience of description. Further, a photoelectric conversion portion configuring a blue light imaging element of the second type is referred to as "blue light photoelectric conversion portion of the second type" for the convenience of description, a photoelectric conversion portion configuring a green light imaging element of the second type is referred to as "green light photoelectric conversion portion of the second type" for the convenience of description, and a photoelectric conversion portion configuring a red light imaging element of the second type is referred to as "red light photoelectric conversion portion of the second type" for the convenience of description.

Although the stacked type imaging element in the present disclosure includes at least one solid-state image sensor (photoelectric conversion device) of the present disclosure, particularly, for example,

[A] a stacked type imaging element configured and structured such that the blue light photoelectric conversion portion of the first type, green light photoelectric conversion portion of the first type, and red light photoelectric conversion portion of the first type are stacked in the vertical direction, and control portions of the blue light imaging element of the first type, green light imaging element of the first type, and red light imaging element of the first type are provided on a semiconductor substrate,

[B] a stacked type imaging element configured and structured such that the blue light photoelectric conversion portion of the first type and the green light photoelectric conversion portion of the first type are stacked in the vertical direction, and the red light photoelectric conversion portion of the second type is arranged below the two layers of the photoelectric conversion portions of the first type, and control portions of the blue light imaging element of the first type, green light imaging element of the first type, and red light imaging element of the second type are provided on a semiconductor substrate,

[C] a stacked type imaging element configured and structured such that the blue light photoelectric conversion portion of the second type and the red light photoelectric conversion portion of the second type are arranged below the green light photoelectric conversion portion of the first type, and control portions of the green light imaging element of the first type, blue light imaging element of the second type, and red light imaging element of the second type are provided on a semiconductor substrate, and

[D] a stacked type imaging element configured and structured such that the green light photoelectric conversion portion of the second type and the red light photoelectric conversion portion of the second type are arranged below the blue light photoelectric conversion portion of the first type, and control portions of the blue light imaging element of the first type, green light imaging element of the second type, and red light imaging element of the second type are provided on a semiconductor substrate.

It is to be noted that the order of arrangement of the photoelectric conversion portions of the imaging elements in the vertical direction preferably is the order of the blue light photoelectric conversion portion, green light photoelectric conversion portion, and red light photoelectric conversion portion from the light incidence direction, or the order of the green light photoelectric conversion portion, blue light photoelectric conversion portion, and red light photoelectric conversion portion from the light incidence direction. This is because light of a shorter wavelength is absorbed in a higher efficiency on the incidence surface side. Since red light has the longest wavelength among the three colors, preferably the red light photoelectric conversion portion is positioned in the lowermost layer as viewed from the light incidence face. One pixel is configured from a stacked structure of the imaging elements. Here, preferably the red light photoelectric conversion portion of the first type is configured, for example, from an organic material and is arranged in the lowermost layer of the stacked structure of the imaging elements of the first type but higher than the imaging elements of the second type. Alternatively, an infrared light photoelectric conversion portion of the second type may be provided below the photoelectric conversion portions of the first type.

In the imaging elements of the first type, for example, the first electrode is formed on an interlayer insulating layer provided on the semiconductor substrate. The imaging element formed on the semiconductor substrate may be formed as that of the back-illuminated type or as that of the front-illuminated type.

In a case where the photoelectric conversion portion is configured from photoelectric conversion layer formed from an organic material, the photoelectric conversion layer can be formed in any of four forms including (1) a form in which the photoelectric conversion layer is configured from a p-type organic semiconductor, (2) a form in which the photoelectric conversion layer is configured from an n-type organic semiconductor, (3) a form in which the photoelectric conversion layer is configured from a stacked structure of a p-type organic semiconductor layer/n-type organic semiconductor layer, a stacked structure of a p-type organic semiconductor layer/mixture layer (bulk hetero structure) of a p-type organic semiconductor and an n-type organic semiconductor/n-type organic semiconductor layer, a stacked structure of a p-type organic semiconductor layer/mixture layer (bulk hetero structure) of a p-type organic semiconductor and an n-type organic semiconductor, or a stacked structure of an n-type organic semiconductor layer/mixture layer (bulk hetero structure) of a p-type organic semiconductor and an n-type organic semiconductor, and (4) a form in which the photoelectric conversion layer is configured from a mixture (bulk hetero structure) of a p-type organic semiconductor and an n-type organic semiconductor.

It is to be noted that a configuration in which the layering order is changed as desired can be applied.

As the p-type organic semiconductor, naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothionopyridine benzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes with a heterocyclic compound as a ligand, polythiophene derivatives, polybenzothiadiazole derivatives, polyfluorene derivatives, and so forth are applicable. As the n-type organic semiconductors, fullerenes and fullerenes derivatives <for example, fullerenes such as C60, C70, and C74 (higher fullerenes), encapsulating fullerenes and so forth) or fullerenes derivatives (for example, fullerene fluorides, PCBM fullerene compounds, fullerene multimers, and so forth)>, organic semiconductors whose HOMO and LUMO are greater (deeper) than those of p-type organic semiconductors, and transparent inorganic metal oxides are applicable. As the n-type organic semiconductors, particularly, heterocyclic compounds containing nitrogen atoms, oxygen atoms, or sulfur atoms such as organic molecules that have, at a molecular skeleton thereof, pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives, or the like, organometallic complexes, and subphthalocyanine derivatives are applicable.

As a group or the like included in the fullerene derivatives, halogen atoms; linear, branched, or cyclic alkyl groups or phenyl groups; groups having a linear or condensed-ring aromatic compound; groups having a halide; partial fluoroalkyl groups; perfluoroalkyl groups; cyril alkyl groups; cyril alkoxy groups; arylsilyl groups; aryl sulfanyl groups; alkyl sulfanyl groups; aryl sulfonyl groups; alkyl sulfonyl groups; aryl sulfide groups; alkyl sulfide groups; amino groups; alkyl amino groups; aryl amino groups; hydroxy groups; alcoxy groups; acyl amino groups; acyloxy groups; carbonyl groups; carboxy groups; carboxamide groups; carboalcoxy groups; acyl groups; sulfonil groups; cyano groups; nitro groups; groups having a chalcogenide; phosphine groups; phosphon groups; and derivatives of them are applicable. Though not restrictive, the thickness of the photoelectric conversion layer configured from an organic material (sometimes referred to as "organic photoelectric conversion layer") is, for example, $1 \times 10^{-8}$ to $5 \times 10^{-7}$ m, preferably, $2.5 \times 10^{-8}$ to $3 \times 10^{-7}$ m, more preferably, $2.5 \times 10^{-8}$ to $2 \times 10^{-7}$ m, most preferably, $1 \times 10^{-7}$ to $1.8 \times 10^{-7}$ m can be exemplified. It is to be noted that, although organic semiconductors are frequently classified into the p type and the n type, the p type signifies that positive holes are transported readily and the n type signifies that electrons are transported readily, and the interpretation that the organic semiconductor has positive holes or electrons as multiple carriers of thermal excitation like inorganic semiconductors is not restrictive.

Meanwhile, as a material for configuring an organic photoelectric conversion layer for photoelectrically conversing green light, for example, a rhodamine pigment, a melacianin pigment, a quinacridone derivative, a subphthalocyanine pigment (subphthalocyanine derivative), and so forth are applicable. As a material for configuring an organic photoelectric conversion layer for photoelectrically converting blue light, for example, a coumarin acid pigment, tris 8 hydrixi quinoli aluminum (Alq3), a melacianin pigment, and so forth are applicable. Further, as a material for configuring an organic photoelectric conversion layer for photoelectrically converting red light, for example, a phthalocyanine pigment and a subphthalocyanine pigment (subphthalocyanine derivative) are applicable.

Alternatively, as an inorganic material for configuring a photoelectric conversion layer, crystalline silicon, amorphous silicon, microcrystalline silicon, crystalline selenium, amorphous selenium, and CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are calcopalite compounds, GaAs, InP, AlGaAs, InGaP, AlGaInP, and InGaAsP, which are III-V group compounds, or such compound semiconductors as CdSe, CdS, $In_2Se_3$, $In_2S_3$, $Bi_2Se_3$, $Bi_2S_3$, ZnSe, ZnS, PbSe, PbS, and so forth are applicable. In addition, also it is possible to use quantum dots formed from those materials for the photoelectric conversion layer.

Alternatively, the photoelectric conversion portion can be formed in a stacked structure of a lower layer semiconductor layer and an upper layer photoelectric conversion layer. By providing the lower layer semiconductor layer in this manner, for example, it is possible to prevent recombination upon charge accumulation. Further, the charge transfer efficiency of charge accumulated in the photoelectric conversion portion to the first electrode can be increased. Further, it is possible to temporarily hold charge generated in the photoelectric conversion portion and control the transfer timing and so forth. Further, generation of dark current can be suppressed. It is sufficient if the material for configuring the upper layer photoelectric conversion layer is selected suitably from the various materials that configure the photoelectric conversion layer described hereinabove. On the other hand, as the material for configuring the lower layer semiconductor layer, it is preferable to use a material that has a high value of the band gap energy (for example, a value of the band gap energy of 3.0 eV or more) and besides has a mobility higher than that of the material for configuring the photoelectric conversion layer. In particular, oxide semiconductor materials; transition metal dichalcogenide; silicon carbide; diamond; graphene; carbon nanotube; and organic semiconductor materials such as condensed polycyclic hydride compounds and condensed hydrocyclic compounds, and more particularly, as the oxide semiconductor material, indium oxide, gallium oxide, zinc oxide, tin oxide, materials containing at least one of these oxides, materials with a dopant added to these materials, more particularly, for example, IGZO, ITZO, IWZO, IWO, ZTO, $ITO-SiO_x$ materials, GZO, IGO, $ZnSnO_3$, AlZnO, GaZnO, and InZnO are applicable. Further, materials containing CuI, $InSbO_4$, ZnMgO, $CuInO_2$, $MgIn_2O_4$, CdO, or the like are applicable. However, these materials are not restrictive. Alternatively, as a material for configuring the lower layer semiconductor layer, in the case where charge to be accumulated is electrons, a material having ionization potential higher than the ionization potential of the material that configures the upper layer photoelectric conversion layer is applicable, and in the case where charge to be accumulated is positive holes, a material having electron affinity lower than the electron affinity of the material that configures the upper layer photoelectric conversion layer is applicable. Alternatively, the impurity concentration of the material that configures the lower layer semiconductor layer preferably is $1\times10^{18}$ $cm^{-3}$ or less. The lower layer semiconductor layer may have a single layer configuration or may have a multilayer configuration. Further, the material that configures the lower layer semiconductor layer positioned above the charge accumulating electrode and the material that configures the lower layer semiconductor layer positioned above the first electrode may be made different from each other.

A single plate type color solid-state image sensor can be configured from the solid-state image sensors of the present disclosure.

In the solid-state image sensor of the present disclosure including a stacked type imaging element, different from a solid-state image sensor that includes imaging elements of a Bayer array (that is, spectroscopy of blue, green, and red is not performed using a color filter), one pixel is configured by stacking imaging elements having sensitivities to light of a plurality of different wavelengths in an incidence direction of light in the same pixel, and therefore, improvement of the sensitivity and improvement of the pixel density per unit volume can be achieved. Further, since organic materials have a high absorption coefficient, the film thickness of the organic photoelectric conversion layer can be reduced in comparison with a conventional Si type photoelectric conversion layer, and leak of light from an adjacent pixel or limitation to the incidence angle of light is moderated. Furthermore, although a conventional Si type imaging element suffers from false color because it generates a color signal by performing an interpolation process among pixels of three colors, in the solid-state image sensor of the present disclosure that includes the stacked type imaging element, appearance of false color can be suppressed. Further, since the organic photoelectric conversion layer itself functions also as a color filter, even if a color filter is not arranged, color separation can be performed.

On the other hand, in the solid-state image sensor of the present disclosure that includes not the stacked type imaging element but the imaging element, by using a color filter, a requirement for a spectroscopic characteristic of blue, green and, red can be moderated, and high mass productivity is achieved. As the array of imaging elements in the solid-state image sensor of the present disclosure, in addition to a Bayer array, an interline array, a G stripe RB checkered array, a G stripe RB complete checkered array, a checkered complementary color array, a stripe array, an oblique stripe array, a primary color difference array, a field color difference sequential array, a frame color difference sequential array, a MOS type array, an improved MOS type array, a frame interleave array, and a field interleave array are applicable. Here, one pixel (or subpixel) can be configured from a single imaging element.

The solid-state image sensor of the present disclosure is configured from a plurality of pixels arrayed regularly in a two-dimensional array. A pixel region is usually configured from an effective pixel region in which light is actually received and signal charge generated by photoelectric conversion is amplified and read out to a driving circuit, and a black reference pixel region for outputting optical black that becomes a reference for the black level. The black reference pixel region is usually arranged on an outer peripheral portion of the effective pixel region.

In the solid-state image sensor of the present disclosure including the preferred forms and configurations described above, light is irradiated and photoelectric conversion occurs in the photoelectric conversion portion, whereupon carrier separation into positive holes (holes) and electrons is performed. Then, the electrode from which the positive holes are extracted is determined as an anode and the electrode from which the electrons are extracted is determined as a cathode. Not only a form in which the first electrode configures the anode and the second electrode configures the cathode but also a form in which conversely the first electrode configures the cathode and the second electrode configures the anode are available.

In the case where a stacked type imaging element is configured, it can be configured such that the first electrode, the charge accumulating electrode, various isolation electrodes, the transfer controlling electrode, the charge discharging electrode, and the second electrode are formed from a transparent conductive material. It is to be noted that the first electrode, the charge accumulating electrode, various isolation electrodes, the transfer controlling electrode, and the charge discharging electrode are sometimes referred to collectively as "first electrode and so forth." Alternatively, in the a where the solid-state image sensor of the present disclosure is arranged on a plane, for example, like a Bayer array, the stacked type imaging element can be configured such that the second electrode is formed from a transparent conductive material and the first electrode, the charge accumulating electrode, and so forth are formed from a metal material. In this case, the stacked type imaging element can be configured particularly such that the second electrode positioned on the light incidence side is formed from a transparent conductive material and the first electrode and so forth are formed, for example, from Al—Nd (alloy of aluminum and neodymium) or ASC (alloy of aluminum, samarium, and copper). It is to be noted that an electrode made of a transparent conductive material is sometimes referred to as "transparent electrode." Here, the band gap energy of the transparent conductive material is 2.5 eV or more, preferably 3.1 eV or more. As the transparent conductive material configuring the transparent electrode, a metal oxide having conductivity is applicable. In particular, indium oxide, indium tin oxide (ITO, Indium Tin Oxide, including $In_2O_3$ doped with Sn, crystalline ITO, and amorphous ITO), indium zinc oxide (IZO, Indium Zinc Oxide) where indium is added as a dopant to zinc oxide, indium gallium oxide (IGO) where indium is added as a dopant to gallium oxide, indium gallium zinc oxide (IGZO, In—GaZnO$_4$) where indium and gallium are added as a dopant to zinc oxide, indium tin zinc oxide (ITZO) where indium and tin are added as a dopant to zinc oxide, IFO (F-doped $In_2O_3$), tin oxide ($SnO_2$), ATO (Sb-doped $SnO_2$), FTO (F-doped $SnO_2$), zinc oxide (including ZnO doped with a different element), aluminum zinc oxide (AZO) where aluminum is added as a dopant to zinc oxide, gallium zinc oxide (GZO) where gallium is added as a dopant to zinc oxide, titanium oxide ($TiO_2$), niobium titanium oxide (TNO) where niobium is added as a dopant to titanium oxide, antimony oxide, spinel type oxide, and an oxide having a $YbFe_2O_4$ structure are applicable. Alternatively, a transparent electrode including gallium oxide, titanium oxide, niobium oxide, nickel oxide, and so forth as a base layer is applicable. As the thickness of the transparent electrode, $2\times10^{-8}$ to $2\times10^{-7}$ m, preferably $3\times10^{-8}$ to $1\times10^{-7}$ m, are applicable. In a case where transparency is required for the first electrode, it is also preferable that the other electrodes are configured from a transparent conductive material from the point of view of simplification of the manufacturing process.

Alternatively, in a case where the transparency is not required, a conductive material for configuring an anode having a function as an electrode for extracting positive holes is preferably configured from a conductive material having a high work function (for example, φ=4.5 to 5.5 eV). In particular, gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te) can be exemplified. On the other hand, a conductive material for configuring a cathode having a function as an electrode for extracting electrons is preferably configured from a conductive material having a low work function (for example, φ=3.5 to 4.5 eV). In particular, alkali metals (for example, Li, Na, K, and so forth) and fluorides or oxides of the same, alkaline earth metals (for example, Mg, Ca, and so forth) and fluorides or oxides of the same, aluminum (Al), zinc (Zn), tin (Sn), thallium (Tl), sodium-potassium alloys, aluminum-lithium alloys, magnesium-silver alloys, rare earth metals such as indium and ytterbium, or alloys of them are applicable. Alternatively, as a material for configuring an anode or a cathode, conductive materials such as metals such as platinum (Pt), gold (Au), palladium (Pd), chromium (Cr), nickel (Ni), aluminum (Al), silver (Ag), tantalum (Ta), tungsten (W), copper (Cu), titanium (T), indium (In), tin (Sn), iron (Fe), cobalt (Co), and molybdenum (Mo), alloys containing such metal elements, conductive particles configured from those metals, conductive particles of alloys containing those metals, polycrystalline silicon containing impurities, carbon-based materials, oxide semiconductors, carbon nanotubes, graphene, and so forth are applicable. Further, as a material for configuring an anode or a cathode, such an organic material (conductive polymers) as poly(3, 4-ethylenedioxythiophene)/polystyrene sulfonic acid [PEDOT/PSS] is applicable. Further, such conductive materials may be used as an electrode by mixing it into binder (polymer) to form paste or ink and hardening the paste or the ink.

As a film formation method of the first electrode or the like and the second electrode (anode and cathode), a dry method or a wet method can be used. As the dry method, a physical vapor deposition method (PVD method) and a chemical vapor deposition method (CVD method) are applicable. As a film formation method in which the PVD method is used, a vapor deposition method that uses resistor heating or high frequency heating, an EB (electron beam) deposition method, various sputtering methods (magnetron sputtering method, RF-DC combined bias sputtering method, ECR sputtering method, opposed target sputtering method, and high frequency sputtering method), an ion plating method, a laser ablation method, a molecular beam epitaxy method, and a laser transfer method are applicable. Meanwhile, as the CVD method, a plasma CVD method, a thermal CVD method, an organic metal (MO) CVD method, and an optical CVD method are applicable. On the other hand, as the wet type method, such methods as an electroplating method or an electroless plating method, a spin coating method, an ink jet method, a spray coating method, a stamp method, a micro contact print method, a flexo printing method, an offset printing method, a gravure printing method, and a dip method are applicable. As the patterning method, chemical etching such as shadow mask, laser transfer, or photolithography, physical etching by ultraviolet rays or a laser and so forth are applicable. As a flattening technology for the first electrode and so forth or the second electrode, a laser flattening method, a reflow method, a CMP (Chemical Mechanical Polishing) method, and so forth can be used.

As a material for configuring an insulating layer, an interlayer insulating layer, an insulating film, and an interlayer insulating film, not only an inorganic insulating material exemplified by a silicon oxide material; silicon nitride ($SiN_Y$); and a metal oxide high dielectric insulating material such as aluminum oxide ($Al_2O_3$), but also polymethylmethacrylate (PMMA); polyvinyl phenol (PVP); polyvinyl alcohol (PVA); polyimide; polycarbonate (PC); polyethylene terephthalate (PET); polystyrene; silanol derivative (silane coupling agent) such as N-2 (amino ethyl) 3-aminopropyltrimethoxysillane (AEAPTMS), 3-mercaptopropyltrimethoxysilane (MPTMS), or octadecyltrichlorosilane (OTS); novolac type phenolic resins; fluorine resins; and organic insulating materials (organic polymers) exemplified by linear hydrocarbons having a functional group that can be attached to the control electrode at one end thereof such as octadecane thiol or dodecyl isocyanate are applicable, and combinations of them can also be used. It is to be noted that, as the silicon oxide materials, silicon oxide ($SiO_X$), BPSG, PSG, BSG, AsSG, PbSG, silicon oxynitride (SiON), SOG (spin-on-glass), and low dielectric materials (for example, polyallyl ether, cycloperfluorocarbon polymer and benzocyclobutene, cyclic fluororesin, polytetrafluoroethylene, aryl fluoride ether, polyimide fluoride, amorphous carbon, and organic SOG) can be exemplified.

The configuration and structure of the floating diffusion layer, the amplification transistor, the reset transistor, and the selection transistor that configure the control portion can be made similar to the configuration and structure of a conventional floating diffusion layer, amplification transistor, reset transistor, and selection transistor. The driving circuit can also have a well-known configuration and structure.

Although the first electrode is connected to the floating diffusion layer and the gate portion of the amplification transistor, it is sufficient if a contact hole portion for the connection between the first electrode and the floating diffusion layer and the gate portion of the amplification transistor is formed. As the material for configuring the contact hole portion, polysilicon doped with an impurity, high melting point metals and metal silicide such as tungsten, Ti, Pt, Pd, Cu, TiW, TiN, TiNW, $WSi_2$, or $MoSi_2$ and stacked structures (for example, Ti/TiN/W) of layers made of such materials can be exemplified.

A first carrier blocking layer may be provided between the organic photoelectric conversion layer and the first electrode, and a second carrier blocking layer may be provided between the organic photoelectric conversion layer and the second electrode. Further, a first charge injection layer may be provided between the first carrier blocking layer and the first electrode, and a second charge injection layer may be provided between the second carrier blocking layer and the second electrode. For example, as the material for configuring the charge injection layer, alkali metals such as lithium (Li), sodium (Na), or potassium (K) and their fluorides and oxides and alkaline earth metals such as magnesium (Mg) and calcium (Ca) and their fluorides and oxides are applicable.

As the film formation method of the various organic layers, a dry film formation method and a wet film formation method are applicable. As the dry film formation method, a vacuum deposition method that uses resistor heating, high frequency heating, or electron beam heating, a flash deposition method, a plasma deposition method, an EB deposition method, various sputtering methods (2-pole sputtering method, a direct current (DC) sputtering method, a DC magnetron sputtering, a high frequency sputtering method, a magnetron sputtering method, an RF-DC combined bias sputtering method, an ECR sputtering method, an opposed target sputtering method, a high frequency sputtering method, and an ion beam sputtering method), a high frequency sputtering method, and an ion beam sputtering method), a DC method, an RF method, a multicathode method, an activation reaction method, an electric field deposition method, various ion plating methods such as a high frequency ion plating method and a reactive ion plating method, a laser ablation method, a molecular beam epitaxy method, a laser transfer method, and a molecular beam epitaxy method (MBE method) are applicable. Meanwhile, as the CVD method, a plasma CVD method, a thermal CVD method, an MOCVD method, and an optical CVD method are applicable. On the other hand, as the wet type method, particularly, a spin coating method; an immersion method; a cast method; a micro contact print method; a drop cast method; various printing methods such as a screen printing method and an ink jet printing method, an offset printing method, a gravure printing method, or a flexo printing method; a stamp method; a spray method; and various coating methods such as an airdactor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method can be exemplified. It is to be noted that, in the application method, as a solvent, non-polar or low-polar organic solvents such as toluene, chloroform, hexane, and ethanol can be exemplified. As the patterning method, chemical etching such as shadow mask, laser transfer, or photolithography, physical etching by ultraviolet rays, a laser, or the like and so froth are applicable. As a flattening method for the various organic layers, a laser flattening method, a reflow method, and so forth can be used.

Two or more of the imaging elements of the first configuration to the sixth configuration including the preferred forms and configurations described above can be suitably combined as desired.

In the solid-state image sensors, an on-chip microlens or a shading layer may be provided as described above as occasion demands, and a driving circuit and wirings for driving the imaging elements are provided. As occasion demands, a shutter for controlling incidence of light to the imaging element may be arranged, or an optical cut filter may be provided according to an object of the solid-state image sensor.

For example, in a case where a solid-state image sensor is stacked with a reading out integrated circuit (ROIC), by placing a driving substrate on which a reading out integrated circuit and a connection region made of cupper (Cu) are formed and an imaging element on which a connection region is formed one on the other such that the connection regions contact with each other and then joining the connection regions to each other, they can be stacked, and it is also possible to join the connection regions to each other using solder bumps or the like.

Further, a driving method for driving the solid-state image sensor of the present disclosure can be made a driving method for a solid-state image sensor that repeats the steps of discharging, in all imaging elements all at once, while charge is accumulated into photoelectric conversion portions, charge in first electrodes to the outside of the system, and then transferring, in all imaging elements all at once, the charge accumulated in the photoelectric conversion portions to the first electrodes and sequentially reading out, after completion of the transfer, the charge transferred to the first electrodes in the imaging elements.

In such a driving method for a solid-state image sensor as described above, since each imaging element is structured such that light incident from the second electrode side is not incident to the first electrode and, while charge is accumulated into the photoelectric conversion portions in all imaging elements all at once, the charge in the first electrodes is discharged to the outside of the system, resetting of the first electrode can be simultaneously performed with certainty in all imaging elements. Thereafter, the charge accumulated in the photoelectric conversion portion is transferred to the first electrodes in all imaging elements all at once, and after completion of the transfer, the charge transferred to the first electrode in each imaging element is read out sequentially. Therefore, what is generally called a global shutter function can be implemented readily.

Embodiment 1

Figure 9:
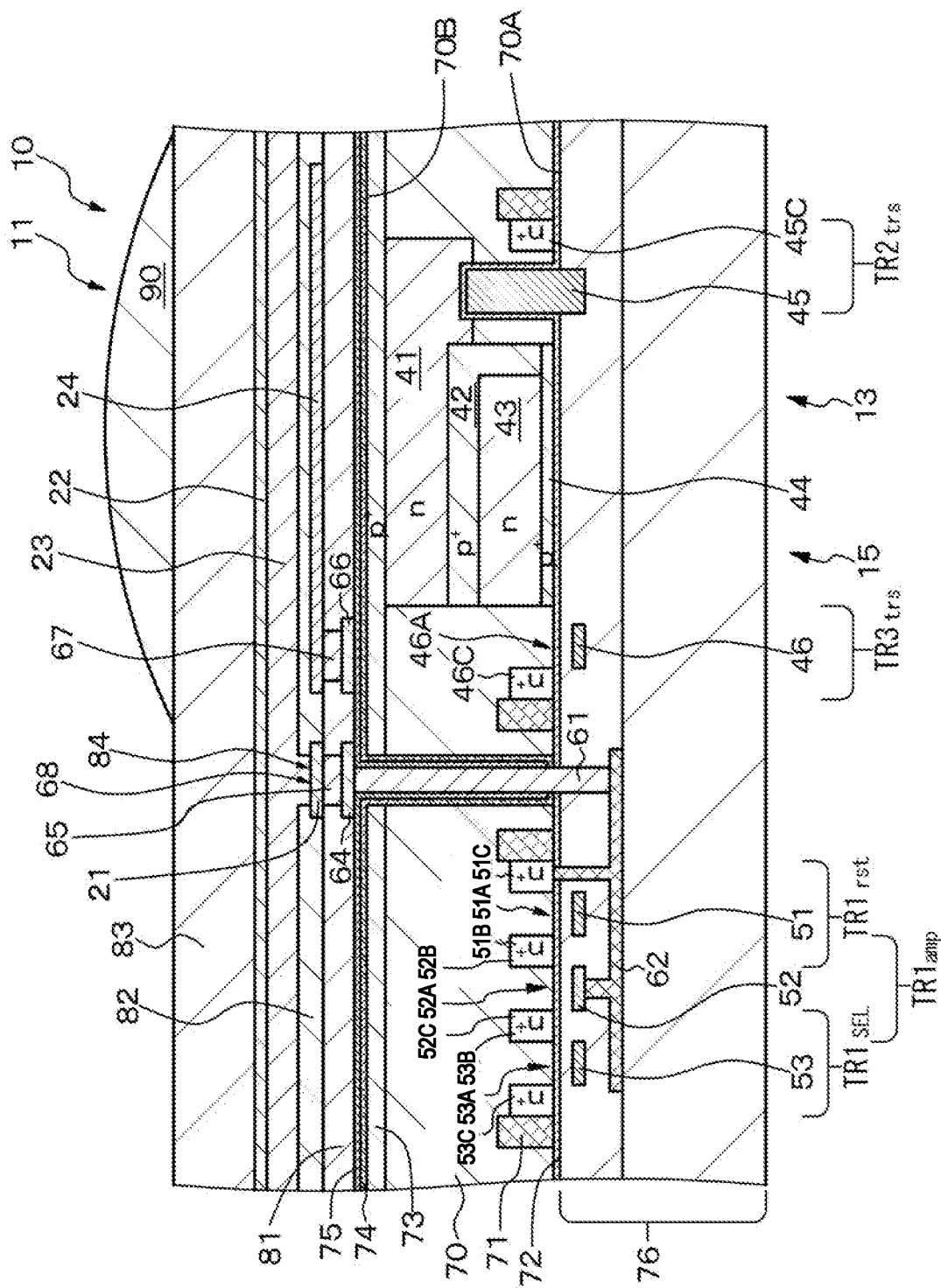
FIG. 9 is a schematic partial sectional view of the solid-state image sensor of the embodiment 1.
Figure 11:
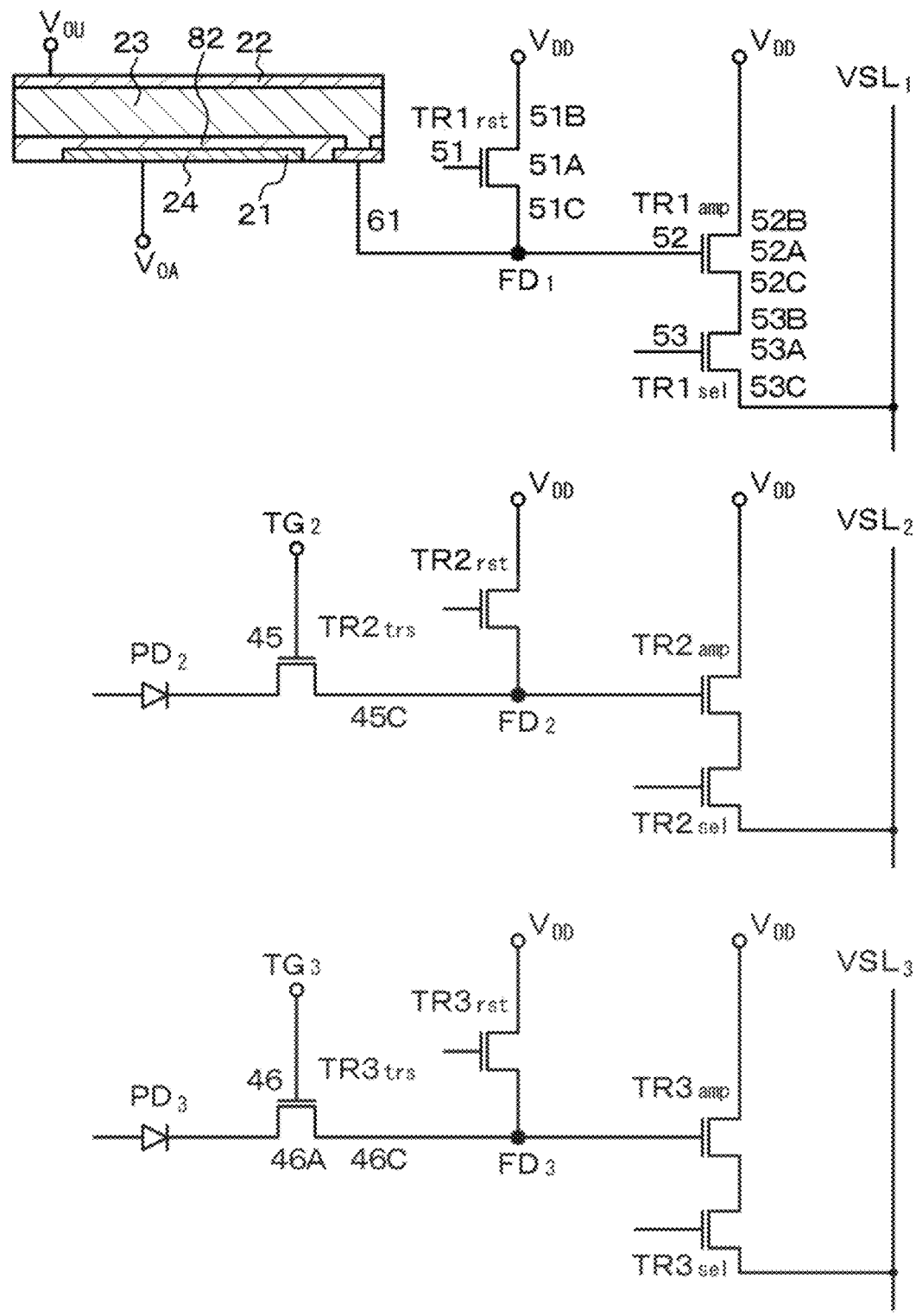
FIG. 11 is an equivalent circuit diagram of the imaging element and a stacked type imaging element of the embodiment 1.
Figure 12:
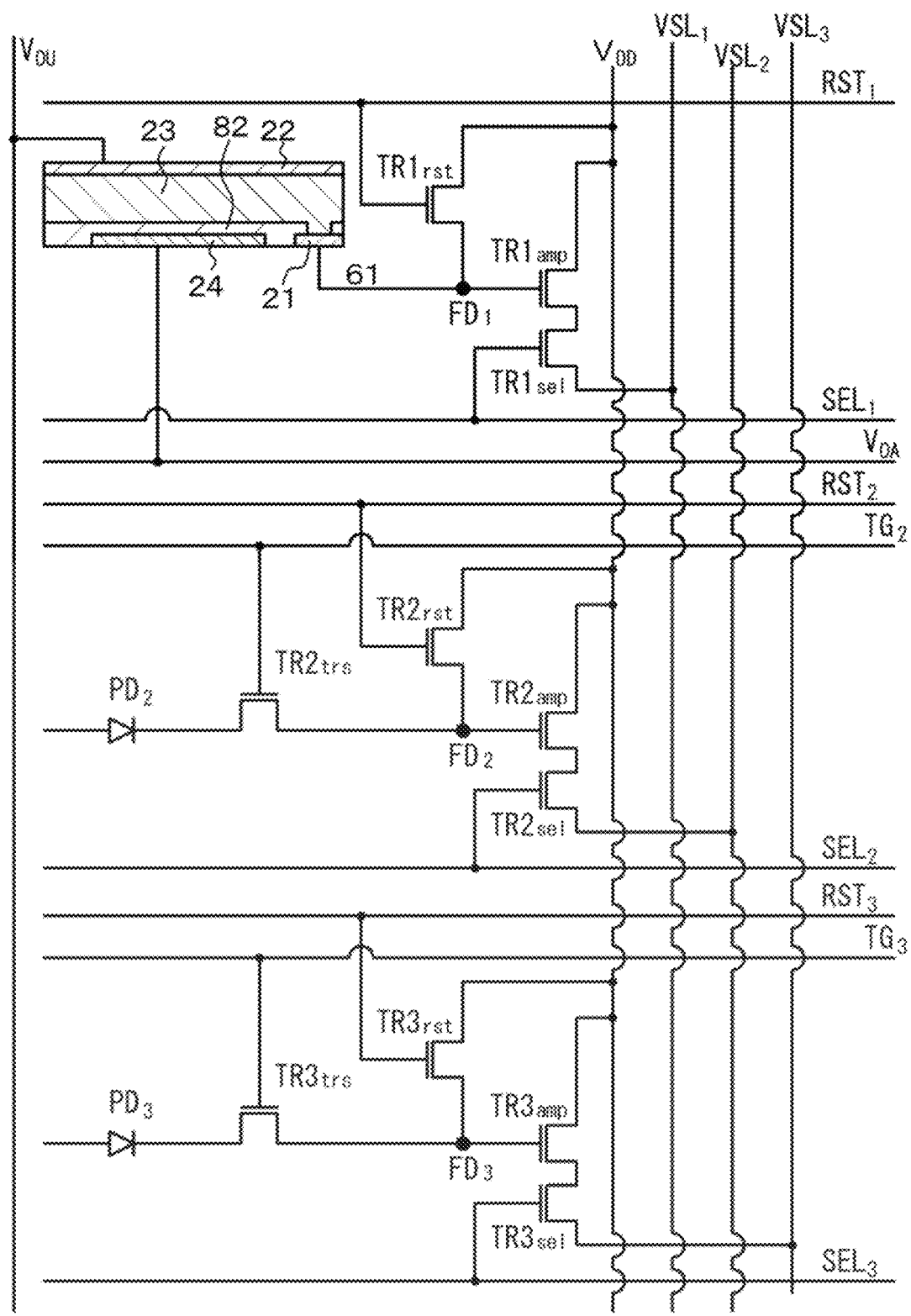
FIG. 12 is an equivalent circuit diagram of the imaging element and the stacked type imaging element of the embodiment 1.
Figure 13:
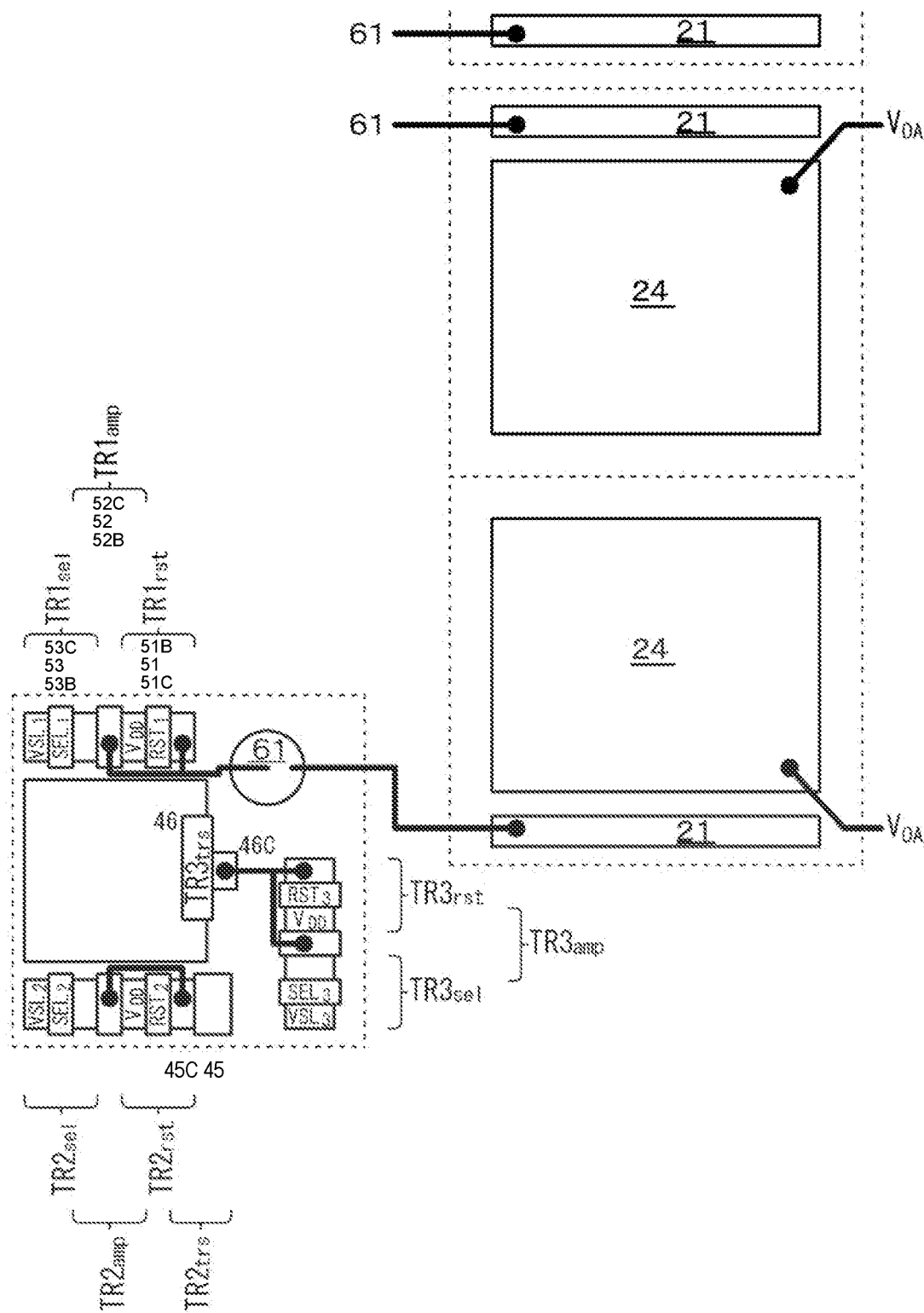
FIG. 13 is a schematic arrangement diagram of the first electrode and the charge accumulating electrode and transistors configuring a control portion that configure the imaging element of the embodiment 1.
Figure 15A:
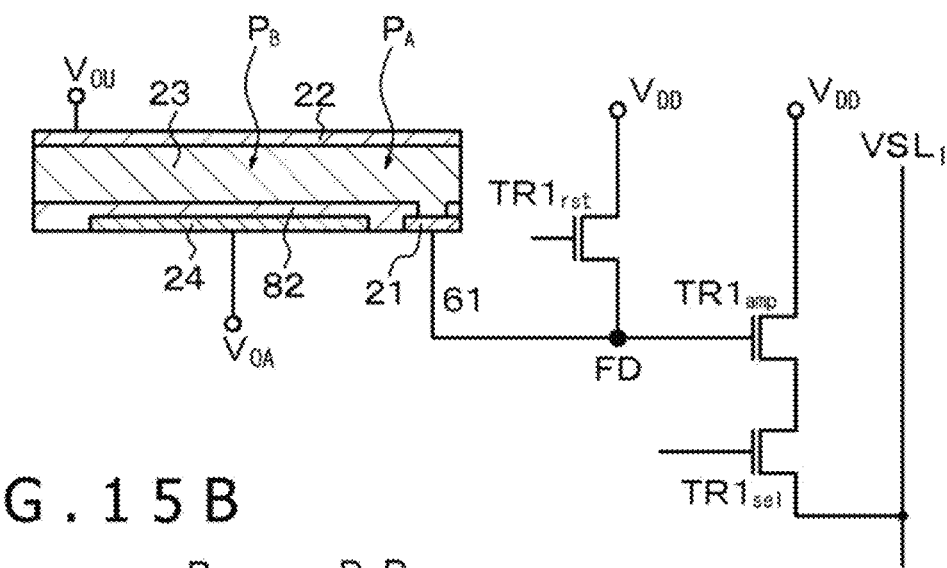
FIGS. 15A and 15B are equivalent circuit diagrams of the imaging element and the stacked type imaging element of the embodiment 1 and an embodiment 8 for illustrating portions of FIG. 14 (embodiment 1) and FIGS. 32 and 33 (embodiment 8).
Figure 16:
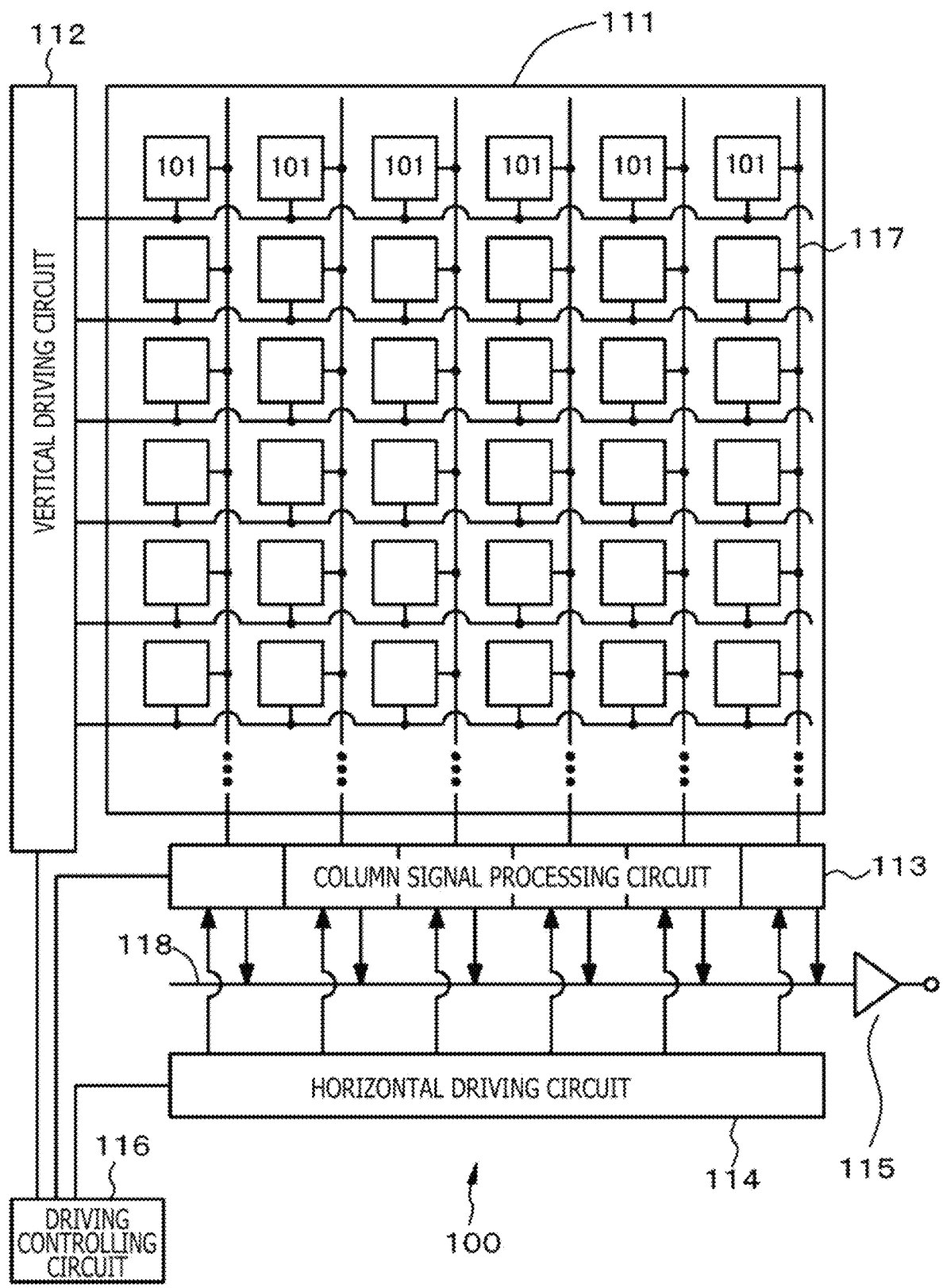
FIG. 16 is a conceptual diagram of the solid-state image sensor of the embodiment 1.

The embodiment 1 relates to a solid-state image sensor of the present disclosure, particularly to the solid-state image sensor of the first configuration. An arrangement state of a charge accumulating electrode and a first electrode in the solid-state image sensor of the embodiment 1 is schematically depicted in FIG. 1A. Further, schematic partial sectional views of the solid-state image sensor of the embodiment 1 are depicted in FIGS. 9 and 10A, and equivalent circuit diagrams of an imaging element and a stacked type imaging element of the embodiment 1 are depicted in FIGS. 11 and 12, respectively. Further, a schematic arrangement diagram of a first electrode and a charge accumulating electrode and transistors configuring a control portion that configure the imaging element of the embodiment 1 is depicted in FIG. 13. Further, a state of potentials at various portions upon operation of the imaging element of the embodiment 1 is depicted in FIG. 14. An equivalent circuit diagram of the imaging element and the stacked type imaging element of the embodiment 1 illustrating the portions of FIG. 14 is depicted in FIG. 15A. A conceptual view of the solid-state image sensor of the embodiment 1 is depicted in FIG. 16.

Here, FIG. 9 is a schematic partial sectional view taken along a dashed line A-B-C depicted in FIG. 1A, and FIG. 10A is a schematic partial sectional view taken along a dashed line A-B-D-E depicted in FIG. 1A. Further, in order to simplify the drawings, various imaging element components positioned below an interlayer insulating layer hereinafter described are sometimes depicted collectively by a reference numeral 91 for the convenience of illustration.

The solid-state image sensor of the embodiment 1 includes a plurality of imaging element blocks 10 each configured from a plurality of imaging elements 11. Each imaging element 11 includes a first electrode 21, a charge accumulating electrode 24 arranged in a spaced relation from the first electrode 21, a photoelectric conversion portion 23 contacting with the first electrode 21 and formed above the charge accumulating electrode 24 with an insulating layer 82 interposed therebetween, and a second electrode 22 formed on the photoelectric conversion portion 23. The first electrode 21 and the charge accumulating electrode 24 are provided on an interlayer insulating layer 81. The first electrode 21 of the imaging element 11 is connected to a connection portion 63 provided in the interlayer insulating layer 81.

In the solid-state image sensor of the embodiment 1, the imaging element block 10 is configured from P×Q (where P≥2, Q≥1) imaging elements including P imaging elements 11 along a first direction and Q imaging elements 11 along a second direction different from the first direction. In particular, in the solid-state image sensor of the embodiment 1, P=2 and Q=1. In other words, the imaging element block 10 is configured from two first imaging elements 11 arranged side by side along the first direction. The first electrode 21 that configures each of the two imaging elements 11 along the first direction is connected to a connection portion 63 provided in the interlayer insulating layer 81. The plurality of imaging element blocks 10 is arrayed in a two-dimensional matrix in the first direction and the second direction, for example.

The imaging elements 11 are arranged line-symmetrically with respect to a boundary line BL extending in the second direction between an imaging element 11 and another imaging element 11 configuring the imaging element block 10. Further, in FIG. 1A, one imaging element block 10 is depicted. The connection portion 63 is configured from a connection hole 65 provided in the interlayer insulating layer 81 and connected to the first electrode 21 and a wiring portion 64 provided in the interlayer insulating layer 81 and extending on an insulating film 75 from the connection hole 65. The connection portion 63 is connected to a contact hole portion 61.

Further, the solid-state image sensor of the embodiment 1 includes a stacked type imaging element including at least one imaging element 11 of the embodiment 1. In particular, at least one lower imaging element 13 or 15 is provided below the imaging element 11 of the embodiment 1, and the wavelength of light that is received by the imaging element 11 and the wavelength of light that is received by the lower imaging element 13 or 15 are different from each other. In this case, the two lower imaging elements 13 and 15 are stacked.

The second electrode 22 positioned on the light incidence side is made common to a plurality of imaging elements 11 except the imaging element of the embodiment 5 hereinafter described. In other words, the second electrode 22 is what is generally called a solid electrode. The photoelectric conversion portion 23 is made common to the plurality of imaging elements 11. In other words, a single layer photoelectric conversion portion 23 is formed for the plurality of imaging elements 11.

The stacked type imaging element of the embodiment 1 includes at least one imaging element 11 of the embodiment 1 (in particular, in the embodiment 1, one imaging element 11 of the embodiment 1).

The stacked type imaging element of the embodiment 1 further includes a control portion provided on a semiconductor substrate and including a driving circuit, and the first electrodes 21 of the two imaging elements 11 configuring the imaging element block 10 are connected to the driving circuit through the connection portion 63 (particularly, the connection hole 65 and the wiring portion 64) and the contact hole portion 61. The second electrode 22 and the charge accumulating electrode 24 are also connected to the driving circuit.

For example, the first electrode 21 is brought to a positive potential while the second electrode 22 is brought to a negative potential such that electrons generated by photoelectric conversion in the photoelectric conversion portion 23 are read out into a first floating diffusion layer $FD_1$. This similarly applies to the other embodiments as well. In a form in which the first electrode 21 is brought to a positive potential while the second electrode 22 is brought to a positive potential such that positive holes generated on the basis of photoelectric conversion in the photoelectric conversion portion 23 are read out into the first floating diffusion layer $FD_1$, it is sufficient if the high and low potentials described below are reversed.

Moreover, the imaging element 11 of the embodiment 1 further includes a control portion provided on the semiconductor substrate 70 and including a driving circuit. The first electrode 21 and the charge accumulating electrode 24 are connected to the driving circuit. During a charge accumulation period, from the driving circuit, a potential $V_{11}$ is applied to the first electrode 21, a potential $V_{31}$ is applied to the charge accumulating electrode 24, and charge is accumulated into the photoelectric conversion portion 23. During a charge transfer period, from the driving circuit, a potential $V_{12}$ is applied to the first electrode 21, a potential $V_{32}$ is applied to the charge accumulating electrode 24, and charge accumulated in the photoelectric conversion portion 23 is read out into the control portion via the first electrode 21. However, since the potential of the first electrode 21 is set higher than the potential of the second electrode 22, $V_{31} \geq V_{11}$ and $V_{32} < V_{12}$ are satisfied.

In the following, operation of the stacked type imaging element (first imaging element) that includes the charge accumulating electrode of the embodiment 1 is described with reference to FIGS. 14 and 15A. Here, the potential of the first electrode 21 is set higher than the potential of the second electrode 22. In other words, the first electrode 21 is brought to a positive potential and the second electrode 22 is brought to a negative potential. Electrons generated by photoelectric conversion in the photoelectric conversion portion 23 are read out into the floating diffusion layer. This similarly applies to the other embodiments as well. It is to be noted that, in a form in which the first electrode 21 is brought to a negative potential and the second electrode 22 is brought to a positive potential such that positive holes generated on the basis of photoelectric conversion in the photoelectric conversion portion 23 are read out into the floating diffusion layer, it is sufficient if the high and low potentials described below are reversed.

Reference signs used in FIG. 14 and in FIGS. 32 and 33 in the embodiment 8 hereinafter described are such as described below.

$P_A$ . . . potential at a point $P_A$ in a region of the photoelectric conversion portion 23 opposed to a region positioned intermediately between the charge accumulating electrode 24 or the transfer controlling electrode (charge transfer electrode) 25 and the first electrode 21

$P_B$ . . . potential at a point $P_B$ in a region of the photoelectric conversion portion 23 opposed to the charge accumulating electrode 24

$P_C$ potential at a point $P_c$ in a region of the photoelectric conversion portion 23 opposed to the transfer controlling electrode (charge transfer electrode) 25

FD potential at the first flowing diffusion layer $FD_1$ $V_{OA}$ potential at the charge accumulating electrode 24

$V_{OT}$ potential at the transfer controlling electrode (charge transfer electrode) 25

RST . . . potential at a gate portion 51 of a reset transistor $TR1_{rst}$ $V_{DD}$ . . . potential of a power supply $VSL_1$ . . . signal line (data output line) $VSL_1$ $TR1_{rst}$ . . . reset transistor $TR1_{rst}$ $TR1_{amp}$ . . . amplification transistor $TR1_{amp}$ $TR1_{sel}$ . . . selection transistor $TR1_{sel}$ <Charge Accumulation Period>

During a charge accumulation period, from the driving circuit, the potential $V_{11}$ is applied to the first electrode 21 and the potential $V_{31}$ is applied to the charge accumulating electrode 24. Further, the potential $V_{21}$ is applied to the second electrode 22. Thus, photoelectric conversion occurs in the photoelectric conversion portion 23 by light incident to the photoelectric conversion portion 23, and charge (electrons) is accumulated into the photoelectric conversion portion 23. Positive holes generated by the photoelectric conversion are sent out from the second electrode 22 to the driving circuit through a wiring $V_{OU}$. On the other hand, since the potential of the first electrode 21 is set higher than the potential of the second electrode 22, that is, for example, a positive potential is applied to the first electrode 21 and a negative potential is applied to the second electrode 22, $V_{31} \geq V_{11}$, preferably, $V_{31} > V_{11}$, is satisfied. By this, electrons generated by photoelectric conversion are attracted to the charge accumulating electrode 24 and stay in a region of the photoelectric conversion portion 23 opposed to the charge accumulating electrode 24. In other words, charge is accumulated into the photoelectric conversion portion 23. Since $V_{31} > V_{11}$ is satisfied, electrons generated in the inside of the photoelectric conversion portion 23 do not move toward the first electrode 21. As the time of photoelectric conversion elapses, the potential in the region of the photoelectric conversion portion 23 opposed to the charge accumulating electrode 24 comes to have an increasing negative side value.

At a later stage of the charge accumulation period, a reset operation is performed. Consequently, the potential of the first floating diffusion layer $FD_1$ is reset, and the potential $(V_{FD})$ of the first floating diffusion layer $FD_1$ becomes equal to the potential $V_{DD}$ of the power supply.

<Charge Transfer Period>

After completion of the reset operation, reading out of charge is performed. In other words, a charge transfer period is started. During the charge transfer period, from the driving circuit, the potential $V_{12}$ is applied to the first electrode 21 and the potential $V_{32}$ is applied to the charge accumulating electrode 24. Further, the potential $V_{22}$ is applied to the second electrode 22. Here, $V_{32} < V_{12}$ is assumed. Thus, charge accumulated in the photoelectric conversion portion 23 of the imaging element 11 is read out. In other words, electrons staying in the region of the photoelectric conversion portion 23 opposed to the charge accumulating electrode 24 are read out to the first electrode 21 and further to the first floating diffusion layer $FD_1$. In other words, the charge accumulated in the photoelectric conversion portion 23 is read out to the control portion.

With the above, the series of operations of charge accumulation, a reset operation, and charge transfer is completed.

Operation of the amplification transistor $TR1_{amp}$ and the selection transistor $TR1_{sel}$ after electrons are read out into the first floating diffusion layer $FD_1$ is the same as operation of conventional amplification transistor and selection transistor. Such a series of operations as charge accumulation, a reset operation, and charge transfer of the second imaging element 13 and the third imaging element 15 is similar to such a conventional series of operations as charge accumulation, a reset operation, and charge transfer. Reset noise of the first floating diffusion layer $FD_1$ can be removed by a correlated double sampling (CDS) process similarly to the conventional technology.

The solid-state image sensor of the embodiment 1 further includes a semiconductor substrate (more particularly, silicon semiconductor layer) 70, and the photoelectric conversion portion is arranged above the semiconductor substrate 70. The solid-state image sensor of the embodiment 1 further includes a control portion that is provided on the semiconductor substrate 70 and includes a driving circuit to which the first electrode 21, second electrode 22, and charge accumulating electrode 24 are connected. Here, the light incident face of the semiconductor substrate 70 is the upper side and the opposite side of the semiconductor substrate 70 is the lower side. Below the semiconductor substrate 70, a wiring layer 62 including a plurality of wirings is provided.

On the semiconductor substrate 70, at least the floating diffusion layer $FD_1$ and the amplification transistor $TR1_{amp}$ that configure the control portion are provided, and the first electrode 21 is connected to the floating diffusion layer $FD_1$ and the gate portion of the amplification transistor $TR1_{amp}$. On the semiconductor substrate 70, the reset transistor $TR1_{rst}$ and the selection transistor $TR1_{sel}$ that configure the control portion are further provided. The floating diffusion layer $FD_1$ is connected to one of the source/drain regions of the reset transistor $TR1_{rst}$, the other one of the source/drain regions of the amplification transistor $TR1_{amp}$ is connected to the one of the source/drain regions of the selection transistor $TR1_{sel}$, and the other one of the source/drain regions of the selection transistor $TR1_{sel}$ is connected to a signal line $VSL_1$. The amplification transistor $TR1_{amp}$, reset transistor $TR1_{rst}$, and selection transistor $TR1_{sel}$ configure the driving circuit.

Although, in the example depicted, a state in which one floating diffusion layer $FD_1$ and so forth are provided for two imaging elements 11 is depicted, in embodiments hereinafter described, the floating diffusion layer $FD_1$ and so forth are shared by four imaging elements 11.

In particular, the imaging element and the stacked type imaging element of the embodiment 1 are an imaging element and a stacked type imaging element of the back-illuminated type, and are structured such that three imaging elements 11, 13, and 15 are stacked including a green light imaging element (hereinafter referred to as "first imaging element") of the embodiment 1 of the first type that includes a green light photoelectric conversion portion of the first type that absorbs green light and has the sensitivity to green light, a conventional blue light imaging element (hereinafter referred to as "second imaging element") of the second type that includes a blue light photoelectric conversion portion of the second type that absorbs blue light and has the sensitivity to blue light, and a conventional red light imaging element (hereinafter referred to as "third imaging element") of the second type that includes a red light photoelectric conversion portion of the second type that absorbs red light and has the sensitivity to red light. Here, the red light imaging element (third imaging element) 15 and the blue light imaging element (second imaging element) 13 are provided in the semiconductor substrate 70 such that the second imaging element 13 is positioned on the light incidence side with respect to the third imaging element 15. Further, the green light imaging element (first imaging element) 11 is provided above the blue light imaging element (second imaging element) 13. One pixel is configured from a stacked structure of the first imaging element 11, the second imaging element 13, and the third imaging element 15. No color filter is provided.

In the first imaging element 11, the connection portion (particularly, the connection hole 65 and the wiring portion 64) is formed in the interlayer insulating layer 81, and the first electrode 21 and the charge accumulating electrode 24 are formed in a spaced relation from each other on the interlayer insulating layer 81. The interlayer insulating layer 81 and the charge accumulating electrode 24 are covered with the insulating layer 82. The photoelectric conversion portion 23 is formed on the insulating layer 82, and the second electrode 22 is formed on the photoelectric conversion portion 23. A protective layer 83 is formed over an overall area including the second electrode 22, and an on-chip microlens 90 is provided on the protective layer 83. The first electrode 21, the charge accumulating electrode 24, and the second electrode 22 are each configured, for example, from a transparent electrode made of ITO (work function: approximately 4.4 eV). The photoelectric conversion portion 23 is configured from a photoelectric conversion layer and is configured from a layer that contains a known organic photoelectric conversion material at least having the sensitivity to green light (for example, a rhodamine pigment, a melacianin pigment, or an organic material such as quinacridone). Further, the photoelectric conversion portion 23 may be configured such that it further includes a material layer suitable for charge accumulation. In other words, a material layer suitable for charge accumulation may be further formed between the photoelectric conversion portion 23 and the first electrode 21 (for example, in a connecting portion 68). The interlayer insulating layer 81, the insulating layer 82, and the protective layer 83 are configured from a known insulating material (for example, $SiO_2$ or SiN). The photoelectric conversion portion 23 and the first electrode 21 are connected to each other by the connecting portion 68 provided on the insulating layer 82. In the connecting portion 68, the photoelectric conversion portion 23 extends. In other words, the photoelectric conversion portion 23 extends in an opening 84 provided in the insulating layer 82 and is connected to the first electrode 21.

The charge accumulating electrode 24 is connected to the driving circuit. In particular, the charge accumulating electrode 24 is connected to a vertical driving circuit 112, which configures the driving circuit, through a connecting portion 67 provided in the interlayer insulating layer 81, a pad portion 66, and a wiring $V_{OA}$.

The size of the charge accumulating electrode 24 is greater than that of the first electrode 21. Where the area of the charge accumulating electrode 24 is presented by $s_1'$ and the area of the first electrode 21 is represented by $s_1$, though not restrictive, it is preferable to satisfy $4 \leq s_1'/s_1$, and in the imaging element of the embodiment 1 or any of the embodiments hereinafter described, for example, $s_1'/s_1=8$ is satisfied, though not restrictive.

An element isolation region 71 is formed on a first face (front face) 70A side of the semiconductor substrate 70, and an oxide film 72 is formed on the first face 70A of the semiconductor substrate 70. Further, the reset transistor $TR1_{rst}$, amplification transistor $TR1_{amp}$, and selection transistor $TR1_{sel}$ that configure the control portion of the first imaging element 11 are provided on the first face side of the semiconductor substrate 70, and the first floating diffusion layer $FD_1$ is further provided.

The reset transistor $TR1_{rst}$ is configured from the gate portion 51, channel formation region 51A, and source/drain regions 51B and 51C. The gate portion 51 of the reset transistor $TR1_{rst}$ is connected to the reset line $RST_1$, and the source/drain region 51C, which is one of the source/drain regions of the reset transistor $TR1_{rst}$, doubles as the first floating diffusion layer $FD_1$, and the source/drain region 51B, which is the other one of the source/drain regions, is connected to the power supply $V_{DD}$.

The first electrode 21 is connected to the one source/drain region 51C (first floating diffusion layer $FD_1$) of the reset transistor $TR1_{rst}$ through the connection portion 63 (the connection hole 65 and the wiring portion 64) provided in the interlayer insulating layer 81, the contact hole portion 61 formed in the semiconductor substrate 70 and the interlayer insulating film 76, and the wiring layer 62 formed on the interlayer insulating film 76.

The amplification transistor $TR1_{amp}$ is configured from a gate portion 52, a channel formation region 52A, and source/drain regions 52B and 52C. The gate portion 52 is connected to the first electrode 21 and the source/drain region 51C (first floating diffusion layer $FD_1$), which is one of the source/drain regions of the reset transistor $TR1_{rst}$, through the wiring layer 62. Meanwhile, the source/drain region 52B, which is one of the source/drain regions, is connected to the power supply $V_{DD}$.

The selection transistor $TR1_{sel}$ is configured from a gate portion 53, a channel formation region 53A, and source/drain regions 53B and 53C. The gate portion 53 is connected to a selection line $SEL_1$. Further, the one source/drain region 53B shares a region with the other source/drain region 52C configuring the amplification transistor $TR1_{amp}$, and the other source/drain region 53C is connected to the signal line (data output line) $VSL_1$ (117).

The second imaging element 13 includes, as a photoelectric conversion layer, an n-type semiconductor region (second photoelectric conversion portion) 41 provided on the semiconductor substrate 70. A gate portion 45 of a transfer transistor $TR2_{trs}$ configured from a vertical transistor extends to the n-type semiconductor region 41 and is connected to a transfer gate line $TG_2$. Further, a second floating diffusion layer $FD_2$ is provided in a region 45C of the semiconductor substrate 70 in the proximity of the gate portion 45 of the transfer transistor $TR2_{trs}$. Charge accumulated in the n-type semiconductor region 41 is read out to the second floating diffusion layer $FD_2$ through a transfer channel formed along the gate portion 45.

In the second imaging element 13, a reset transistor $TR2_{rst}$, an amplification transistor $TR2_{amp}$, and a selection transistor $TR2_{sel}$ that configure a control portion of the second imaging element 13 are further provided on the first face side of the semiconductor substrate 70.

The reset transistor $TR2_{rst}$ is configured from a gate portion, a channel formation region, and source/drain regions. The gate portion of the reset transistor $TR2_{rst}$ is connected to a reset line $RST_2$, and one of the source/drain regions of the reset transistor $TR2_{rst}$ is connected to the power supply $V_{DD}$ while the other one of the source/drain regions doubles as the second floating diffusion layer $FD_2$.

The amplification transistor $TR2_{amp}$ is configured from a gate portion, a channel formation region, and source/drain regions. The gate portion is connected to the other one (second floating diffusion layer $FD_2$) of the source/drain regions of the reset transistor $TR2_{rst}$. Meanwhile, the one of the source/drain regions is connected to the power supply $V_{DD}$.

The selection transistor $TR2_{sel}$ is configured from a gate portion, a channel formation region, and source/drain regions. The gate portion is connected to a selection line $SEL_2$. Meanwhile, one of the source/drain regions shares a region with the other one of the source/drain regions configuring the amplification transistor $TR2_{amp}$, and the other one of the source/drain regions is connected to a signal line (data output line) $VSL_2$.

The third imaging element 15 includes, as a photoelectric conversion layer, an n-type semiconductor region (third photoelectric conversion portion) 43 provided on the semiconductor substrate 70. A gate portion 46 of a transfer transistor $TR3_{trs}$ is connected to a transfer gate line $TG_3$. Further, a third floating diffusion layer $FD_3$ is provided in a region 46C of the semiconductor substrate 70 in the proximity of the gate portion 46 of the transfer transistor $TR3_{trs}$. Charge accumulated in the n-type semiconductor region 43 is read out to the third floating diffusion layer $FD_3$ through a transfer channel 46A formed along the gate portion 46.

In the third imaging element 15, a reset transistor $TR3_{rst}$, an amplification transistor $TR3_{amp}$, and a selection transistor $TR3_{sel}$ configuring a control portion of the third imaging element 15 are further provided on the first face side of the semiconductor substrate 70.

The reset transistor $TR3_{rst}$ is configured from a gate portion, a channel formation region, and source/drain regions. The gate portion of the reset transistor $TR3_{rst}$ is connected to a reset line $RST_3$, and one of the source/drain regions of the reset transistor $TR3_{rst}$ is connected to the power supply $V_{DD}$, and the other one of the source/drain region doubles as the third floating diffusion layer $FD_3$.

The amplification transistor $TR3_{amp}$ is configured from a gate portion, a channel formation region, and source/drain regions. The gate portion is connected to the other one (third floating diffusion layer FDA of the source/drain regions of the reset transistor $TR3_{rst}$. Meanwhile, the one of the source/drain regions is connected to the power supply $V_{DD}$.

The selection transistor $TR3_{sel}$ is configured from a gate portion, a channel formation region, and source/drain regions. The gate portion is connected to a selection line $SEL_3$. Meanwhile, one of the source/drain regions shares a region with the other one of the source/drain regions configuring the amplification transistor $TR3_{amp}$, and the other one of the source/drain regions is connected to a signal line (data output line) $VSL_3$.

The reset lines $RST_1$, $RST_2$, and $RST_3$, selection lines $SEL_1$, $SEL_2$, and $SEL_3$, and transfer gate lines $TG_2$ and $TG_3$ are connected to the vertical driving circuit 112 that configure the driving circuit, and the signal lines (data output lines) $VSL_1$, $VSL_2$, and $VSL_3$ are connected to a column signal processing circuit 113 that configures the driving circuit.

A $p^+$ layer 44 is provided between the n-type semiconductor region 43 and the front face 70A of the semiconductor substrate 70 and suppresses generation of dark current. A $p^+$ layer 42 is formed between the n-type semiconductor region 41 and the n-type semiconductor region 43, and part of a side face of the n-type semiconductor region 43 is surrounded by the $p^+$ layer 42. A $p^+$ layer 73 is formed on the side of the rear face 70B of the semiconductor substrate 70, and an $HfO_2$ film 74 and the insulating film 75 are formed at a portion at which the contact hole portion 61 in the inside of the semiconductor substrate 70 from the $p^+$ layer 73 is to be formed. Although wirings are formed in the interlayer insulating film 76 over a plurality of layers, illustration of them is omitted.

The $HfO_2$ film 74 is a film having negative fixed charge, and generation of dark current can be suppressed by providing such a film as just described. It is to be noted that it is also possible to use, in place of a $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($LA_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$), an ytterbium oxide ($Yb_2O_3$) film, a lutetium oxide ($Lu_2O_3$) film, an yttrium oxide ($Y_2O_3$) film, a hafnium nitride film, an aluminum nitride film, a hafnium oxynitride film, and an aluminum oxynitride film. As a film formation method of the films mentioned, for example, a CVD method, a PVD method, and an ALD method can be listed.

FIG. 16 depicts a conceptual diagram of the solid-state image sensor of the embodiment 1. The solid-state image sensor 100 of the embodiment 1 is configured from an imaging region 111 in which stacked type imaging elements 101 are arrayed in a two-dimensional array, the vertical driving circuit 112, a column signal processing circuit 113, a horizontal driving circuit 114, an outputting circuit 115, a driving controlling circuit 116, and so forth as driving circuits (peripheral circuits). Note that it is a matter of course that the circuits can be configured from known circuits and can be configured using other circuit configurations (for example, various circuits used in a conventional CCD type solid-state image sensor or a conventional CMOS type solid-state image sensor). It is to be noted that the reference number "101" is applied only for one row in the stacked type imaging elements 101 in FIG. 16.

The driving controlling circuit 116 generates a clock signal that servers as a reference for operation of the vertical driving circuit 112, column signal processing circuit 113, and horizontal driving circuit 114 and control signals for them on the basis of a vertical synchronizing signal, a horizontal driving signal, and a master clock. Then, the generated clock signal and control signals are inputted to the vertical driving circuit 112, column signal processing circuit 113, and horizontal driving circuit 114.

The vertical driving circuit 112 is configured, for example, from a shift register and performs selection scanning of the stacked type imaging elements 101 of the imaging region 111 sequentially in a unit of a row in the vertical direction. Then, a pixel signal (image signal) based on current (signal) generated according to a light amount received by each stacked type imaging element 101 is sent to the column signal processing circuit 113 through a signal line (data output line) 117 and a VSL.

The column signal processing circuit 113 is arranged, for example, for each column of the stacked type imaging elements 101 and performs signal processing such as noise removal or signal amplification for image signals outputted from the stacked type imaging elements 101 for one row using a signal from a black reference pixel (though not depicted, formed around the effective pixel region) for each imaging element. At the output stage of the column signal processing circuit 113, a horizontal selection switch (not depicted) is provided in connection to a horizontal signal line 118.

The horizontal driving circuit 114 is configured, for example, from a shift register and sequentially outputs a horizontal scanning pulse to sequentially select the column signal processing circuits 113 such that a signal is outputted from each of the column signal processing circuits 113 to the horizontal signal line 118.

The outputting circuit 115 performs signal processing for signals sequentially supplied from the column signal processing circuits 113 through the horizontal signal line 118 and outputs a resulting signal.

Figure 17:
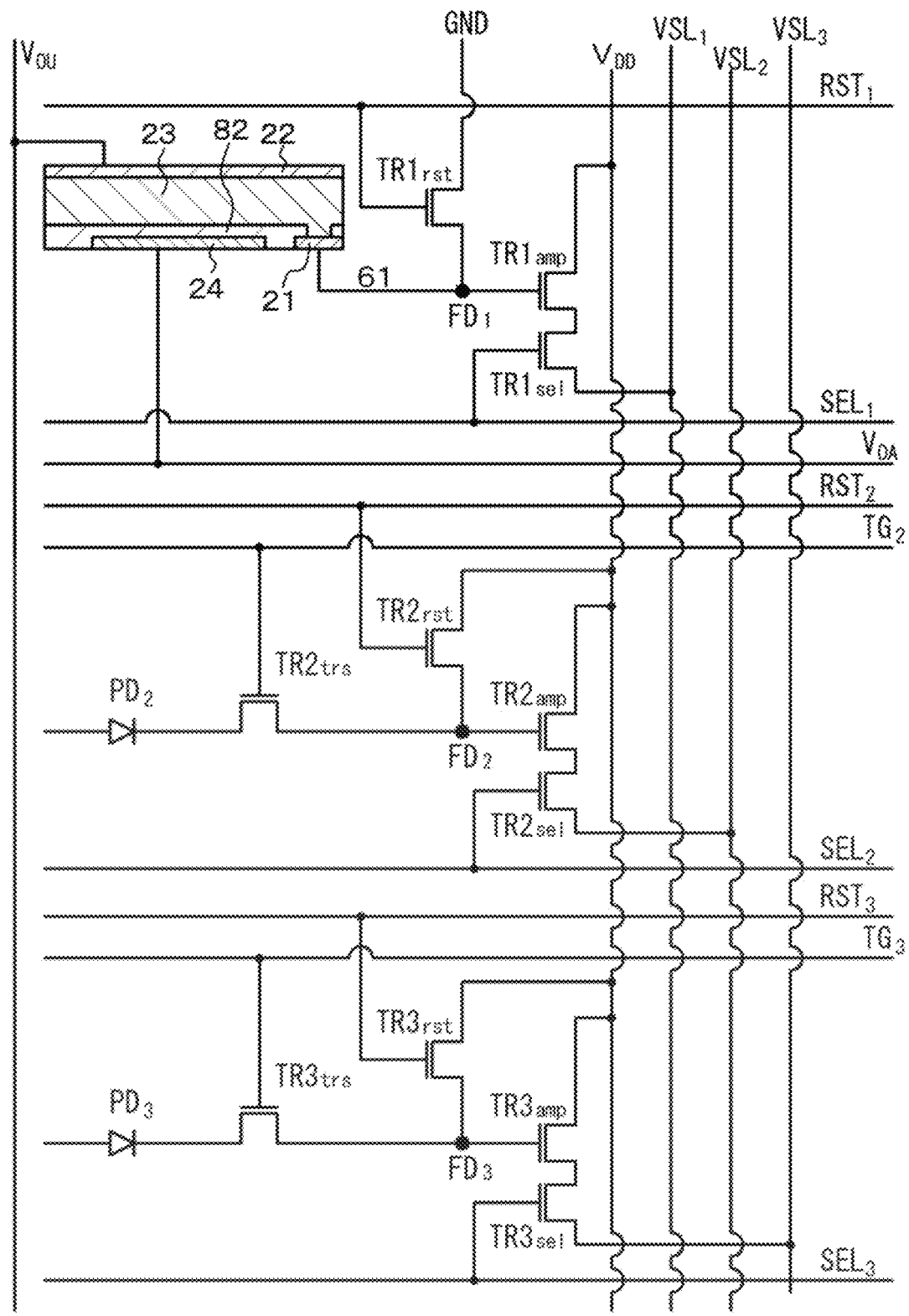
FIG. 17 is an equivalent circuit diagram of a modification of the imaging element and the stacked type imaging element of the embodiment 1.
Figure 18:
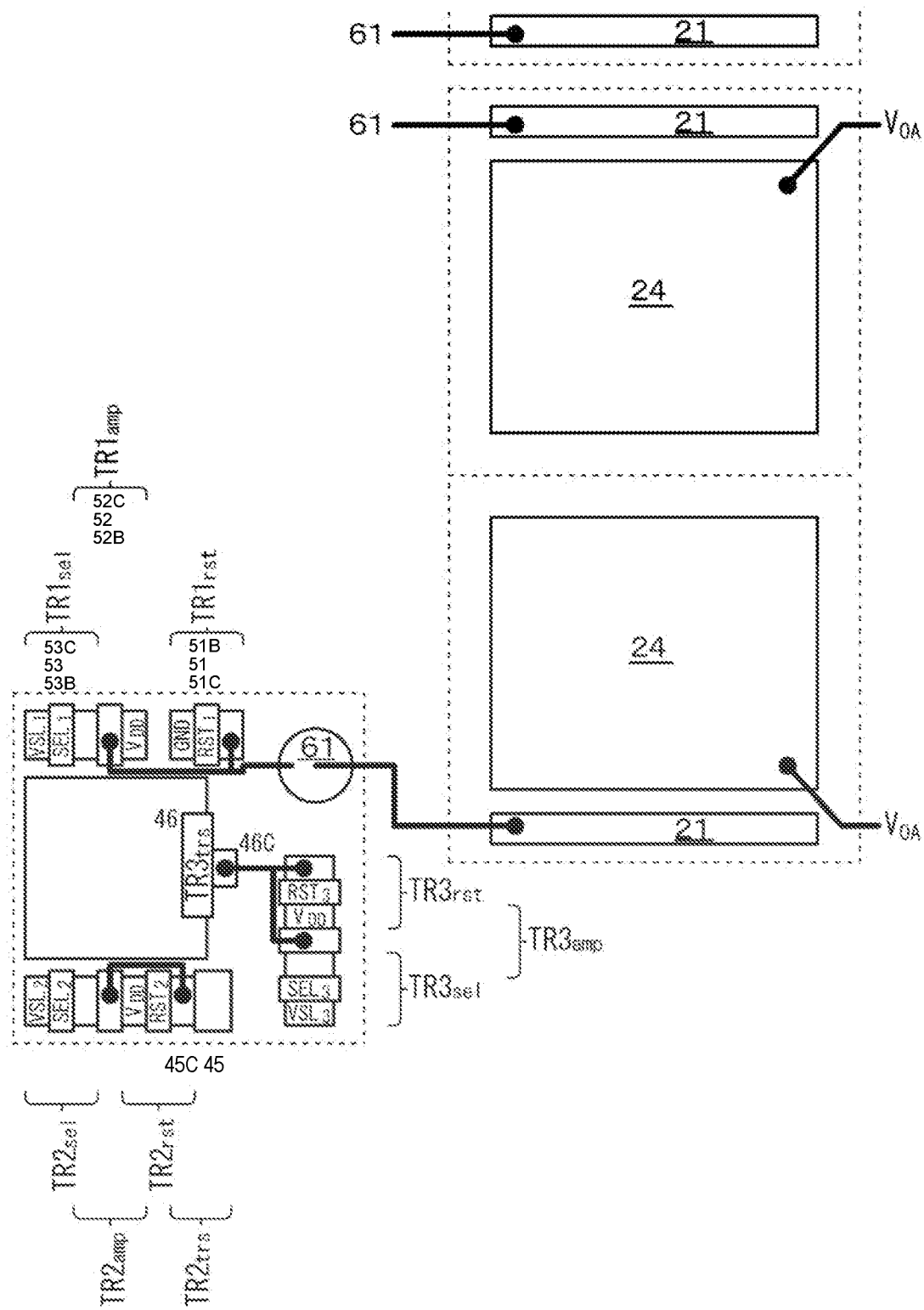
FIG. 18 is a schematic arrangement diagram of the first electrode and the charge accumulating electrode and transistors configuring the control portion that configure another modification of the imaging element of the embodiment 1 depicted in FIG. 17.

As indicated by FIG. 17 that depicts an equivalent circuit diagram of a modification (modification 1 of the embodiment 1) of the imaging element and the stacked type imaging element of the embodiment 1 and FIG. 18 that depicts a schematic arrangement diagram of the first electrodes and the charge accumulating electrodes and transistors that configure the control portion, the other source/drain region of the reset transistor $TR1_{rst}$ may be grounded in place of being connected to the power supply $V_{DD}$.

The imaging element and the stacked type imaging element of the embodiment 1 can be produced, for example, by the following method. In other words, a SOI substrate is prepared first. Then, a first silicon layer is formed on the surface of the SOI substrate by an epitaxial growth method, and the p+ layer 73 and the n-type semiconductor region 41 are formed on the first silicon layer. Then, a second silicon layer is formed on the first silicon layer by an epitaxial grow method, and the element isolation region 71, the oxide film 72, the p+ layer 42, the n-type semiconductor region 43, and the p+ layer 44 are formed on the second silicon layer. Further, various transistors and so forth that configure the control portions for the imaging elements are formed on the second silicon layer, and the wiring layer 62, the interlayer insulating film 76, and various wirings are formed on them, whereafter the interlayer insulating film 76 and a support substrate (not depicted) are pasted together. Thereafter, the SOI substrate is removed to expose the first silicon layer. It is to be noted that the surface of the second silicon layer corresponds to the front face 70A of the semiconductor substrate 70, and the surface of the first silicon layer corresponds to the rear face 70B of the semiconductor substrate 70. Further, the first silicon layer and the second silicon layer are collectively represented as semiconductor substrate 70. Then, on the rear face 70B side of the semiconductor substrate 70, an opening for forming each contact hole portion 61 is formed, and the $HfO_2$ film 74, the insulating film 75, and the contact hole portion 61 are formed. Further, the wiring portion 64, the pad portion 66, the interlayer insulating layer 81, the connection hole 65, the connecting portion 67, the first electrode 21, the charge accumulating electrode 24, and the insulating layer 82 are formed. Then, the connecting portion 68 is opened, and the photoelectric conversion portion 23, the second electrode 22, the protective layer 83, and the on-chip microlens 90 are formed. By the foregoing, the solid-state image sensor of the embodiment 1 can be obtained.

Alternatively, although a schematic partial sectional view of a modification of the imaging elements 11 of the embodiment 1 (two imaging elements placed side by side are illustrated) is depicted in FIG. 10B, the photoelectric conversion portion 23 can be structured in a stacked structure of a lower layer semiconductor layer $23_{DN}$ and an upper layer photoelectric conversion layer $23_{UP}$. The upper layer photoelectric conversion layer $23_{UP}$ is made common to the plurality of imaging elements 11. In other words, in the plurality of imaging elements 11, the upper layer photoelectric conversion layer $23_{UP}$ in the form of one layer is formed. On the other hand, the lower layer semiconductor layer $23_{DN}$ is provided in each of the imaging elements 11. By providing the lower layer semiconductor layer $23_{DN}$ in this manner, for example, charge recombination upon charge accumulation can be prevented. Further, the charge transfer efficiency of charge accumulated in the photoelectric conversion portion 23 to the first electrode 21 can be increased. Further, charge generated in the photoelectric conversion portion 23 can be retained temporarily, and the timing and so forth of transfer of the charge can be controlled. Further, generation of dark current can be suppressed. As regards the material for configuring the upper layer photoelectric conversion layer $23_{UP}$, it is sufficient if it is suitably selected from various materials that configure the photoelectric conversion portion 23. On the other hand, as the material for configuring the lower layer semiconductor layer $23_{DN}$, it is preferable to use a material that is high in band gap energy (for example, a value of the band gap energy equal to or higher than 3.0 eV) and besides is higher in mobility than the material configuring the upper layer photoelectric conversion layer $23_{UP}$, and particularly, for example, an oxide semiconductor material such as IGZO can be listed. As an alternative, as a material for configuring the lower layer semiconductor layer $23_{DN}$, in the case where charge to be accumulated is electrons, a material having a higher ionization potential than that of the material configuring the upper layer photoelectric conversion layer $23_{UP}$ can be listed. Alternatively, the impurity concentration of a material configuring the lower semiconductor layer preferably is equal to or lower than $1 \times 10^{18}$ $cm^{-3}$. It is to be noted that the configuration and the structure of the modification 2 of the embodiment 1 can be applied to the other embodiments.

In the imaging element block of the solid-state image sensor of the embodiment 1, since the plurality of first electrodes is connected to the connection portion provided in the interlayer insulating layer, the arrangement state of the first electrode, the charge accumulating electrode, and the photoelectric conversion portion that configure the imaging element can be made a same arrangement state with respect to incident light among the imaging elements of the imaging element block. As a result, no difference occurs in the state of movement, to the first electrodes, of charge generated in the imaging elements relying upon the angle of light incident to the imaging elements.

Besides, in the imaging elements of the embodiment 1 or an embodiment 2 to an embodiment 9 hereinafter described, a charge accumulating electrode is provided which is arranged in a spaced relation from the first electrode and besides is arranged in an opposed relation to the photoelectric conversion portion with an insulating layer interposed therebetween. Therefore, when light is irradiated upon the photoelectric conversion portion and is photoelectrically converted by the photoelectric conversion portion, a kind of capacitor is formed by the photoelectric conversion portion, the insulating layer, and the charge accumulating electrode, and charge can be accumulated into the photoelectric conversion portion. Therefore, it is possible upon starting of exposure to completely deplete the charge accumulating portion and erase charge. As a result, occurrence of such a phenomenon can be suppressed that kTC noise increases and random noise gets worse, resulting in degradation of the imaged picture quality. Besides, since all pixels can be reset all at once, what is generally called a global shutter function can be implemented.

Embodiment 2

Figure 1B:
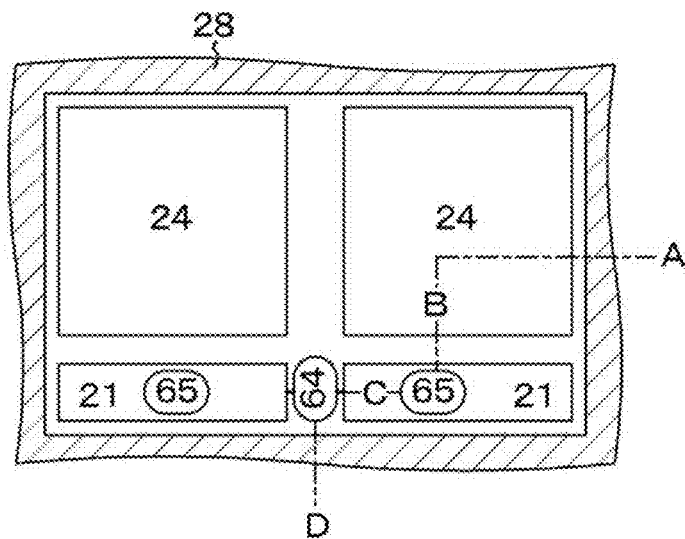
Figure 2A:
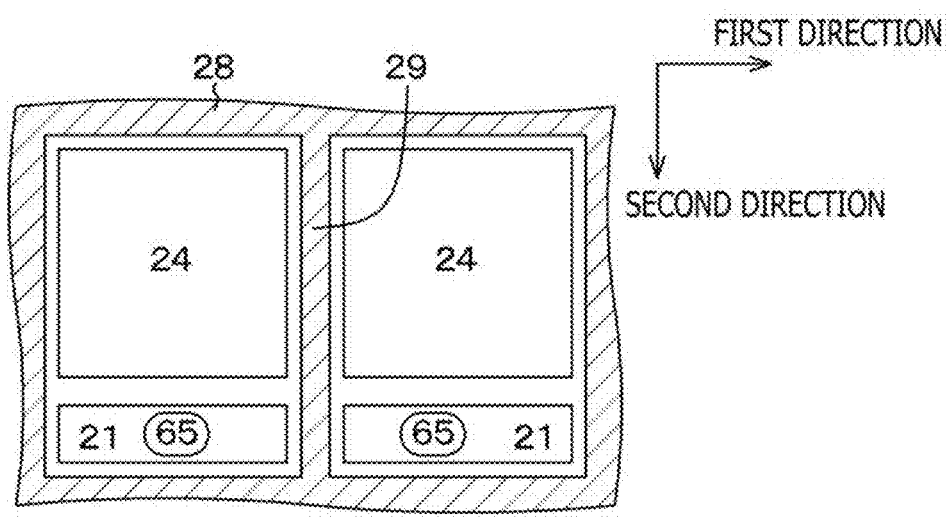
FIGS. 2A and 2B are views schematically depicting an arrangement state of a charge accumulating electrode, a first electrode, an isolation electrode, and so forth in a modification of the solid-state image sensor of the embodiment 2.
Figure 2B:
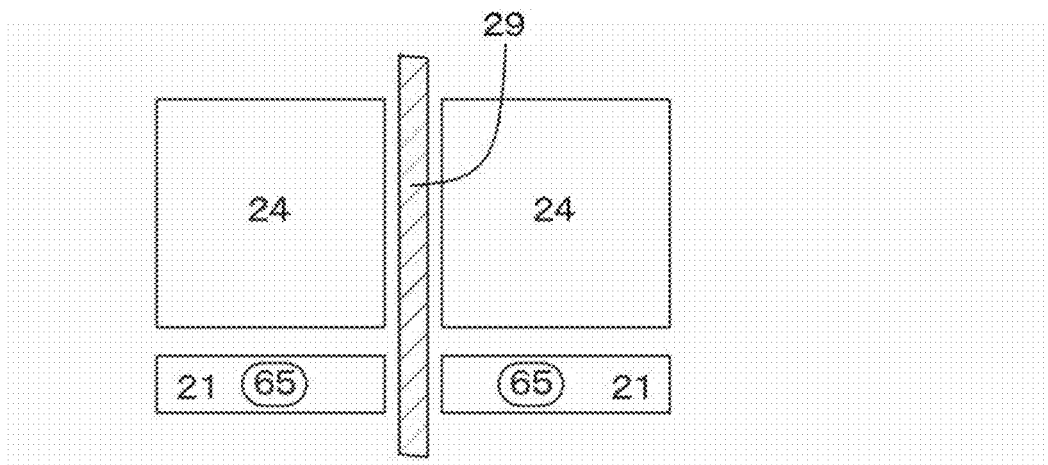

The embodiment 2 is a modification of the embodiment 1. An arrangement state of a charge accumulating electrode, a first electrode, and an isolation electrode (first isolation electrode) is schematically depicted in FIG. 1B, and a schematic partial sectional view is depicted in FIG. 19A. It is to be noted that FIG. 19A is a schematic partial sectional view taken along a dashed line A-B-C-D depicted in FIG. 1B. In the solid-state image sensor of the embodiment 2, the imaging element block 10 is surrounded by a continuous isolation electrode (first isolation electrode 28). Further, as depicted in FIG. 2A that depicts an arrangement state of the charge accumulating electrode 24, the first electrode 21, the first isolation electrode 28, and a second isolation electrode 29, the solid-state image sensor of the embodiment 2 can be configured such that the continuous second isolation electrode 29 extending along the second direction from the first isolation electrode 28 is provided between two imaging elements 11 along the first direction. The first isolation electrode 28 and the second isolation electrode 29 are connected to each other. By providing the second isolation electrode 29, charge generated by photoelectric conversion in the imaging element 11 can be suppressed with certainty from flowing into an adjacent imaging element in the imaging element block 10. Alternatively, as depicted in FIG. 2B that schematically depicts an arrangement state of the charge accumulating electrode 24, first electrode 21, and second isolation electrode 29, the solid-state image sensor of the embodiment 2 can be configured such that the second isolation electrode 29 extending along the second direction is provided between two imaging elements 11 along the first direction. It is to be noted that, in this case, the first isolation electrode 28 is not provided. In the following description, the first isolation electrode 28 and the second isolation electrode 29 are sometimes collectively referred to as "isolation electrode 27."

In FIGS. 2A, 2B, 4A, 4B, 6A, and 6B, illustration of the wiring portion 64 is omitted.

Here, the first isolation electrode 28 is provided in a region opposed to a region of the photoelectric conversion portion 23 positioned between adjacent imaging elements 11 configuring adjacent imaging element blocks 10 with an insulating layer 82 interposed therebetween. The first isolation electrode 28 is a lower first isolation electrode. Although the first isolation electrode 28 is formed at a level same as that of the first electrode 21 or the charge accumulating electrode 24, it may otherwise be formed at a different level. Meanwhile, the second isolation electrode 29 is provided, in the element block 10, in a region opposed to a region of the photoelectric conversion portion 23 positioned between adjacent imaging elements 11 configuring the imaging element block 10 with the insulating layer 82 interposed therebetween. In other words, the second isolation electrode 29 is also a lower second isolation electrode. Although the second isolation electrode 29 is also formed at a level same as that of the first electrode 21 or the charge accumulating electrode 24, it may otherwise be formed at a different level. More particularly, the isolation electrode 27 is formed in a region opposed to a region 23' of the photoelectric conversion portion 23 with the insulating layer 82 interposed therebetween (portion 82' of the insulating layer). In other words, the isolation electrode 27 is formed under the portion 82' of the insulating layer 82 in a region sandwiched between a charge accumulating electrode 24 and another charge accumulating electrode 24 that individually configure adjacent imaging elements 11. The isolation electrode 27 is provided in a spaced relation from the charge accumulating electrode 24. Alternatively, in other words, the isolation electrode 27 is provided in a spaced relation from the charge accumulating electrode 24 and is arranged in an opposed relation to the region 23' of the photoelectric conversion portion 23 with the insulating layer 82 interposed therebetween. This is also applicable to the embodiment 3 and the embodiment 4 hereinafter described.

Further, the potential of the isolation electrode (first isolation electrode 28) (in a case where the second isolation electrode 29 is provided, the potential of the second isolation electrode 29 also) has a fixed value $V_{ES}$. The isolation electrode 27 is connected to a driving circuit. In particular, the isolation electrode 27 is connected to a vertical driving circuit 112, which configures the driving circuit, through a connecting portion 27A, a pad portion 27B, and a wiring (not depicted) provided in the interlayer insulating layer 81. This can also be applied similarly to the embodiment 3 and the embodiment 4 hereinafter described.

In the first imaging element 11, the first electrode 21 and the charge accumulating electrode 24 are formed in a spaced relation from each other on the interlayer insulating layer 81. Further, the isolation electrode 27 is formed in a spaced relation from the charge accumulating electrode 24 on the interlayer insulating layer 81. The interlayer insulating layer 81, the charge accumulating electrode 24, and the isolation electrode 27 are covered with the insulating layer 82. The photoelectric conversion portion 23 is formed on the insulating layer 82, and the second electrode 22 is formed on the photoelectric conversion portion 23. The protective layer 83 is formed over an overall area including the second electrode 22, and the on-chip microlens 90 is provided on the protective layer 83. The first electrode 21, the charge accumulating electrode 24, the isolation electrode 27, and the second electrode 22 are configured, for example, from a transparent electrode made of ITO (work function: approximately 4.4 eV). This can also be applied similarly to the embodiment 3 to the embodiment 4 hereinafter described.

In the following, operation of the solid-state image sensor of the embodiment 2 is described.
<Charge Accumulation Period>

In particular, during a charge accumulation period, from the driving circuit, the potential $V_{11}$ is applied to the first electrode 21, the potential $V_{31}$ is applied to the charge accumulating electrode 24, and the potential $V_{ES}$ is applied to the isolation electrode 27. Further, the potential $V_{21}$ is applied to the second electrode 22. Thus, charge (electrons) is accumulated into the photoelectric conversion portion 23. Electrons generated by photoelectric conversion are attracted to the charge accumulating electrode 24 and stay in a region of the photoelectric conversion portion 23 opposed to the charge accumulating electrode 24. In other words, charge is accumulated into the photoelectric conversion portion 23. Since $V_{31}>V_{11}$ is satisfied, electrons generated in the inside of the photoelectric conversion portion 23 do not move toward the first electrode 21. Further, since the potential $V_{31}$ of the charge accumulating electrode 24 is higher than the potential $V_{ES}$ of the isolation electrode 27, electrons generated in the inside of the photoelectric conversion portion 23 do not move toward the isolation electrode 27 either. In other words, electrons generated by photoelectric conversion can be suppressed from flowing into an adjacent imaging element 11. As the time of photoelectric conversion elapses, the potential in the region of the photoelectric conversion portion 23 opposed to the charge accumulating electrode 24 has an increasing negative side value. At a later stage of the charge accumulation period, a reset operation is performed. Consequently, the potential of the first floating diffusion layer $FD_1$ is reset, and the potential ($V_{FD}$) of the first floating diffusion layer $FD_1$ becomes the potential $V_{DD}$ of the power supply.

<Charge Transfer Period>

After completion of the reset operation, a charge transfer period is started. During the charge transfer period, from the driving circuit, the potential $V_{12}$ is applied to the first electrode 21, and the potential $V_{32}$ is applied to the charge accumulating electrode 24. Further, the potential $V_{ES}$ is applied to the isolation electrode 27. Electrons staying in the region of the photoelectric conversion portion 23 opposed to the charge accumulating electrode 24 are read out to the first electrode 21 and further to the first floating diffusion layer $FD_1$. In other words, the charge accumulated in the photoelectric conversion portion 23 is read out to the control portion. The potential of the isolation electrode 27 is lower than the potential of the first electrode 21 and is lower than the potential of the charge accumulating electrode 24. In other words, $V_{ES}<V_{32}<V_{12}$ is satisfied. Accordingly, electrons generated in the inside of the photoelectric conversion portion 23 flows to the first electrode 21 and do not move toward the isolation electrode 27. In other words, electrons generated by photoelectric conversion can be suppressed from flowing to an adjacent imaging element 11.

Such a series of operations as charge accumulation, a reset operation, and charge transfer is completed therewith.

In the embodiment 2, since the isolation electrode 27 is provided, charge generated by photoelectric conversion can be suppressed with certainty from flowing into an adjacent imaging element 11.

As depicted in FIG. 19B that is a schematic partial sectional view of a modification of the imaging elements 11 of the embodiment 2 (two imaging elements 11 placed side by side are illustrated), the photoelectric conversion portion 23 can be made in a stacked structure of the lower layer semiconductor layer $23_{DN}$ and the upper layer photoelectric conversion layer $23_{UP}$ similarly as in the modification of the solid-state image sensor of the embodiment 1 depicted in FIG. 10B.

Embodiment 3

Figure 3A:
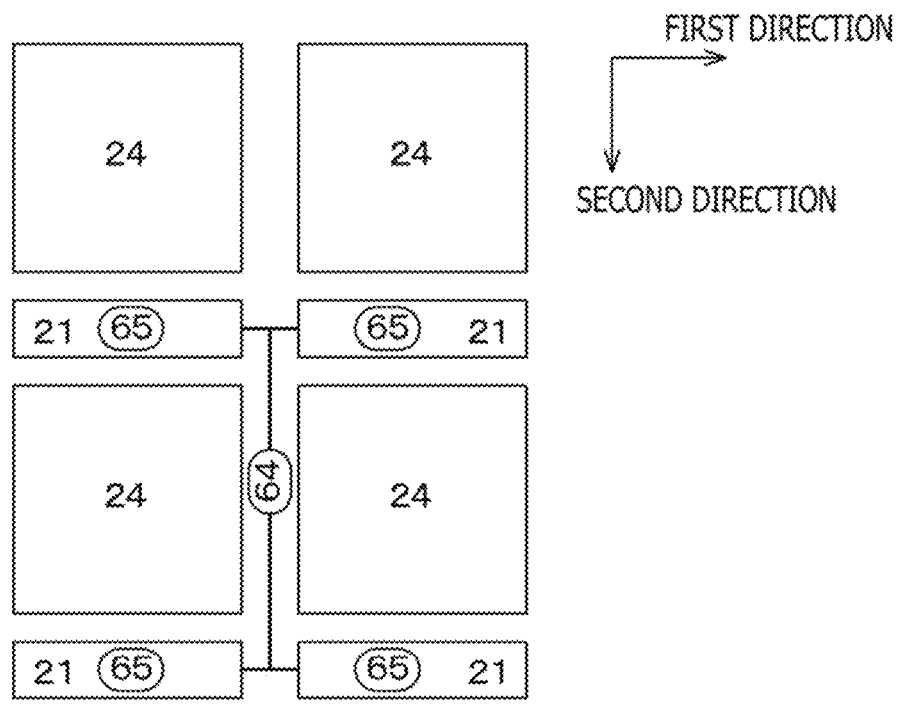
FIGS. 3A and 3B are views schematically depicting an arrangement state of a charge accumulating electrode, a first electrode, and so forth in a solid-state image sensor of an embodiment 3 and a modification of the embodiment 3, respectively.
Figure 3B:
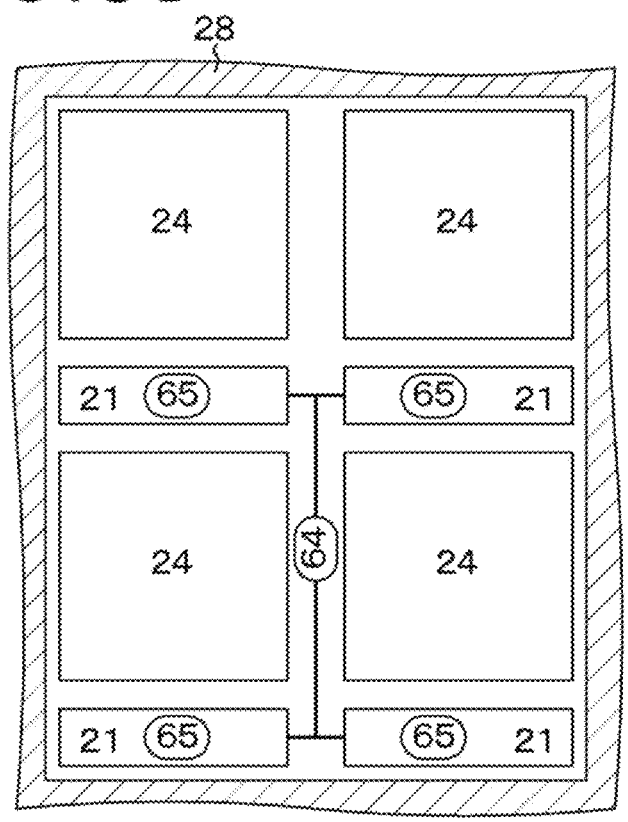
Figure 4A:
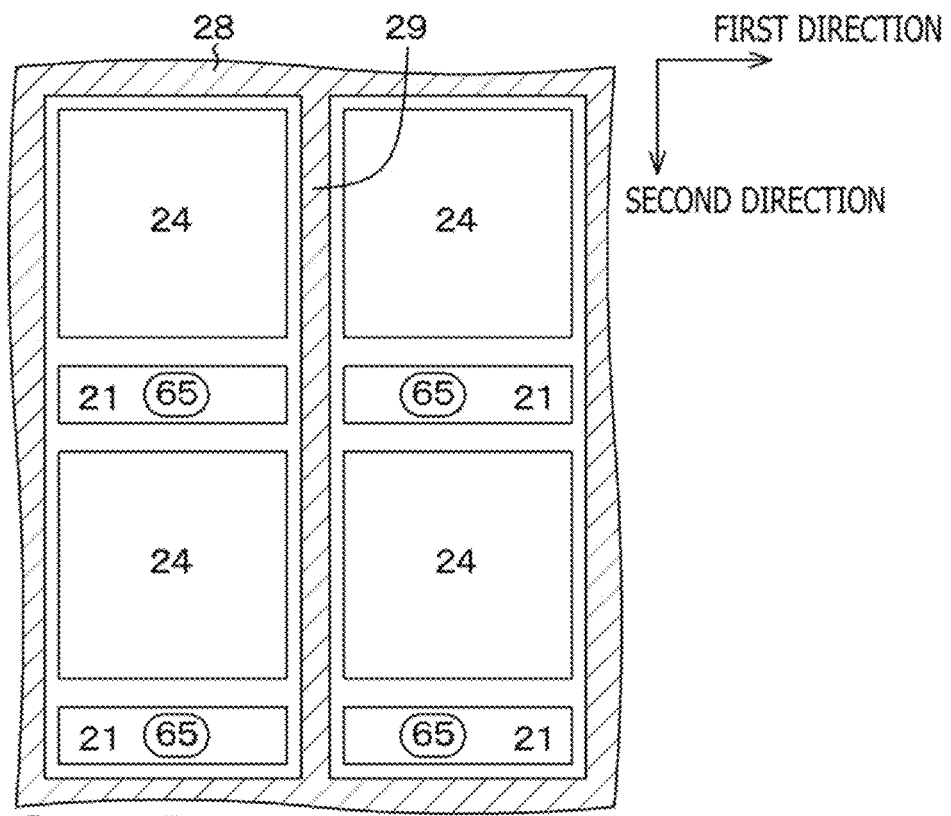
FIGS. 4A and 4B are views schematically depicting an arrangement state of a charge accumulating electrode, a first electrode, an isolation electrode, and so forth in a modification of the solid-state image sensor of the embodiment 3.
Figure 4B:
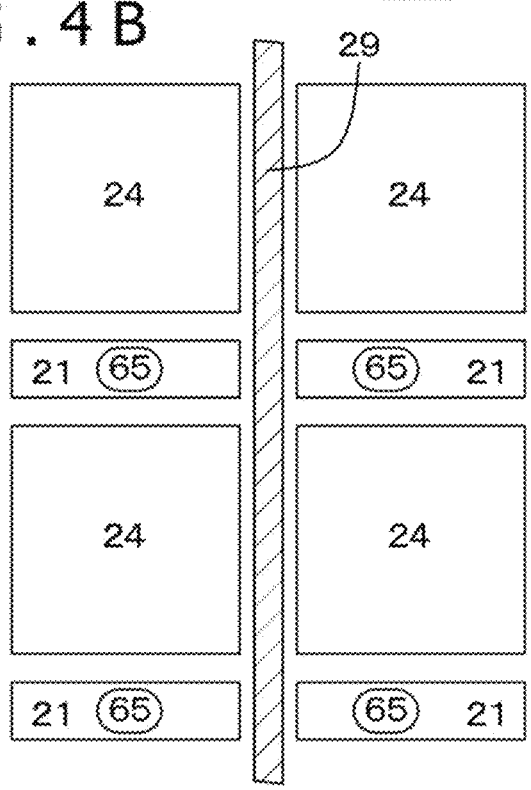

Although the embodiment 3 is a modification of the embodiment 1 and the embodiment 2, it relates to a solid-state image sensor of the second configuration. As depicted in FIG. 3A that schematically depicts an arrangement state of the charge accumulating electrode 24 and the first electrode 21, in the solid-state image sensor of the embodiment 3, P=2 is satisfied and Q is a natural number equal to or greater than 2. Although Q=2 is satisfied in the exampled depicted, this is not restrictive. Further, the first electrode 21 that configures each of the two imaging elements 11 along the first direction is connected to the connection portion 63 provided in the interlayer insulating layer 81. The connection portion 63 is connected to the contact hole portion 61. In the P×Q imaging elements 11, the first electrodes 21 are connected to each other through the connection portion 63. Alternatively, as depicted in FIG. 3B that schematically depicts an arrangement state of the charge accumulating electrode 24, the first electrode 21, and the isolation electrode (first isolation electrode) 28, in the modification of the solid-state image sensor of the embodiment 3, the imaging element block 10 is surrounded by a continuous isolation electrode (first isolation electrode) 28. Further, as depicted in FIG. 4A that schematically depicts an arrangement state of the charge accumulating electrode 24, the first electrode 21, the first isolation electrode 28, and the second isolation electrode 29, the solid-state image sensor can be configured such that the continuous second isolation electrode 29 extending along the second direction from the first isolation electrode 28 is provided between two imaging elements 11 along the first direction. The first isolation electrode 28 and the second isolation electrode 29 are connected to each other. By providing the second isolation electrode 29, inflow of charge generated by photoelectric conversion between adjacent imaging elements 11 in the imaging element block 10 can be suppressed with certainty. Alternatively, as depicted in FIG. 4B that schematically depicts an arrangement state of the charge accumulating electrode 24, the first electrode 21, and the second isolation electrode 29, the solid-state image sensor can be configured such that the second isolation electrode 29 extending along the second direction is provided between two imaging elements 11 along the first direction. It is to be noted that, in this case, the first isolation electrode 28 is not provided.

Since operation of the solid-state image sensor of the embodiment 3 can be made similar to the operation of the solid-state image sensors described hereinabove in connection with the embodiment 1 and the embodiment 2, detailed description of the operation is omitted.

Embodiment 4

Figure 5A:
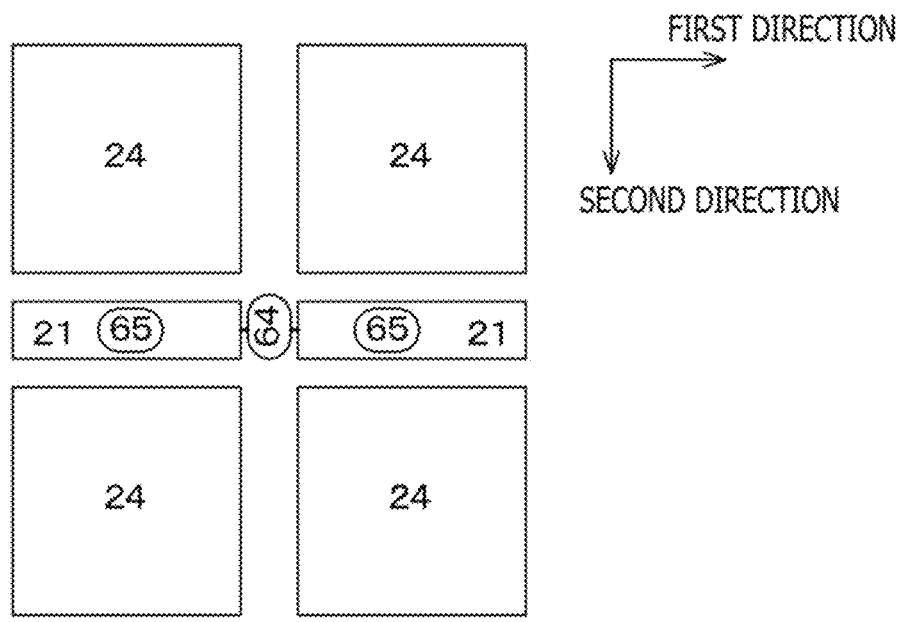
FIGS. 5A and 5B are views schematically depicting an arrangement state of a charge accumulating electrode, a first electrode, and so forth in a solid-state image sensor of an embodiment 4 and a modification of the embodiment 4, respectively.
Figure 7A:
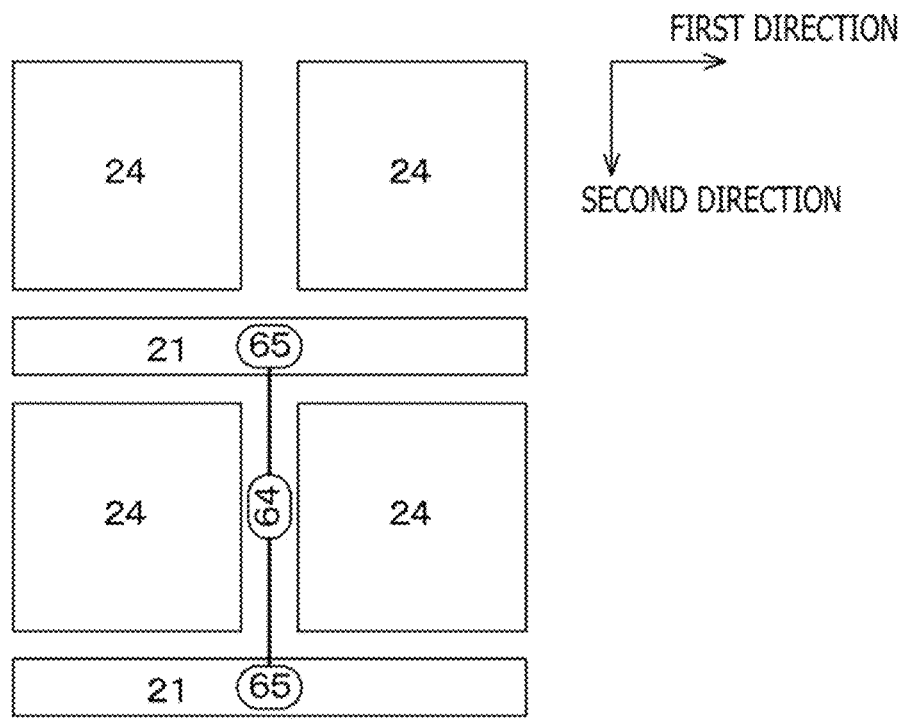
FIGS. 7A and 7B are views schematically depicting an arrangement state of a charge accumulating electrode, a first electrode, and so forth in a modification of the solid-state image sensor of the embodiment 4.

Although the embodiment 4 is also a modification of the embodiment 1 and the embodiment 2, it relates to a solid-state image sensor of the 3Ath configuration and a solid-state image sensor of the 3Bth configuration. As depicted in FIG. 5A that schematically depicts an arrangement state of the charge accumulating electrode 24 and the first electrode 21, P=2 and Q=2 are satisfied, and the first electrode 21 configuring two imaging elements 11 along the second direction is shared, and the shared first electrode 21 is connected to the connection portion 63 provided in the interlayer insulating layer 81. Alternatively, as depicted in FIG. 7A that schematically depicts an arrangement state of the charge accumulating electrode 24 and the first electrode 21, P=2 and Q=2 are satisfied, and the first electrode 21 configuring two imaging elements 11 along the first direction is shared, and the shared first electrode 21 is connected to the connection portion 63 provided in the interlayer insulating layer 81. The connection portion 63 is connected to the contact hole portion 61. In 2×2 imaging elements 11, the first electrodes 21 are connected to each other through the connection portion 63. However, in this solid-state image sensor of the 3Bth configuration, also it is possible to make the value of Q a natural number equal to or greater than 2 (for example, Q=4).

Figure 5B:
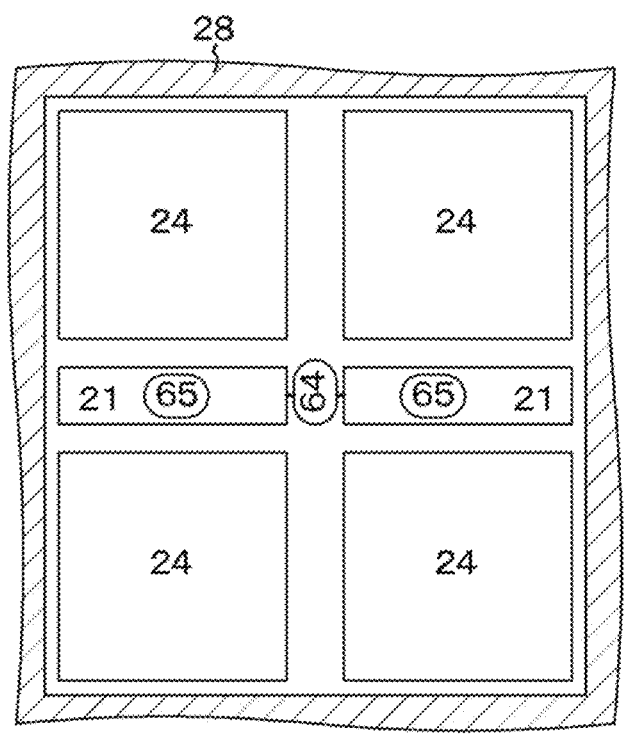
Figure 6A:
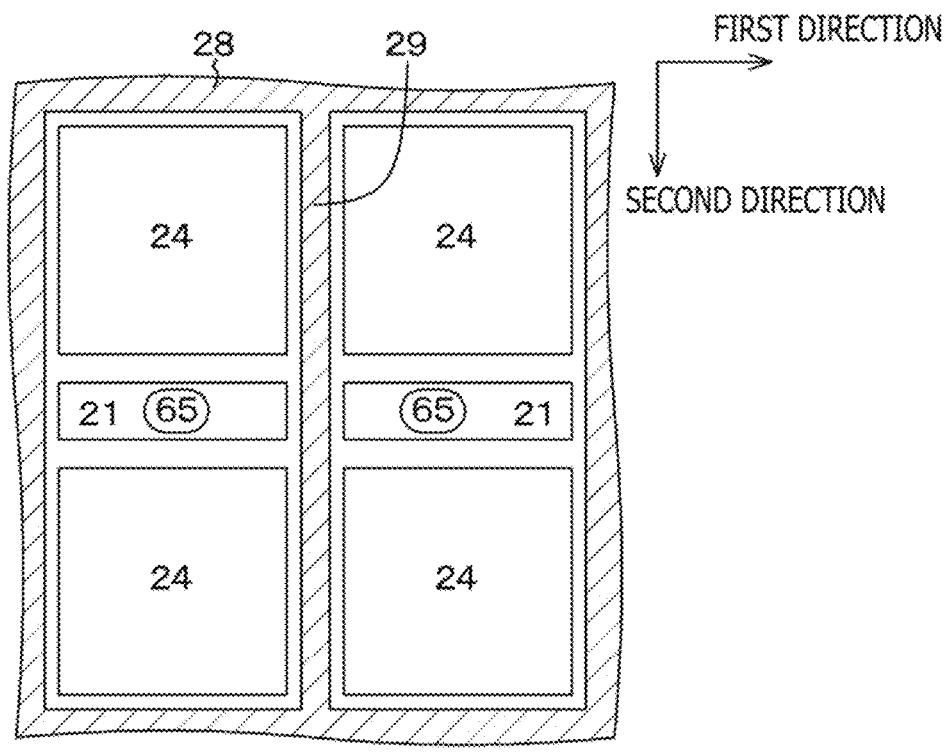
FIGS. 6A and 6B are views schematically depicting an arrangement state of a charge accumulating electrode, a first electrode, an isolation electrode, and so forth in a modification of the solid-state image sensor of the embodiment 4.
Figure 6B:
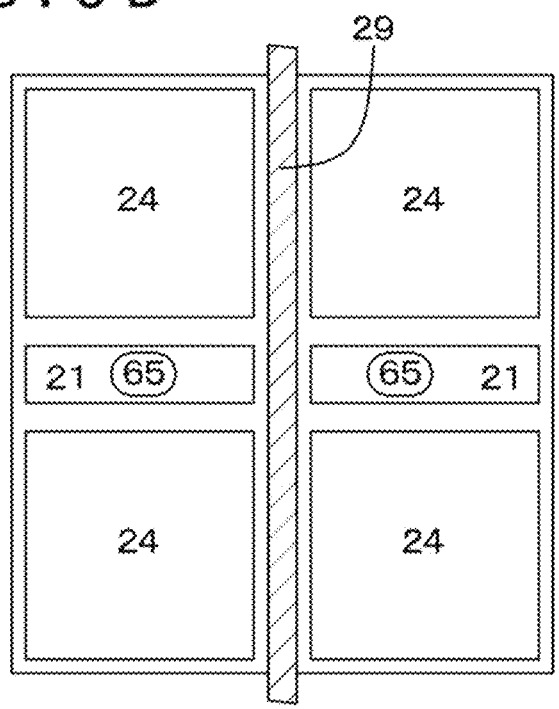
Figure 7B:
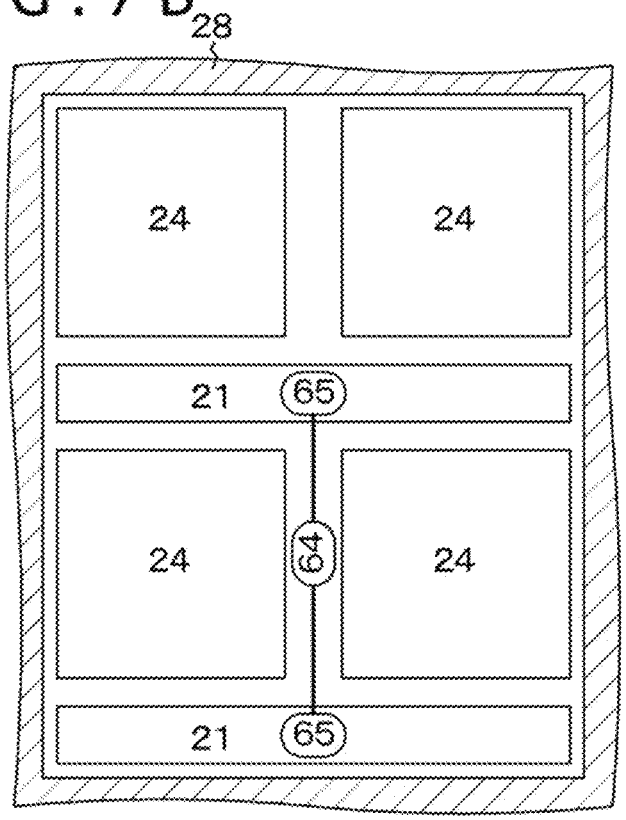

Alternatively, as depicted in FIGS. 5B and 7B that schematically depict arrangement states of the charge accumulating electrode 24, the first electrode 21, and the first isolation electrode (first isolation electrode) 28, in the modification of the solid-state image sensor of the embodiment 4, the imaging element block 10 is surrounded by the continuous isolation electrode (first isolation electrode) 28. Further, as depicted in FIG. 6A that schematically depicts an arrangement state of the charge accumulating electrode 24, the first electrode 21, the first isolation electrode 28, and the second isolation electrode 29, the solid-state image sensor can be configured such that the continuous second isolation electrode 29 extending along the second direction from the first isolation electrode 28 is provided between two imaging elements 11 along the first direction. The first isolation electrode 28 and the second isolation electrode 29 are connected to each other. By providing the second isolation electrode 29, charge generated by photoelectric conversion in an adjacent imaging element 11 in the imaging element block 10 can be suppressed from flowing in with certainty. Alternatively, as depicted in FIG. 6B that schematically depicts an arrangement state of the charge accumulating electrode 24, the first electrode 21, and the second isolation electrode 29, the solid-state image sensor can be configured such that the second isolation electrode 29 extending along the second direction is provided between two imaging elements 11 along the first direction. It is to be noted that, in this case, the first isolation electrode 28 is not provided. The structure of the second isolation electrode 29 depicted in FIGS. 6A and 6B can be applied to the solid-state image sensor depicted in FIG. 7B.

Since operation of the solid-state image sensor of the embodiment 4 can be made similar to the operation of the solid-state image sensors described hereinabove in connection with the embodiment 1 and the embodiment 2, detailed description of the operation is omitted.

Figure 8A:
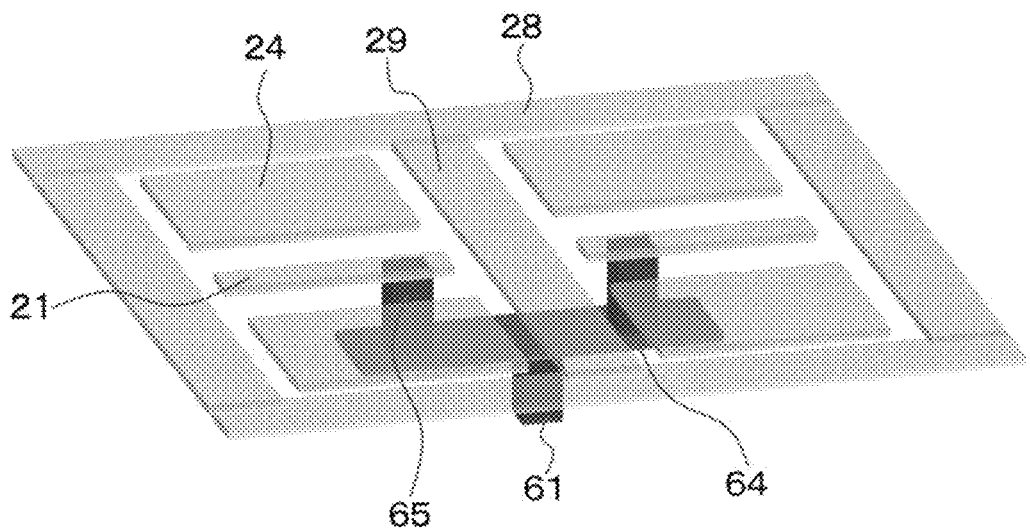
FIGS. 8A and 8B depict a schematic perspective view of the modification of the solid-state image sensor of the embodiment 4 depicted in FIG. 6A and a schematic perspective view of a modification of a conventional solid-state image sensor, respectively.
Figure 8B:
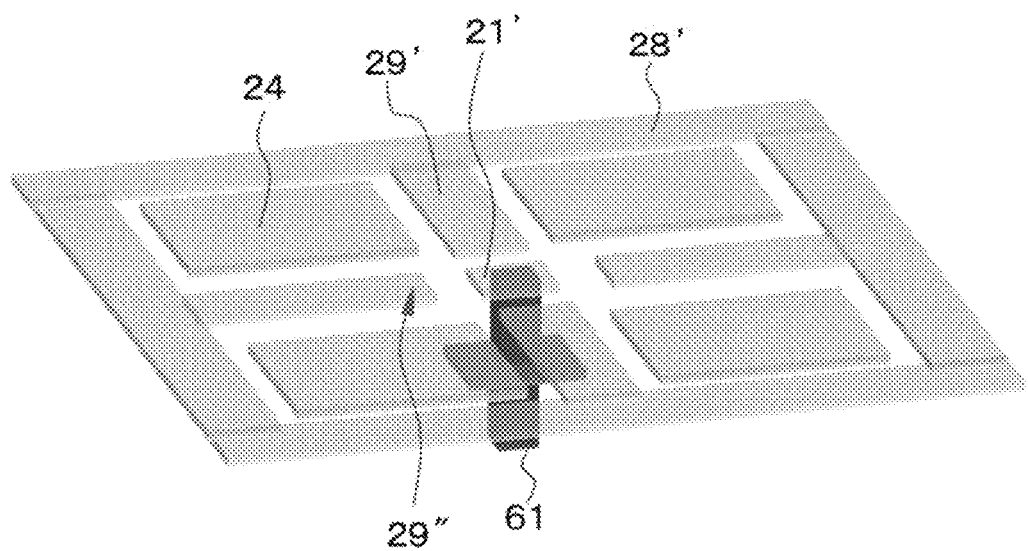

A schematic perspective view of a modification of the solid-state image sensor of the embodiment 4 depicted in FIG. 6A is depicted in FIG. 8A, and a schematic perspective view of a modification of the conventional solid-state image sensor is depicted in FIG. 8B.

As depicted in FIGS. 2A, 2B, 4A, 6B, 6A, and 6B of the embodiment 1, in the solid-state image sensors of the embodiment 1 to the embodiment 4, the second isolation electrode 29 is continuous. In other words, the second isolation electrode 29 has no end portion.

On the other hand, a case is supposed in which, in the conventional solid-state image sensor, one imaging element block is configured from four imaging elements and one first electrode 21' is shared by the four imaging elements, for example. In this case, as depicted in FIG. 8B, it is necessary to provide the first electrode 21' in a region in which corner portions of charge accumulating electrodes 24' individually configuring the four imaging elements gather. Further, in a case where a second isolation electrode 29' corresponding to the second isolation electrode 29 in the present disclosure is provided among four imaging elements, it is necessary to provide the second isolation electrode 29' in a spaced relation from the first electrode 21' such that the second isolation electrode 29' and the first electrode 21' do not contact with each other. In other words, an end portion 29" is inevitably formed on the second isolation electrode 29'. The potential generated by the second isolation electrode 29' having the end portion 29" formed thereon in this manner, the charge accumulating electrode 24, and the first electrode 21' has a complicated potential gradient due to the presence of the end portion 29" of the second isolation electrode 29'. Accordingly, a state in which charge generated in the photoelectric conversion portion 23 by photoelectric conversion and accumulated in the photoelectric conversion portion 23 does not flow, upon charge transfer, appropriately and with certainty from the photoelectric conversion portion 23 to the first electrode 21'. In particular, the presence of the end portion 29" of the second isolation electrode 29' can give rise to a problem that the amount of charge to be accumulated into the photoelectric conversion portion 23 decreases or, upon charge transfer, charge flows into the first electrode 21' of an adjacent imaging element. As a result, there is a possibility that degradation of the reliability of the solid-state image sensor may occur and the resolution may decrease.

However, in the solid-state image sensor of the present disclosure, since the second isolation electrode 29 does not have any end portion, the potentials generated by the second isolation electrode 29, the charge accumulating electrode 24, and the first electrode 21 do not have a complicated potential gradient and can flow charge generated by photoelectric conversion appropriately and with certainty from the photoelectric conversion portion 23 to the first electrode 21. Accordingly, occurrence of degradation of the reliability and degradation of the resolution of the solid-state image sensor can be suppressed.

Figure 43:
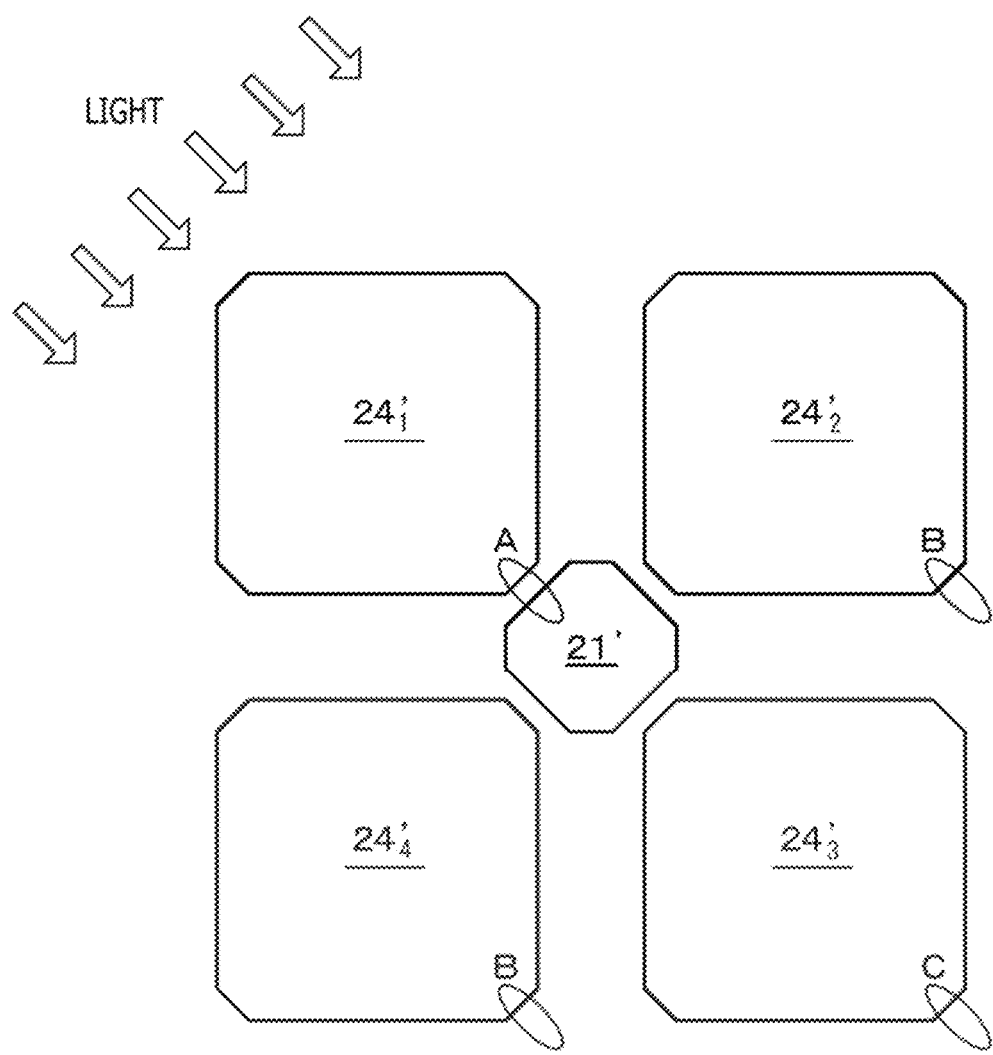
FIG. 43 is a view schematically depicting an arrangement state of a first electrode and so forth of a conventional solid-state image sensor for illustrating a first problem.

Further, when attention is paid to the first electrode 21' and the charge accumulating electrode 24', while an arrangement state of the first electrode and so forth of the conventional solid-state image sensor for illustrating a first problem is schematically depicted in FIG. 43, a case is assumed that light is incident from an obliquely upper left portion of FIG. 43. Here, if regions "A," "B," "C," and "D," of the photoelectric conversion portion, positioned above the charge accumulating electrodes $24'_1$, $24'_2$, $24'_3$, and $24'_4$ are examined, then during a charge accumulation period, part of charge generated in the region "A" flows into the first electrode 21' because the region "A" is adjacent the first electrode 21'. On the other hand, charge generated in the region "B" and the region "C" is less likely to flow into the first electrode 21' because the region "B" and the region "C" are not adjacent the first electrode 21'. As a result of the foregoing, there is a possibility of the signal output of the imaging element that includes the charge accumulating electrode $24'_1$ may become lower than the signal outputs of the imaging elements that include the charge accumulating electrodes $24'_2$, $24'_3$, and $24'_4$. In other words, a state in which signal outputs generated by the imaging elements become non-uniform occurs depending upon the incidence state of light.

On the other hand, for example, in the solid-state image sensor of the embodiment 3 depicted in FIGS. 3A, 3B, 4A, and 4B, even in a case where light is incident from an oblique upper left portion in FIGS. 3A, 3B, 4A, and 4B, since the incident direction of light incident to the first electrode 21 and the charge accumulating electrode 24 is the same in the four imaging elements, a non-uniform state is less likely to occur in signal outputs generated by the four imaging elements depending upon the incidence state of light, and this is apparent also from FIGS. 3A, 3B, 4A, and 4B. In the other embodiments as well, it is similar that a state in which signal outputs generated are non-uniform is less likely to occur in a plurality of imaging elements in which the arrangement of the charge accumulating electrode 24 and the first electrode 21 configuring the imaging element with respect to the incident state of light is the same. As above, since, in one imaging element block, the plurality of first electrodes 21 is connected to the connection portion 63 provided in the interlayer insulating layer 81 and the arrangement state of the first electrode 21, the photoelectric conversion portion 23, and the charge accumulating electrode 24 can be made same as an arrangement state with respect to incident light, the incidence direction of light incident to the first electrode 21 and the charge accumulating electrode 24 can be made same. Thus, a state in which signal outputs generated in imaging elements become non-uniform depending upon the angle of light incident to the imaging elements can be suppressed from occurring as far as possible.

Embodiment 5

Figure 20:
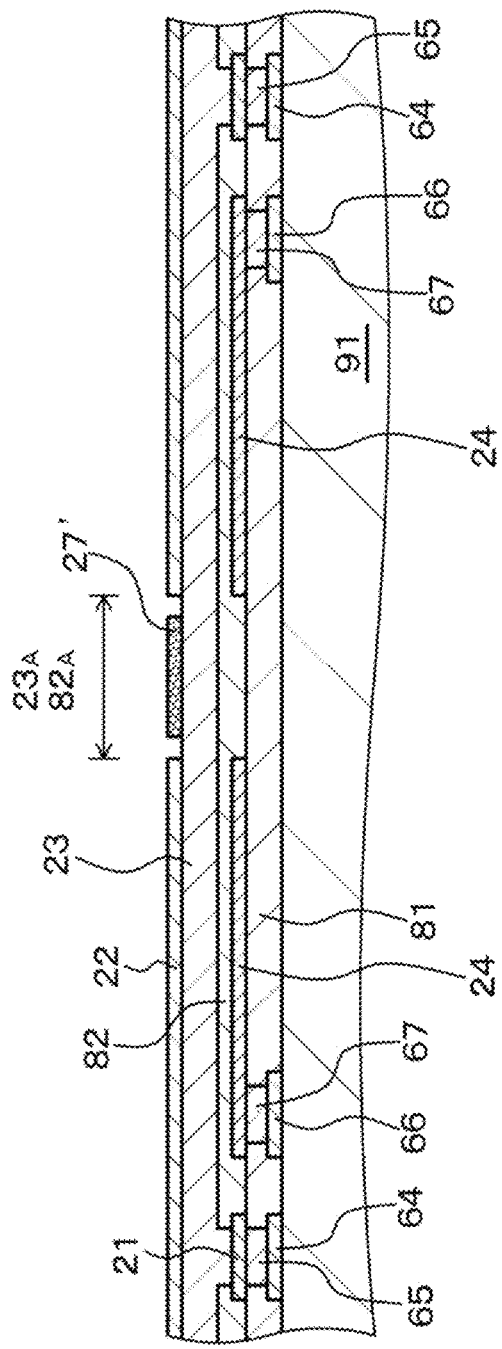
FIG. 20 is a schematic sectional view of part of the imaging elements (two imaging elements arranged side by side) of the embodiment 5.

The embodiment 5 is a modification of the embodiment 1 to the embodiment 4, and an upper isolation electrode 27' (an upper first isolation electrode, an upper first isolation electrode and upper second isolation electrode, or an upper second isolation electrode) is provided in place of the lower isolation electrode. A schematic sectional view of part of the imaging elements (two imaging elements placed side by side) of the embodiment 5 is depicted in FIG. 20. In the imaging element of the embodiment 5, on a region $23_A$ of the photoelectric conversion portion 23 positioned between adjacent imaging elements, the upper isolation electrode 27' is formed in place of the second electrode 22. The upper isolation electrode 27' is provided in a spaced relation from the second electrode 22. In other words, the second electrode 22 is provided for each imaging element, and the upper isolation electrode 27' is provided on the region-A of the photoelectric conversion portion 23 in a spaced relation from the second electrode 22 while surrounding at least part of the second electrode 22. The upper isolation electrode 27' is formed in a level same as that of the second electrode 22.

Further, as depicted in FIG. 21A that depicts a schematic sectional view of part of the imaging elements (two imaging elements placed side by side) of the embodiment 5, the second electrode 22 may be divided into a plurality of pieces such that potentials different from each other are individually applied to the divided second electrodes 22. Furthermore, as depicted in FIG. 21B, the upper isolation electrode 27' may be provided between divided second electrodes 22.

The second electrode 22 and the upper isolation electrode 27' can be obtained by forming a material layer for configuring the second electrode 22 and the upper isolation electrode 27' on the photoelectric conversion portion 23 and then patterning the material layer. The second electrode 22 and the upper isolation electrode 27' are individually connected to different wirings (not depicted), and the wirings are connected to a driving circuit. The wiring connected to the second electrode 22 is made common to a plurality of imaging elements. The wiring connected to the upper isolation electrode 27' is also made common to a plurality of imaging elements.

In the imaging element of the embodiment 5, during a charge accumulation period, from the driving circuit, the potential $V_{21}$ is applied to the second electrode 22 and the potential $V_{ES}$ is applied to the upper isolation electrode 27', and charge is accumulated into the photoelectric conversion portion 23. During a charge transfer period, from the driving circuit, the potential $V_{22}$ is applied to the second electrode 22 and the potential $V_{ES}$ is applied to the upper isolation electrode 27', and charge accumulated in the photoelectric conversion portion 23 is read out to the control section through the first electrode 21. Here, since the potential of the first electrode 21 is set higher than the potential of the second electrode 22, $V_{21} \geq V_{ES}$ and $V_{22} \geq V_{ES}$ are satisfied.

As described above, in the imaging element of the embodiment 5, since, on the region of the photoelectric conversion portion positioned between adjacent imaging elements, the upper isolation electrode is formed in place of the second electrode, charge generated by photoelectric conversion can be suppressed from flowing into an adjacent imaging element by the upper isolation electrode. Therefore, quality degradation does not occur with a captured video (image).

A schematic sectional view of part of a modification of the imaging elements (two imaging elements placed side by side) of the embodiment 5 is depicted in FIG. 22A. In this modification, the second electrode 22 is provided for each imaging element, and the upper isolation electrode 27' is provided in a spaced relation from the second electrode 22 while surrounding at least part of the second electrode 22. Below the upper isolation electrode 27', part of the charge accumulating electrode 24 exists. The second electrode 22 is provided with a size smaller than the charge accumulating electrode 24 above the charge accumulating electrode 24. Further, in the example depicted in FIG. 22B, the lower isolation electrode 27 is provided additionally below the upper isolation electrode 27'. The size of the second electrode 22 is smaller than that of the modification depicted in FIG. 22A. In other words, the region of the second electrode 22 opposed to the upper isolation electrode 27' is positioned on the first electrode 21 side with respect to the region of the second electrode 22 opposed to the upper isolation electrode 27' in the modification depicted in FIG. 22A. The charge accumulating electrode 24 is surrounded by the lower isolation electrode 27.

Embodiment 6

Figure 23:
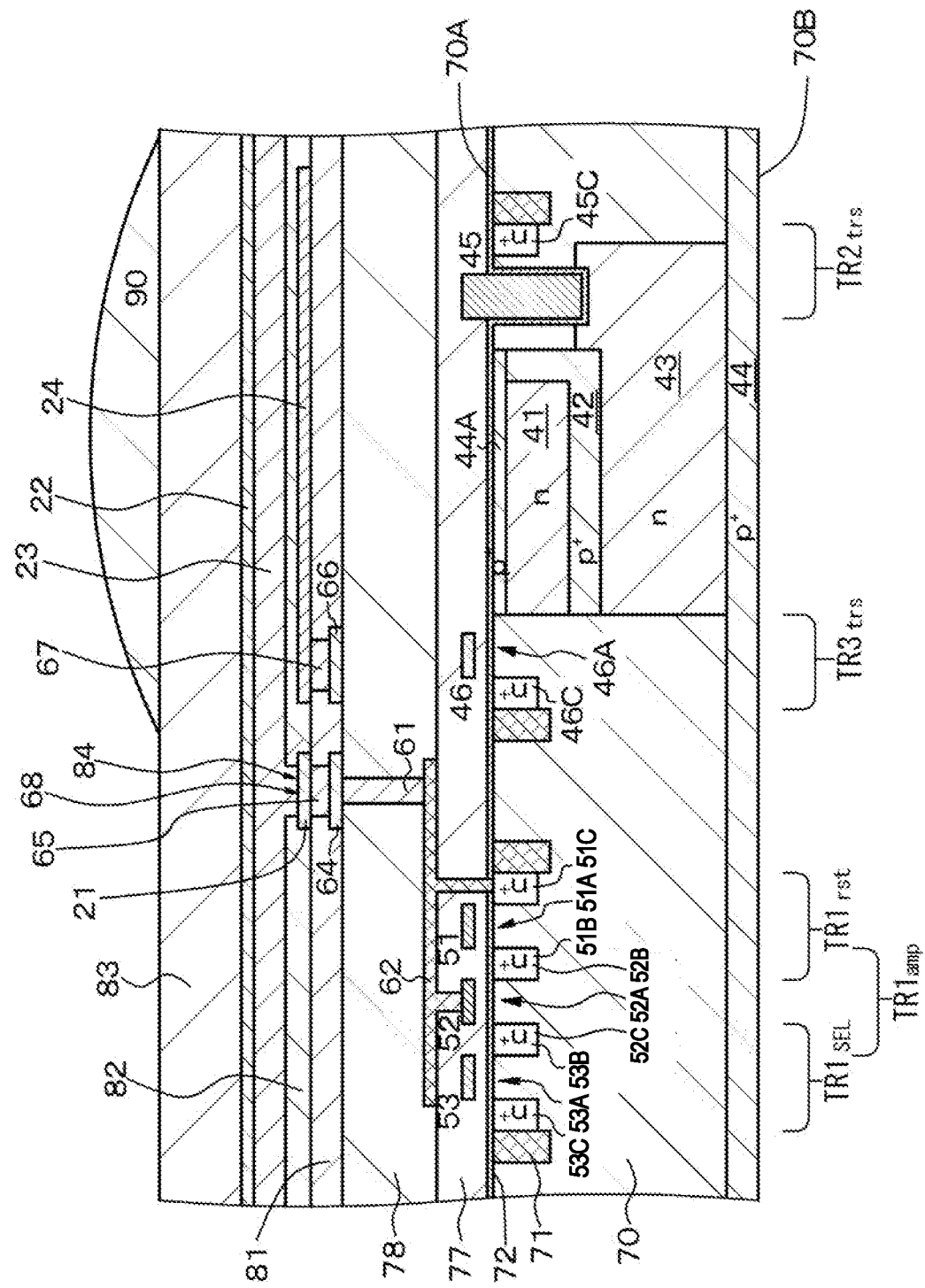
FIG. 23 is a schematic partial sectional view of a solid-state image sensor of an embodiment 6.

The embodiment 6 is a modification of the embodiment 1 to the embodiment 5. The solid-state image sensor of the embodiment 6 whose schematic partial sectional view is depicted in FIG. 23 is a solid-state image sensor of the front-illuminated type. In particular, the solid-state image sensor is structured such that the green light imaging element of the embodiment 1 of the first type (first imaging element) that includes a green light photoelectric conversion portion of the first type that absorbs green light and has the sensitivity to green light, a conventional blue light imaging element of the second type (second imaging element) that includes a blue light photoelectric conversion portion of the second type that absorbs blue light and has the sensitivity to blue light, and a conventional red light imaging element of the second type (third imaging element) that includes a red light photoelectric conversion portion of the second type that absorbs red light and has the sensitivity to red light are stacked. Here, the red light imaging element (third imaging element) and the blue light imaging element (second imaging element) are provided in the semiconductor substrate 70 such that the second imaging element is positioned on the light incidence side with respect to the third imaging element. Further, the green light imaging element (first imaging element) is provided above the blue light imaging element (second imaging element).

On the front face 70A side of the semiconductor substrate 70, various transistors configuring a control portion are provided similarly as in the embodiment 1. The transistors can be configured and structured substantially similarly to the transistors described hereinabove in connection with the embodiment 1. Further, although, on the semiconductor substrate 70, the second imaging element and the third imaging element are provided, those imaging elements can also be configured and structured substantially similarly to the second imaging element and the third imaging element described hereinabove in connection with the embodiment 1.

Above the front face 70A of the semiconductor substrate 70, the interlayer insulating layer 81 is formed, and in the interlayer insulating layer 81, the first electrode 21, the photoelectric conversion portion 23, and the second electrode 22 as well as, as occasion demands, isolation electrodes 27 and 27', are provided similarly to in the imaging element of the solid-state image sensor of the embodiment 1 to the embodiment 5.

In this manner, since, except that the solid-state image sensor is of the front-illuminated type, the configuration and the structure of the solid-state image sensor of the embodiment 6 can be made similar to the configuration and the structure of the solid-state image sensors of the embodiment 1 to the embodiment 5, detailed description of them is omitted.

Embodiment 7

The embodiment 7 is a modification of the embodiment 1 to the embodiment 6.

Figure 24:
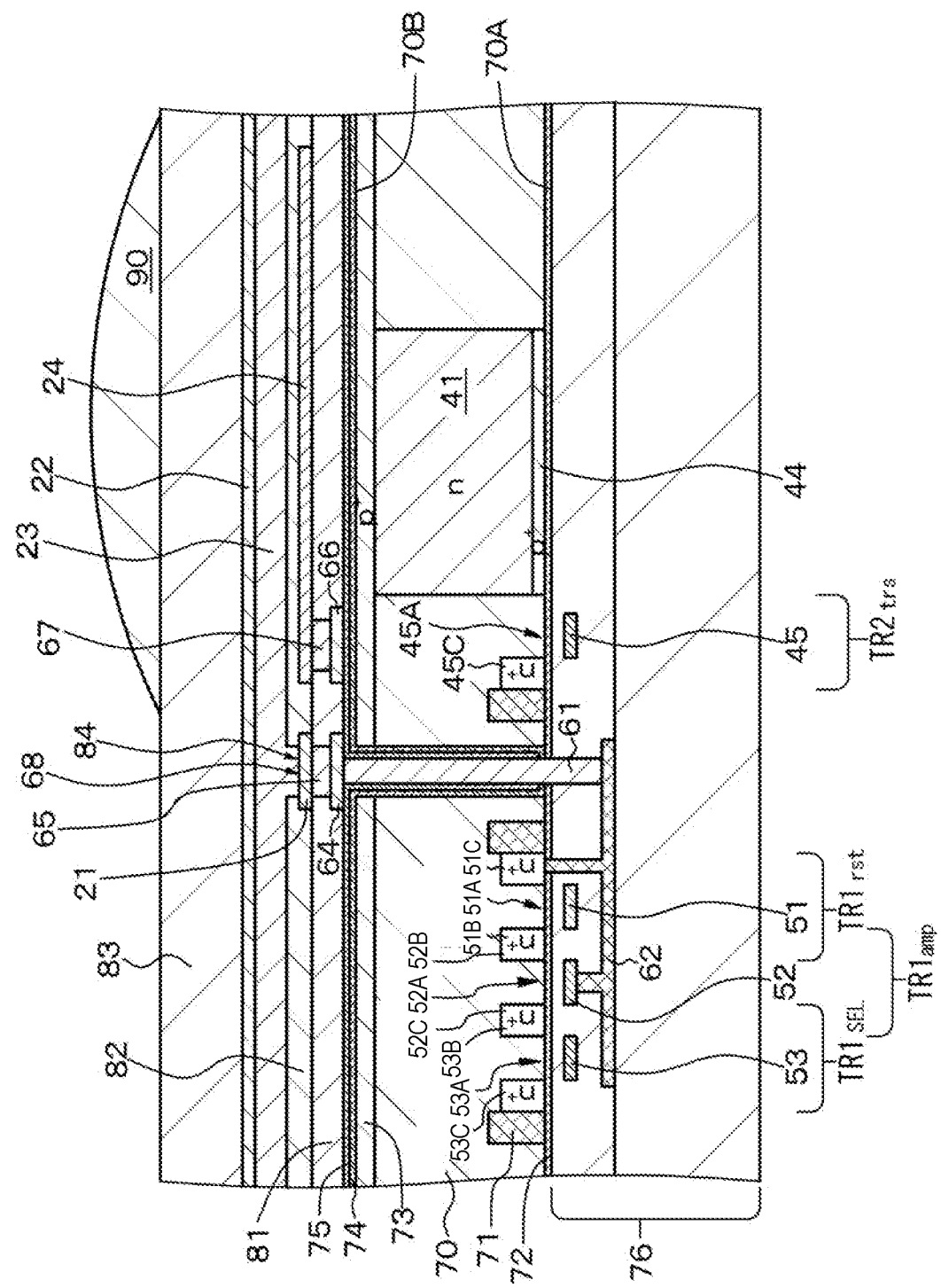
FIG. 24 is a schematic partial sectional view of a solid-state image sensor of an embodiment 7.
Figure 25:
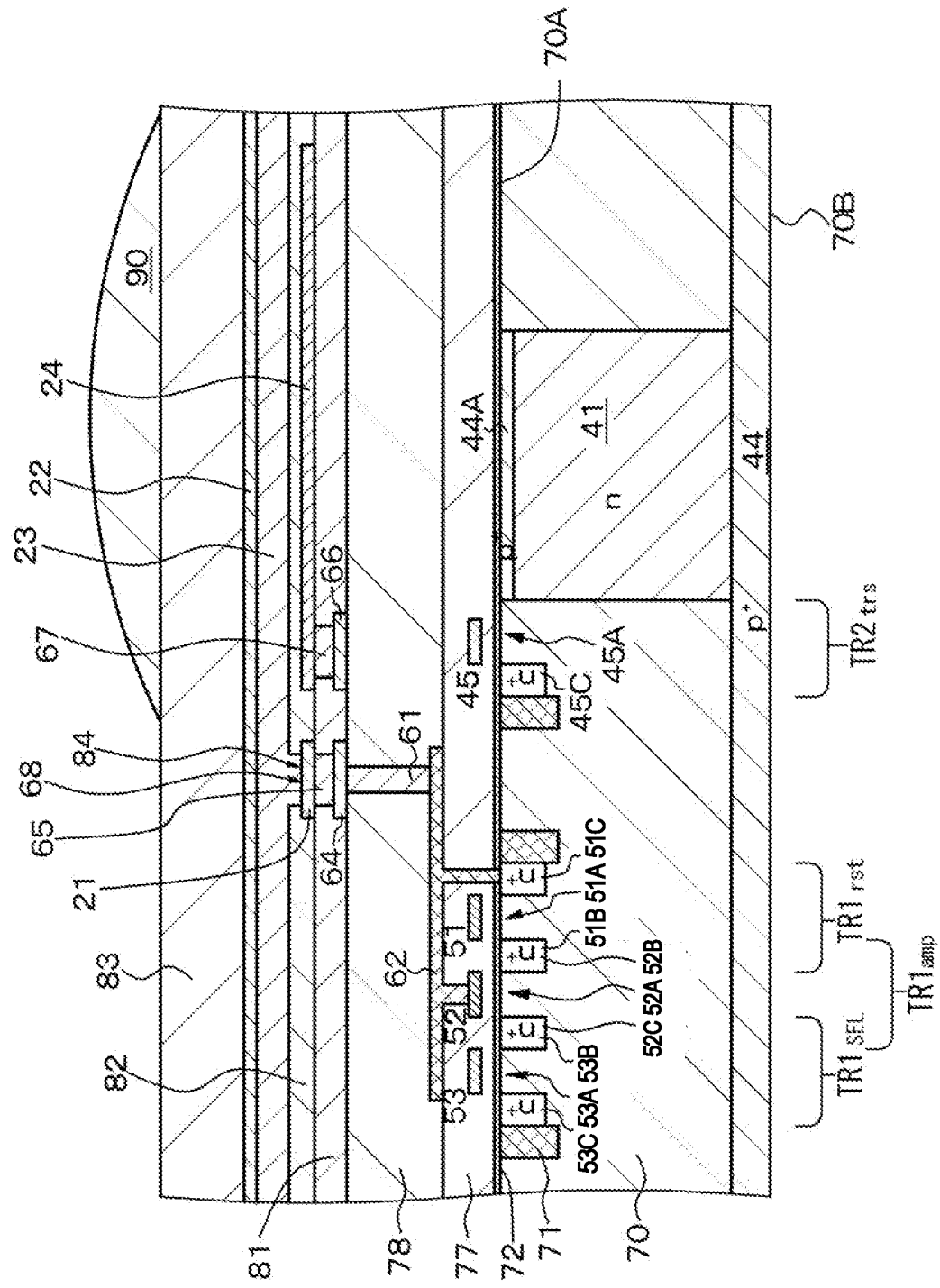
FIG. 25 is a schematic partial sectional view of a modification of the solid-state image sensor of the embodiment 7.

The solid-state image sensor of the embodiment 7 whose schematic partial sectional view is depicted in FIG. 24 is a solid-state image sensor of the back-illuminated type and is structured such that two imaging elements, which are the first imaging element of the embodiment 1 of the first type and the second imaging element of the second type, are stacked. Further, a modification of the solid-state image sensor of the embodiment 7 whose schematic partial sectional view is depicted in FIG. 25 is a solid-state image sensor of the front-illuminated type and is structured such that two imaging elements, which are the first imaging element of the embodiment 1 of the first type and the second imaging element of the second type are stacked. Here, the first imaging element absorbs light of a primary color, and the second imaging element absorbs light of a complementary color. Alternatively, the first imaging element absorbs white light, and the second imaging element absorbs infrared light.

Figure 26:
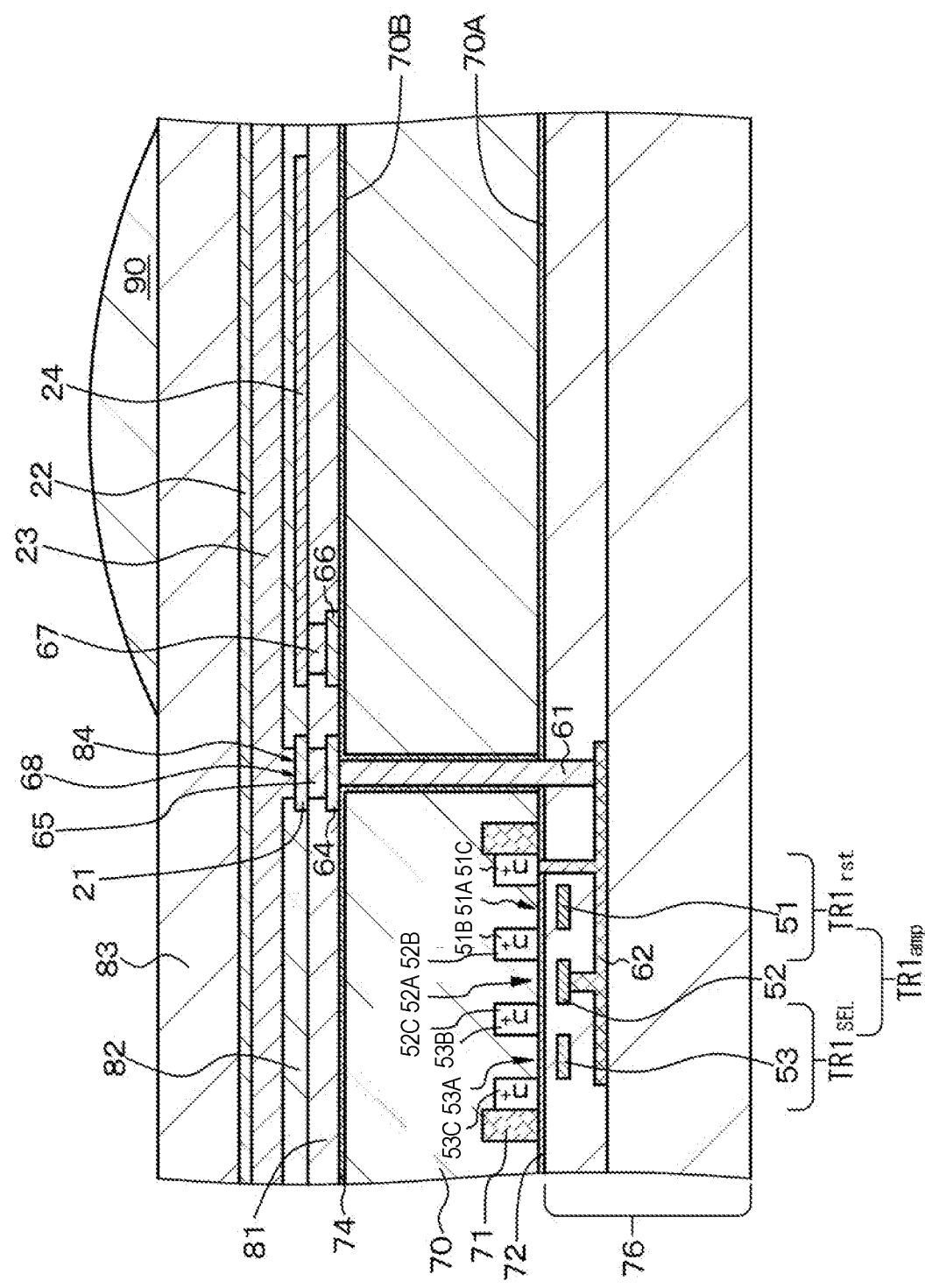
FIG. 26 is a schematic partial sectional view of another modification of the imaging element of the embodiment 7.
Figure 27:
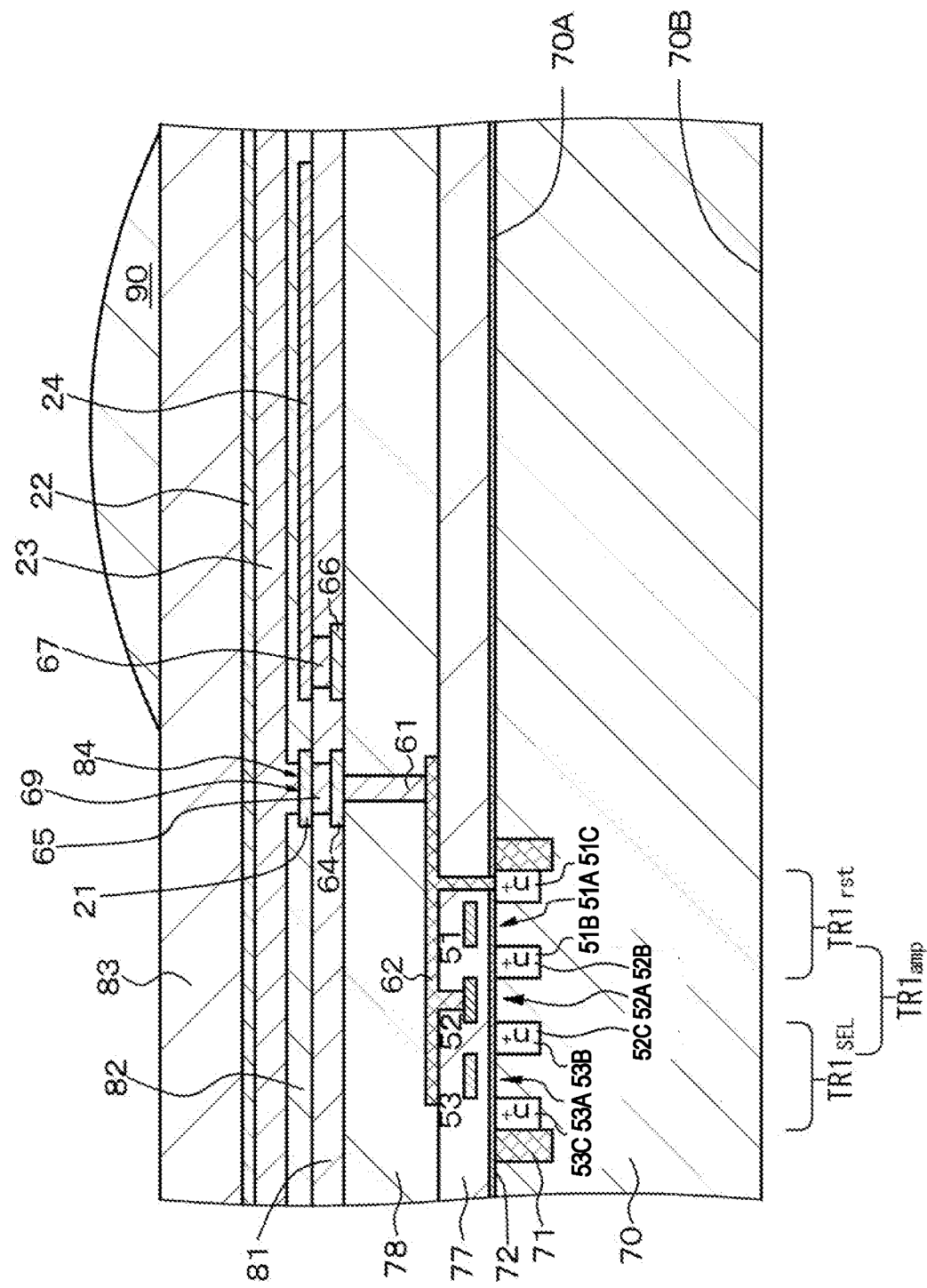
FIG. 27 is a schematic partial sectional view of still another modification of the imaging element of the embodiment 7.

A modification of the imaging element of the embodiment 7 whose schematic partial sectional view is depicted in FIG. 26 is a solid-state image sensor of the back-illuminated type and is configured from the first imaging element of the embodiment 1 of the first type. Meanwhile, a modification of the solid-state image sensor of the embodiment 7 whose schematic partial sectional view is depicted in FIG. 27 is a solid-state image sensor of the front-illuminated type and is configured from a first imaging element of the embodiment 1 of the first type. Here, the first imaging element is configured from three different imaging elements including an imaging element that absorbs red light, another imaging element that absorbs green light, and a still another imaging element that absorbs blue light. As arrangement of a plurality of such imaging elements, a Bayer array can be listed. On the light incidence side of each imaging element, color filters for spectral separation into blue, green, and red are arranged as occasion demands.

Since, except the foregoing, the configuration and the structure of the solid-state image sensor of the embodiment 7 can be made similar to the configuration and the structure of the solid-state image sensors of the embodiment 1 to the embodiment 5, detailed description of them is omitted. It is to be noted that the interlayer insulating layer 81 is formed above the front face 70A of the semiconductor substrate 70, and the first electrode 21, the photoelectric conversion portion 23, and the second electrode 22 as well as, as occasion demands, the isolation electrodes 27 and 27' are provided in the interlayer insulating layer 81 similarly to the imaging element of the solid-state image sensors of the embodiment 1 to the embodiment 5.

It is also possible to use a form in which, in place of providing one imaging element of the embodiment 1 of the first type, two such imaging elements are stacked (that is, a form in which two photoelectric conversion portions are stacked and a control portion of the two photoelectric conversion portions are provided on a semiconductor substrate) or use another form in which three such imaging elements are stacked (that is, a form in which three photoelectric conversion portions are stacked and a control portion of the three photoelectric conversion portions are provided on a semiconductor substrate). Examples of the stacked structure of an imaging element of the first type and an imaging element of the second type are exemplified in the following table.

|  | First type | Second type |
|---|---|---|
| Back-illuminated type and front-illuminated type | 1 | 2 |
| | Green | Blue + red |
| | 1 | 1 |
| | Primary color | Complementary color |
| | 1 | 1 |
| | White | Infrared rays |
| | 1 | 0 |
| | Blue, green, or red | |
| | 2 | 2 |
| | Green + infrared light | Blue + red |
| | 2 | 1 |
| | Green + blue | Red |
| | 2 | 0 |
| | White + infrared light | |
| | 3 | 2 |
| | Green + blue + red | Blue-green (emerald color) + infrared light |
| | 3 | 1 |
| | Green + blue + red | Infrared light |
| | 3 | 0 |
| | Blue + green + red | |

Embodiment 8

Figure 15B:
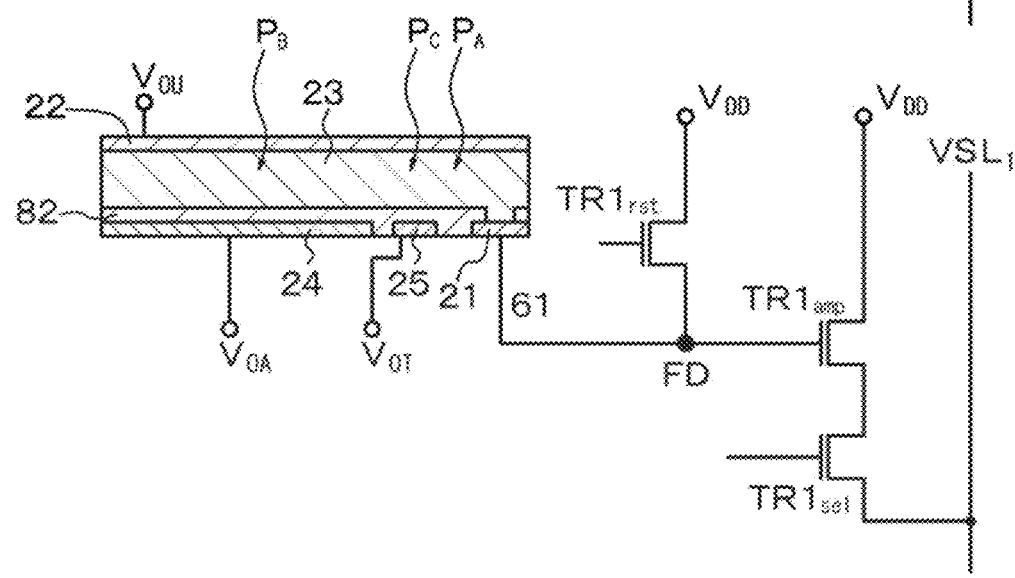
Figure 28:
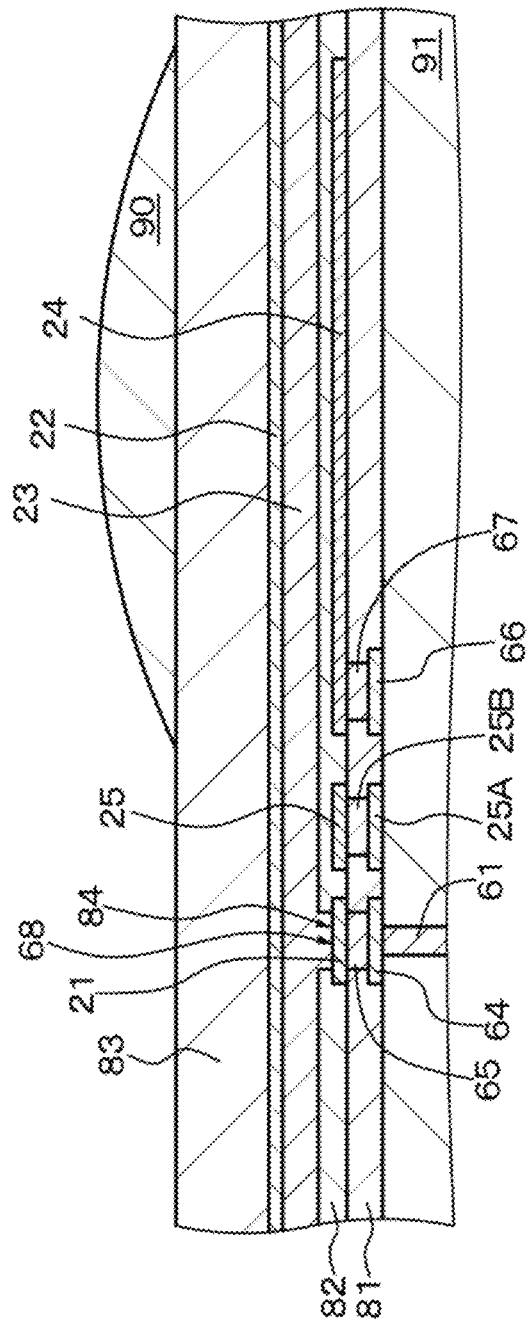
FIG. 28 is a schematic partial sectional view of part of a solid-state image sensor of an embodiment 8.
Figure 29:
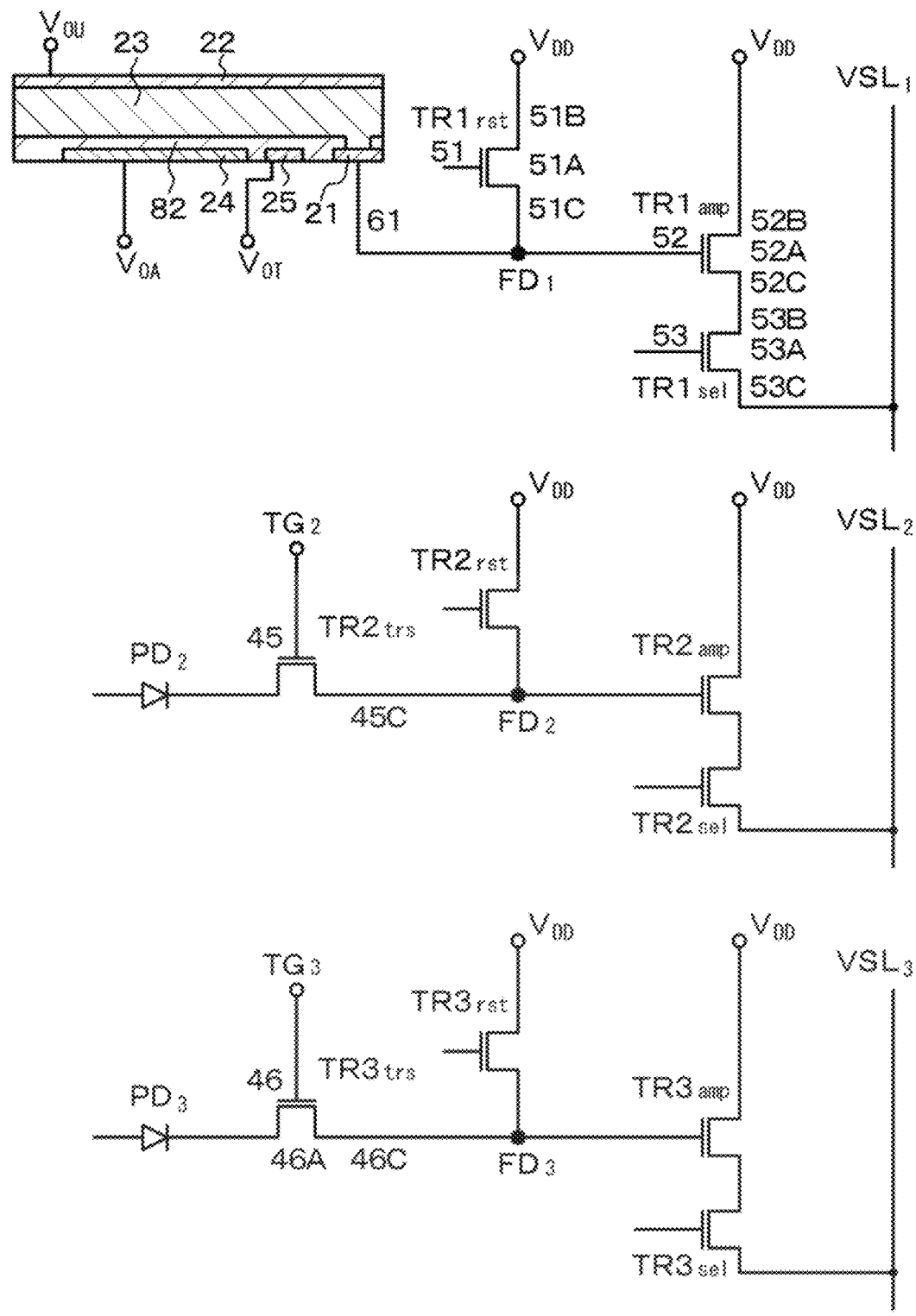
FIG. 29 is an equivalent circuit diagram of the solid-state image sensor of the embodiment 8.
Figure 30:
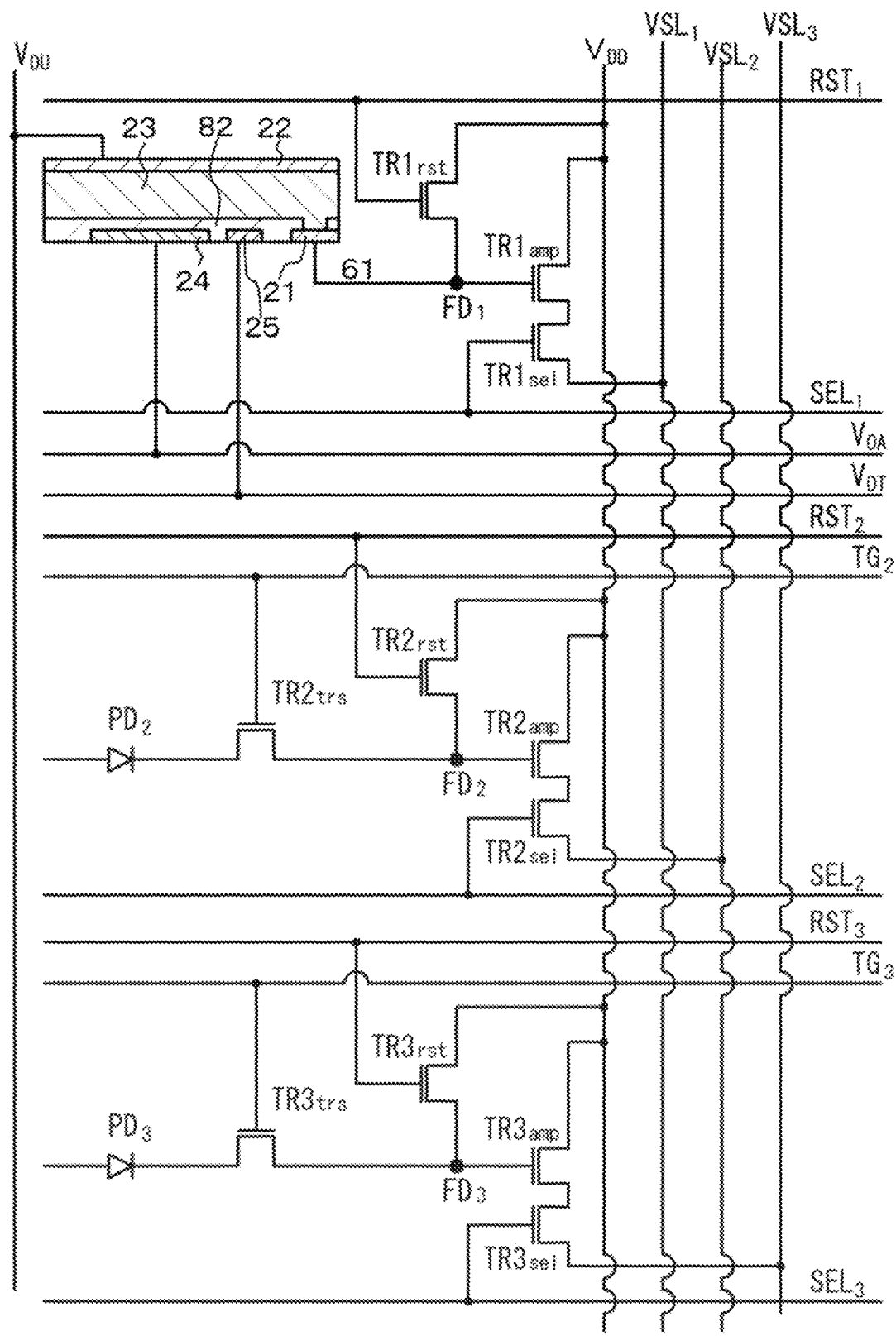
FIG. 30 is an equivalent circuit diagram of the solid-state image sensor of the embodiment 8.
Figure 31:
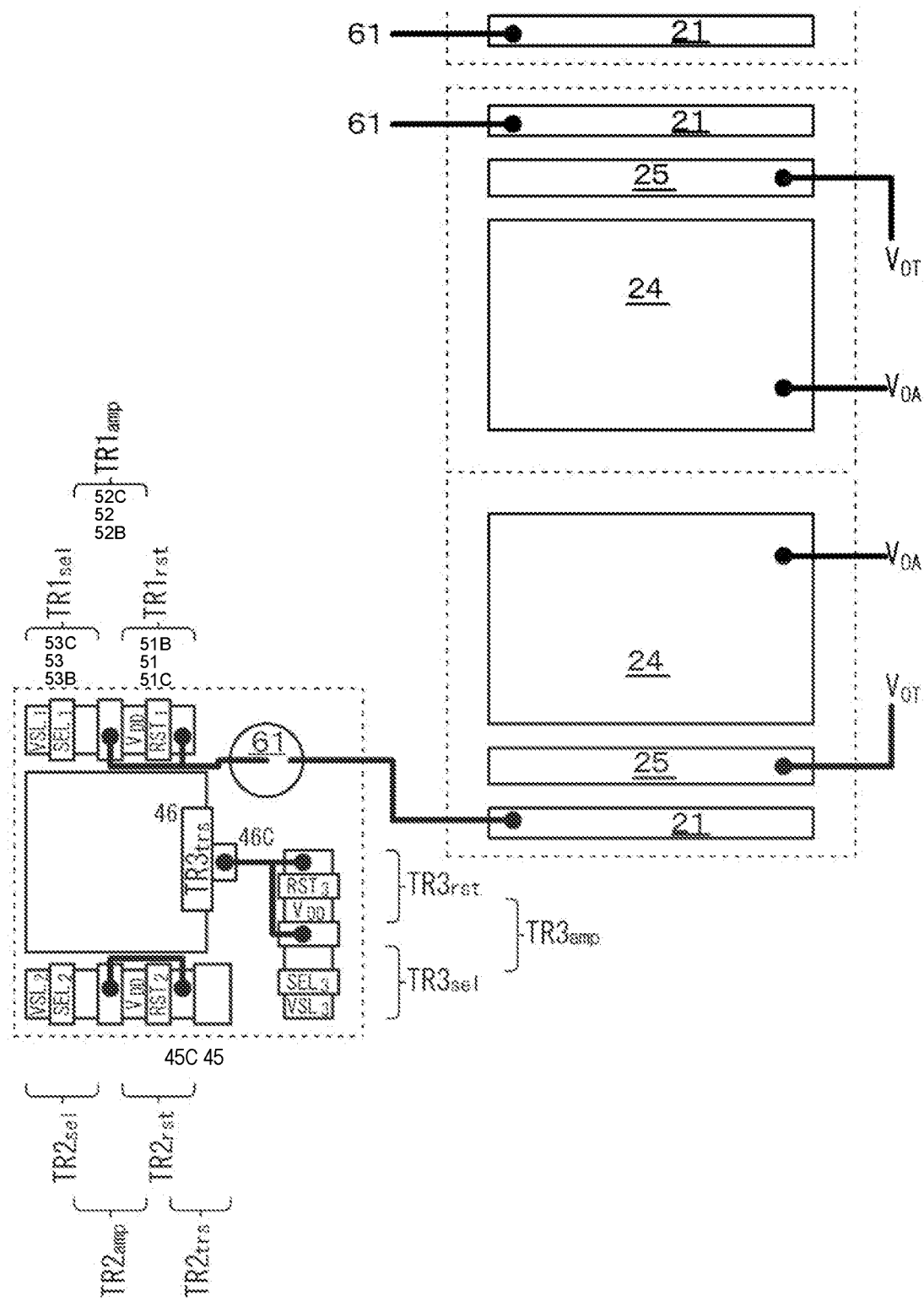
FIG. 31 is a schematic arrangement diagram of a first electrode, a transfer controlling electrode, and a charge accumulating electrode and transistors configuring a control portion that configure the imaging element of the embodiment 8.

The embodiment 8 is a modification of the embodiment 1 to the embodiment 7 and relates to a solid-state image sensor that includes a transfer controlling electrode (charge transfer electrode) of the present disclosure. A schematic partial sectional view of part of the solid-state image sensor of the embodiment 8 is depicted in FIG. 28, and equivalent circuit diagrams of the solid-state image sensor of the embodiment 8 are depicted in FIGS. 29 and 30. Further, a schematic arrangement diagram of a first electrode, a transfer controlling electrode, and a charge accumulating electrode, and transistors configuring a control portion which configure an imaging element of the solid-state image sensor of the embodiment 8 is depicted in FIG. 31. Further, states of potentials at individual portions upon operation of the imaging element of the embodiment 8 are depicted in FIGS. 32 and 33. Furthermore, an equivalent circuit diagram illustrating portions of the imaging element of the embodiment 8 is depicted in FIG. 15B.

The solid-state image sensor of the embodiment 8 further includes a transfer controlling electrode (charge transfer electrode) 25 arranged in a spaced relation from the first electrode 21 and the charge accumulating electrode 24 between the first electrode 21 and the charge accumulating electrode 24 and besides arranged in an opposed relation to the photoelectric conversion portion 23 with the insulating layer 82 interposed therebetween. The transfer controlling electrode 25 is connected to a pixel driving circuit configuring the driving circuit through a connecting portion 25B, a pad portion 25A, and a wiring $V_{OT}$ provided in the interlayer insulating layer 81.

In the following, operation of the imaging element (first imaging element) of the embodiment 8 is described with reference to FIGS. 32 and 33. It is to be noted that, in FIGS. 32 and 33, the values of the potential applied to the charge accumulating electrode 24 and the potential at a point $P_C$ are different.

During a charge accumulation period, from the driving circuit, the potential $V_{11}$ is applied to the first electrode 21, the potential $V_{31}$ is applied to the charge accumulating electrode 24, and the potential $V_{41}$ is applied to the transfer controlling electrode 25. Photoelectric conversion takes place in the photoelectric conversion portion 23 by light incident to the photoelectric conversion portion 23. Positive holes generated by the photoelectric conversion are sent out from the second electrode 22 to the driving circuit through a wiring $V_{OU}$. On the other hand, since the potential of the first electrode 21 is set higher than the potential of the second electrode 22, that is, since, for example, a positive potential is applied to the first electrode 21 and a negative potential is applied to the second electrode 22, $V_{31}>V_{41}$ (for example, $V_{31}>V_{11}>V_{41}$ or $V_{11}>V_{31}>V_{41}$) is satisfied. Consequently, electrons generated by the photoelectric conversion are attracted to the charge accumulating electrode 24 and stop in the region of the photoelectric conversion portion 23 opposed to the charge accumulating electrode 24. In other words, charge is accumulated into the photoelectric conversion portion 23. Since $V_{31}>V_{41}$ is satisfied, electrons generated in the inside of the photoelectric conversion portion 23 can be prevented with certainty from moving toward the first electrode 21. As time of the photoelectric conversion elapses, the value of the potential in the region of the photoelectric conversion portion 23 opposed to the charge accumulating electrode 24 increases in the negative direction.

At a later stage of the charge accumulation period, a reset operation is performed. Consequently, the potential of the first floating diffusion layer $FD_1$ is reset, and the potential of the first floating diffusion layer $FD_1$ becomes the potential $V_{DD}$ of the power supply.

After completion of the reset operation, reading out of the charge is performed. In other words, during a charge transfer period, from the driving circuit, the potential $V_{12}$ is applied to the first electrode 21, the potential $V_{32}$ is applied to the charge accumulating electrode 24, and the potential $V_{42}$ is applied to the transfer controlling electrode 25. Here, it is assumed that $V_{32} \leq V_{42} \leq V_{12}$ is satisfied (preferably, $V_{32}<V_{42}<V_{12}$ is satisfied). By this, electrons staying in the region of the photoelectric conversion portion 23 opposed to the charge accumulating electrode 24 are read out with certainty to the first electrode 21 and further to the first floating diffusion layer $FD_1$. In other words, charge accumulated in the photoelectric conversion portion 23 is read out to the control portion.

With the above, the series operation of charge accumulation, a reset operation, and charge transfer is completed.

Operation of the amplification transistor $TR1_{amp}$ and the selection transistor $TR1_{sel}$ after electrons are read out into the first floating diffusion layer $FD_1$ is the same as operation of conventional amplification transistor and selection transistor. Further, for example, such a series of operations as charge accumulation, a reset operation, and charge transfer of the second imaging element and the third imaging element is similar to a conventional series of operations of charge transfer, a reset operation, and charge transfer.

Figure 34:
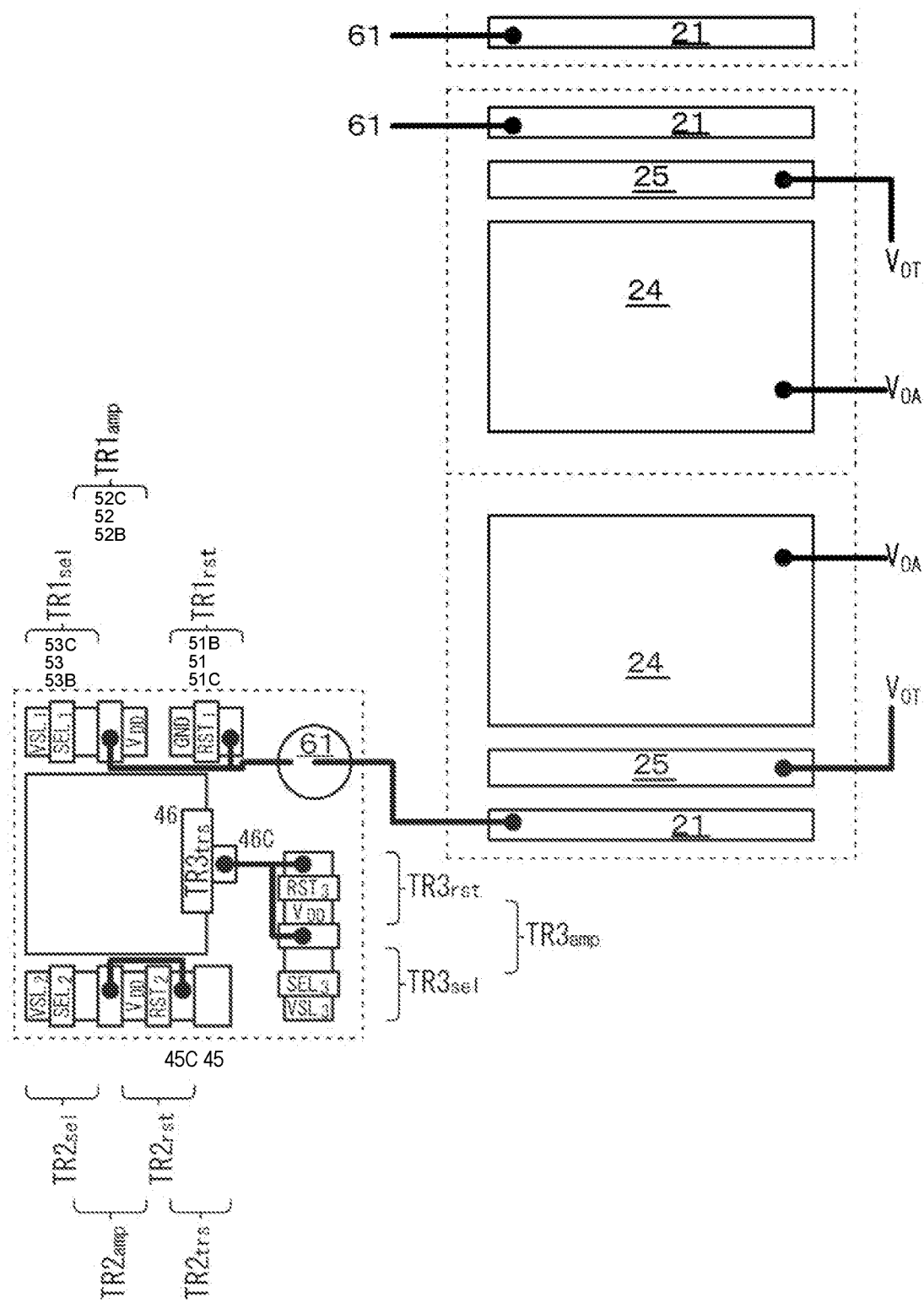
FIG. 34 is a schematic arrangement diagram of a first electrode, a transfer controlling electrode, and a charge accumulating electrode and transistors configuring the control portion that configure a modification of the imaging element of the embodiment 8.

As depicted in FIG. 34 that depicts a schematic arrangement diagram of a first electrode and a charge accumulating electrode and transistors configuring a control portion which configure a modification of the imaging element of the embodiment 8, the other source/drain region 51B of the reset transistor $TR1_{rst}$ may be grounded in place of being connected to the power supply $V_{DD}$.

Further, a plurality of transfer controlling electrodes may be provided from a position nearest to the first electrode 21 toward the charge accumulating electrode 24.

Embodiment 9

Figure 35:
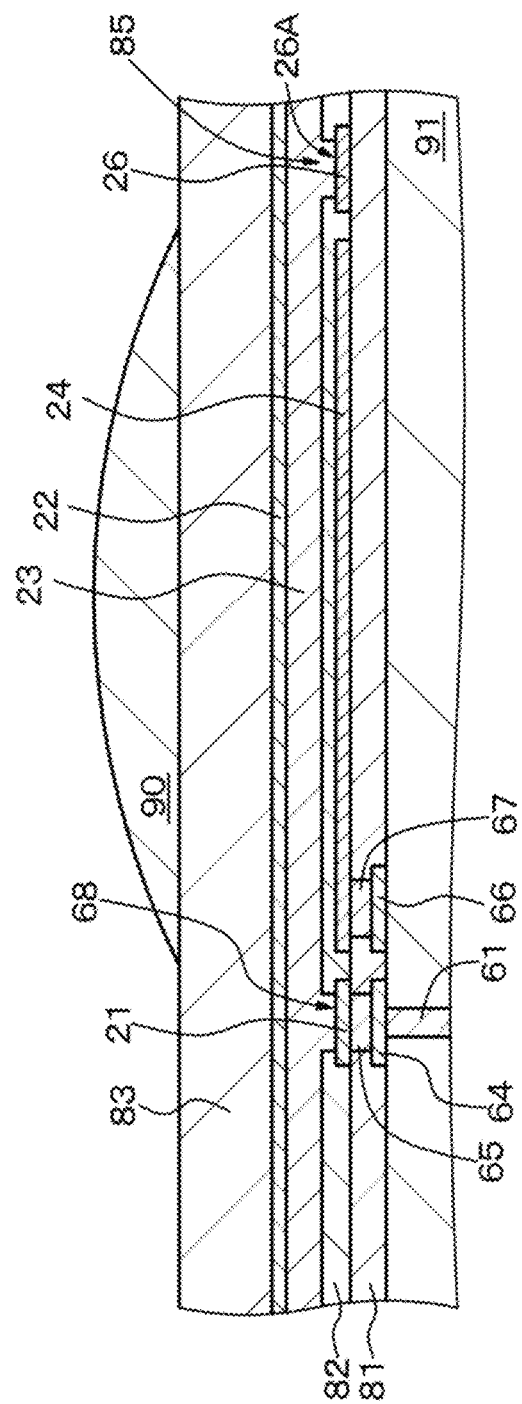
FIG. 35 is a schematic partial sectional view of a solid-state image sensor of an embodiment 9.

The embodiment 9 is a modification of the embodiment 1 to the embodiment 8 and relates to an imaging element and so forth that include a charge discharging electrode of the present disclosure. A schematic partial sectional view of part of the imaging element of the embodiment 9 is depicted in FIG. 35.

The imaging element of the embodiment 9 further includes a charge discharging electrode 26 connected to the photoelectric conversion portion 23 through a connecting portion 26A and arranged in a spaced relation from the first electrode 21 and the charge accumulating electrode 24. Here, the charge discharging electrode 26 is arranged so as to surround the first electrode 21 and the charge accumulating electrode 24 (that is, in the form of a picture frame). The charge discharging electrode 26 is connected to a pixel driving circuit that configures the driving circuit. The photoelectric conversion portion 23 extends in the connecting portion 26A. In other words, the photoelectric conversion portion 23 extends in a second opening 85 provided in the insulating layer 82 and is connected to the charge discharging electrode 26. The charge discharging electrode 26 is shared by (made common to) a plurality of imaging elements. The charge discharging electrode 26 can be used, for example, as a floating diffusion or an overflow drain of the photoelectric conversion portion 23. In a case where it is difficult to provide the charge discharging electrode 26 and the lower isolation electrode 27 at the same time, it is sufficient if the upper isolation electrode 27' is provided.

In the embodiment 9, during a charge accumulation period, from the driving circuit, the potential $V_{11}$ is applied to the first electrode 21, the potential $V_{31}$ is applied to the charge accumulating electrode 24, and the potential $V_{51}$ is applied to the charge discharging electrode 26, and charge is accumulated into the photoelectric conversion portion 23. Photoelectric conversion takes place in the photoelectric conversion portion 23 by light incident to the photoelectric conversion portion 23. Positive holes generated by the photoelectric conversion are sent out from the second electrode 22 to the driving circuit through a wiring $V_{OU}$. On the other hand, since the potential of the first electrode 21 is set higher than the potential of the second electrode 22, that is, for example, since a positive potential is applied to the first electrode 21 and a negative potential is applied to the second electrode 22, $V_{51} \geq V_{11}$ (for example, $V_{31>} \leq V_{51>} \leq V_{11}$), is satisfied. By this, electrons generated by photoelectric conversion are attracted to the charge accumulating electrode 24 and stay in a region of the photoelectric conversion portion 23 opposed to the charge accumulating electrode 24, and can be prevented from moving toward the first electrode 21 with certainty. However, if the attraction by the charge accumulating electrode 24 is not sufficient or electrons remain without being accumulated into the photoelectric conversion portion 23 (what are generally called overflowing electrons), then the electrons are sent out to the driving circuit through the charge discharging electrode 26.

At a later stage of the charge accumulation period, a reset operation is performed. Consequently, the potential of the first floating diffusion layer $FD_1$ is reset, and the potential of the first floating diffusion layer $FD_1$ becomes the potential $V_{DD}$ of the power supply.

After completion of the reset operation, reading out of charge is performed. In other words, during a charge transfer period, from the driving circuit, the potential $V_{12}$ is applied to the first electrode 21, the potential $V_{32}$ is applied to the charge accumulating electrode 24, and the potential $V_{52}$ is applied to the charge discharging electrode 26. Here, $V_{52} < V_{12}$ (for example, $V_{52} < V_{32} < V_{12}$) is set. By this, electrons staying in the region of the photoelectric conversion portion 23 opposed to the charge accumulating electrode 24 are read out to the first electrode 21 and further to the first floating diffusion layer $FD_1$ with certainty. In other words, the charge accumulated in the photoelectric conversion portion 23 is read out to the control portion.

With the above, the series of operations of charge accumulation, a reset operation, and charge transfer is completed.

Operation of the amplification transistor $TR1_{amp}$ and the selection transistor $TR1_{sel}$ after electrons are read out into the first floating diffusion layer $FD_1$ is the same as operation of conventional amplification transistor and selection transistor. Further, for example, such a series of operations as charge accumulation, a reset operation, and charge transfer of the second imaging element and the third imaging element is similar to a conventional series of operations of charge accumulation, a reset operation, and charge transfer.

In the embodiment 9, since what are generally called overflowing electrons are sent out to the driving circuit through the charge discharging electrode 26, leakage of electrons into the charge accumulation portion of an adjacent pixel can be suppressed and occurrence of blooming can be suppressed. Consequently, the imaging performance of the imaging element can be improved.

Although the present disclosure has been described on the basis of the preferred embodiments, the present disclosure is not restricted to the embodiments. The structure and configuration, production conditions, production methods, and used materials of the solid-state image sensors described with reference to the embodiments are exemplary and can be changed suitably. The imaging elements described in connection with the embodiments can be combined suitably.

In some cases, it is also possible to share the flowing diffusion layers $FD_2$, $FD_3$, 45C, and 46C as described hereinabove.

Figure 36:
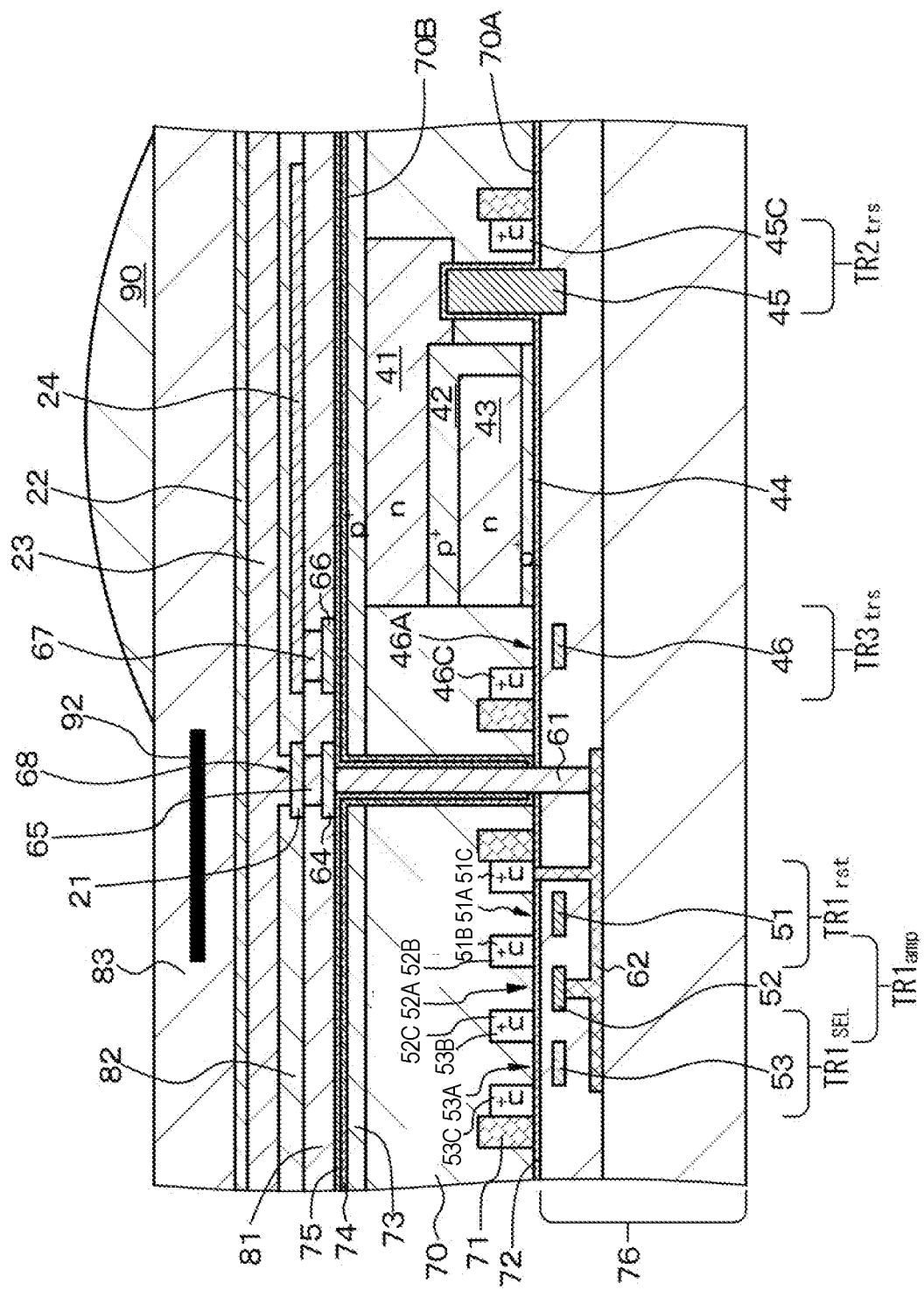
FIG. 36 is a schematic partial sectional view of still another modification of the solid-state image sensor of the embodiment 1.

Further, as depicted in FIG. 36 that depicts a modification of the solid-state image sensor described hereinabove, for example, in connection with the embodiment 1, the solid-state image sensor can be configured such that light is incident from the side of the second electrode 22 and a shading layer 92 is formed on the light incidence side rather near to the second electrode 22. It is to be noted that also it is possible to cause various wirings provided on the light incidence side with respect to the light conversion portion to function as a shading layer.

Figure 37:
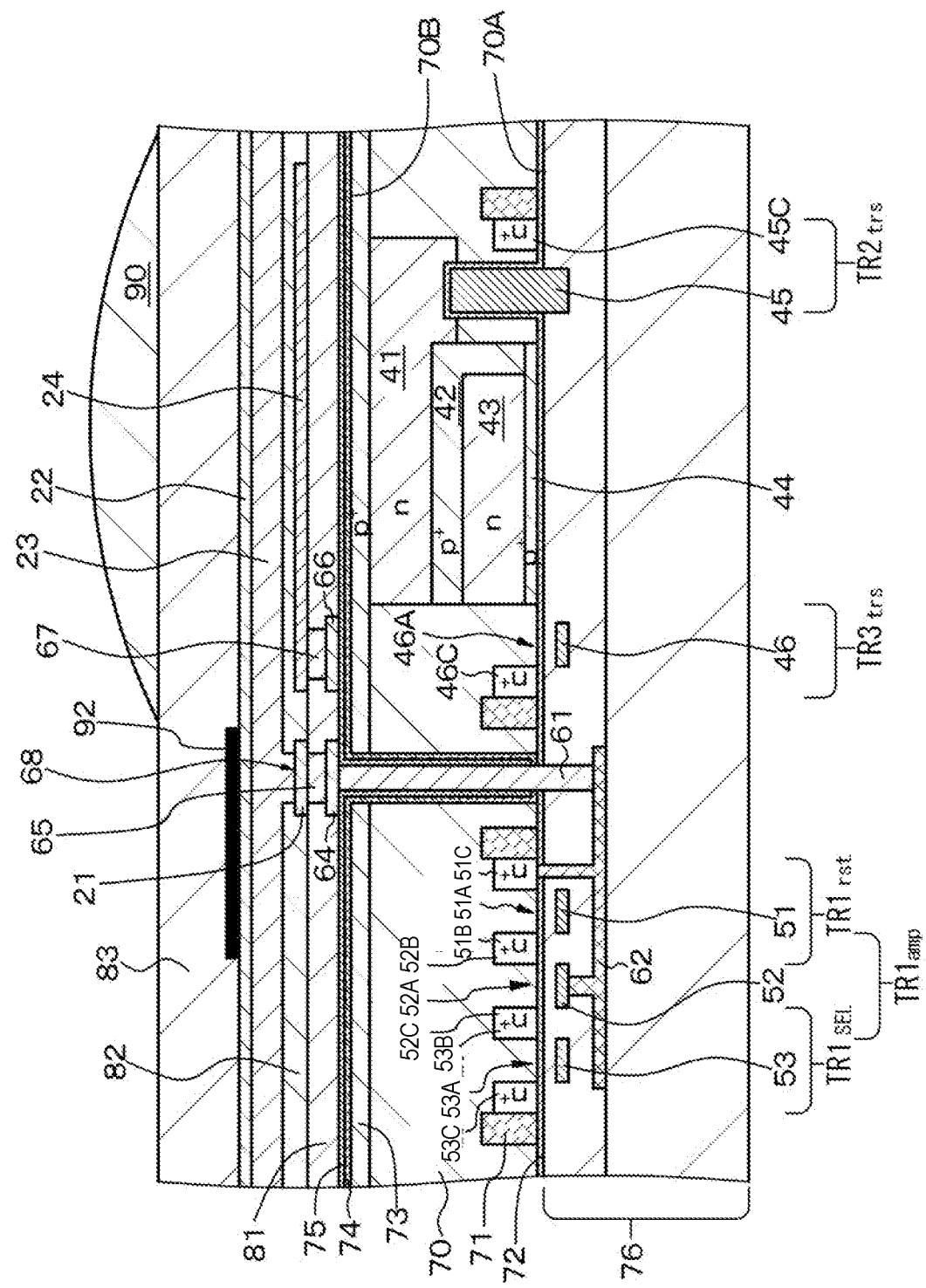
FIG. 37 is a schematic partial sectional view of yet another modification of the solid-state image sensor of the embodiment 1.
Figure 38:
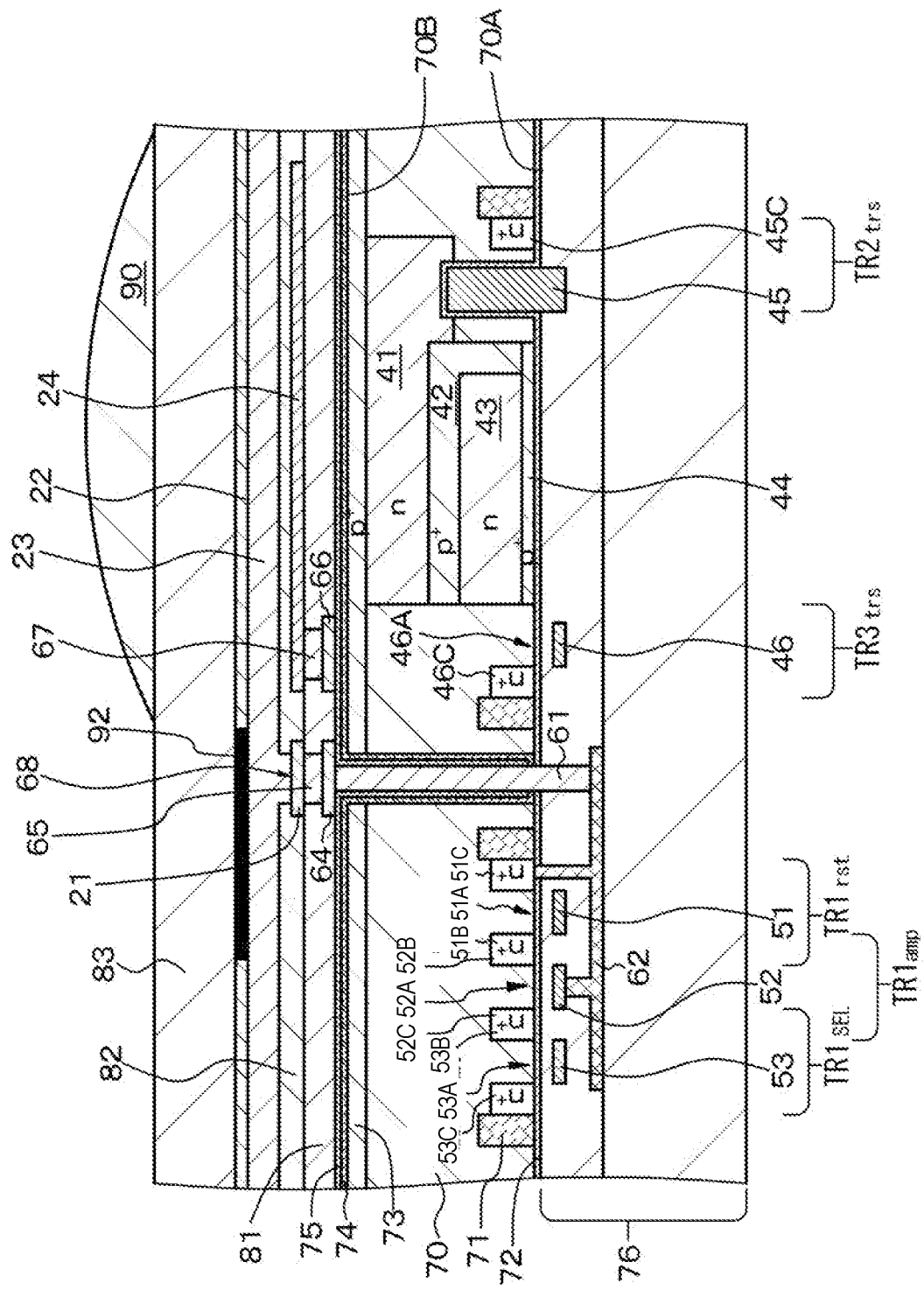
FIG. 38 is a schematic partial sectional view of a further modification of the solid-state image sensor of the embodiment 1.

It is to be noted that, although, in the example depicted in FIG. 36, the shading layer 92 is formed above the second electrode 22, that is, although the shading layer 92 is formed above the first electrode 21 on the light incidence side rather near to the second electrode 22, the shading layer 92 may otherwise be arranged on a face of the second electrode 22 on the light incidence side as depicted in FIG. 37. Further, in some cases, the shading layer 92 may be formed on the second electrode 22 as depicted in FIG. 38.

Figure 39:
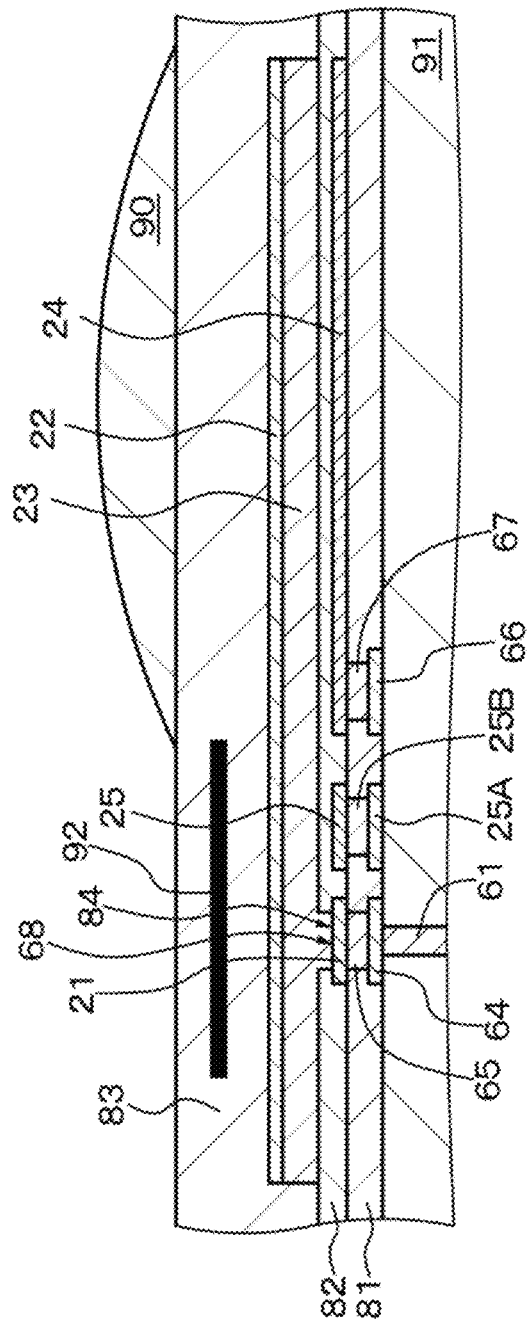
FIG. 39 is a schematic partial sectional view of a still further modification of the solid-state image sensor of the embodiment 1.
Figure 40:
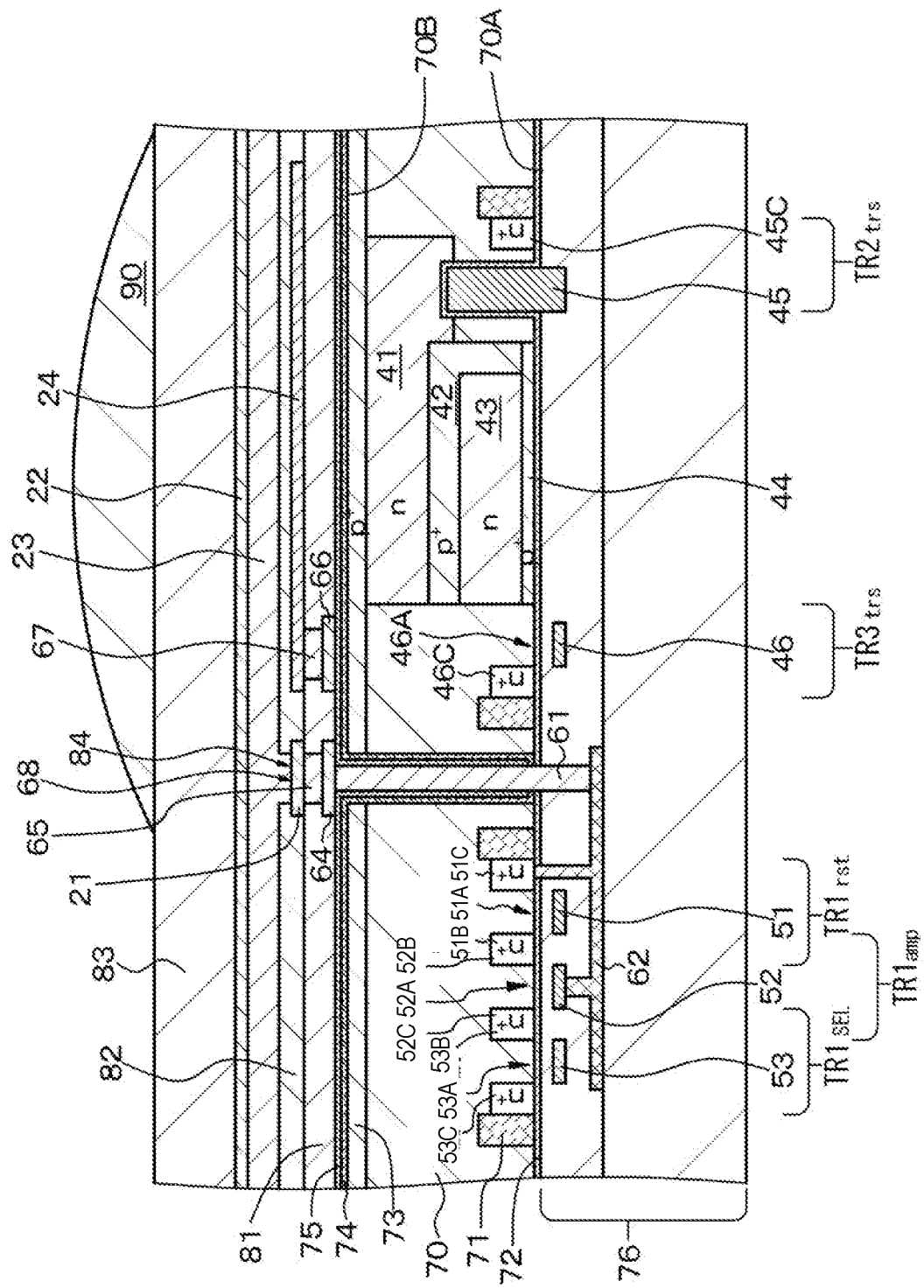
FIG. 40 is a schematic partial sectional view of a yet further modification of the solid-state image sensor of the embodiment 1.

Alternatively, it is also possible to adopt such a structure that light is incident from the second electrode 22 side while light is not incident to the first electrode 21. In particular, as depicted in FIG. 36, the shading layer 92 is formed above on the first electrode 21 on the light incidence side rather near to the second electrode 22. Alternatively, such a structure as depicted in FIG. 40 may be used in which an on-chip microlens 90 is provided above the charge accumulating electrode 24 and the second electrode 22 such that light incident to the on-chip microlens 90 is focused on the charge accumulating electrode 24 and does not reach the first electrode 21. It is to be note that, in a case where the transfer controlling electrode 25 is provided as described hereinabove in connection with the embodiment 11, it is possible to adopt a form in which light is not incident to the first electrode 21 and the transfer controlling electrode 25, and particularly, it is also possible to adopt a structure that the shading layer 92 is formed above the first electrode 21 and the transfer controlling electrode 25 as depicted in FIG. 39. Alternatively, it is also possible to adopt a structure in which light incident to the on-chip microlens 90 does not reach the first electrode 21 or to the first electrode 21 and the transfer controlling electrode 25.

By adopting such configurations or structures as described above, or by providing the shading layer 92 or designing the on-chip microlens 90 such that light is incident only to a portion of the photoelectric conversion portion 23 positioned above the charge accumulating electrode 24, a portion of the photoelectric conversion portion 23 that is positioned above the first electrode 21 (or above the first electrode 21 and the transfer controlling electrode 25) does not contribute to photoelectric conversion. Therefore, all pixels can be reset all at once with a higher degree of accuracy, and a global shutter function can be implemented more easily. In other words, in a driving method for a solid-state image sensor that includes a plurality of imaging element having such configurations or structures as described above, the following steps are repeated: discharging, in all imaging elements all at once, while charge is accumulated into the photoelectric conversion portion 23, charge in the first electrode 21 to the outside of the system; and then transferring, in all imaging elements all at once, the charge accumulated in the photoelectric conversion portion 23 to the first electrode 21 and sequentially reading out, after completion of the transfer, the charge transferred to the first electrode 21 in each imaging element.

In such a driving method for a solid-state image sensor as described above, each imaging element is structured such that light incident from the second electrode side is not incident to the first electrode, and, in all imaging elements all at once, while charge is accumulated into the photoelectric conversion portion, charge in the first electrode is discharged to the outside of the system. Therefore, in all imaging elements all at once, resetting of the first electrode can be performed with certainty. Thereafter, in all imaging elements, charge accumulated in the photoelectric conversion portion is transferred to the first electrode, and after completion of the transfer, the charge transferred to the first electrode in the imaging elements is read out sequentially. Therefore, what is generally called global shutter function can be implemented more easily.

Although, in the embodiments, electrons are signal charge and the conduction type of the photoelectric conversion portion formed on the semiconductor substrate is the n type, the technology according to the present disclosure can be applied to a solid-state image sensor in which positive holes are signal charge. In this case, it is sufficient if each semiconductor region is formed by a semiconductor region of the reverse conduction type and it is sufficient if the conduction type of the photoelectric conversion portion formed on the semiconductor substrate is the p type.

Further, while the embodiments are described taking a case in which the technology according to the present disclosure is applied to a CMOS type solid-state image sensor in which unit pixels that detect signal charge according to an incident light amount as a physical quantity are arranged in rows and columns as an example, application of the technology according to the present disclosure is not limited to a CMOS type solid-state image sensor, but the technology according to the present disclosure can also be applied to a CCD type solid-state image sensor. In the latter case, signal charge is transferred in the vertical direction by a vertical transfer register of the CCD type structure and transferred in the horizontal direction by a horizontal transfer register and then amplified to output a pixel signal (image signal). Further, the solid-state image sensor is not limited to column type solid-state image sensors in general in which pixels are formed in a two-dimensional matrix and a column signal processing circuit is arranged for each pixel column. Further, in some cases, it is also possible to omit the selection transistor.

Further, the application of the solid-state image sensor of the present disclosure is not limited to the application of a solid-state image sensor that detects and captures a distribution of an incident light amount of visible light as an image, but the solid-state image sensor of the present disclosure can also be applied to a solid-state image sensor that captures a distribution of an incident amount of infrared rays, X rays, particles, or the like as an image. Further, in a wide sense, the solid-state image sensor of the present disclosure can be applied to solid-state image sensors (physical quantity distribution detection apparatus) in general such as a fingerprint detection sensor that detects and captures a distribution of any other physical quantity such as pressure or capacitance.

Further, the solid-state image sensor of the present disclosure is not limited to a solid-state image sensor that scans unit pixels in an imaging region in order in a unit of a row to read out a pixel signal from each unit pixel. The solid-state image sensor of the present disclosure can also be applied to a solid-state image sensor of the X-Y address type in which any pixel is selected in a unit of a pixel to read out a pixel signal in a unit of a pixel from the selected pixel. The solid-state image sensor may be formed as one chip or may be formed as a module having an imaging function in which an imaging region and a driving circuit or an optical system are packaged collectively.

Further, the technology according to the present disclosure is not limited to a solid-state image sensor but is also applicable to an imaging apparatus. Here, the imaging apparatus signifies a camera system such as a digital still camera or a video camera and electronic equipment having an imaging function such as a mobile phone. The image sensor sometimes has a form of a module incorporated in electronic equipment, that is, the image sensor sometimes is formed as a camera module.

Figure 41:
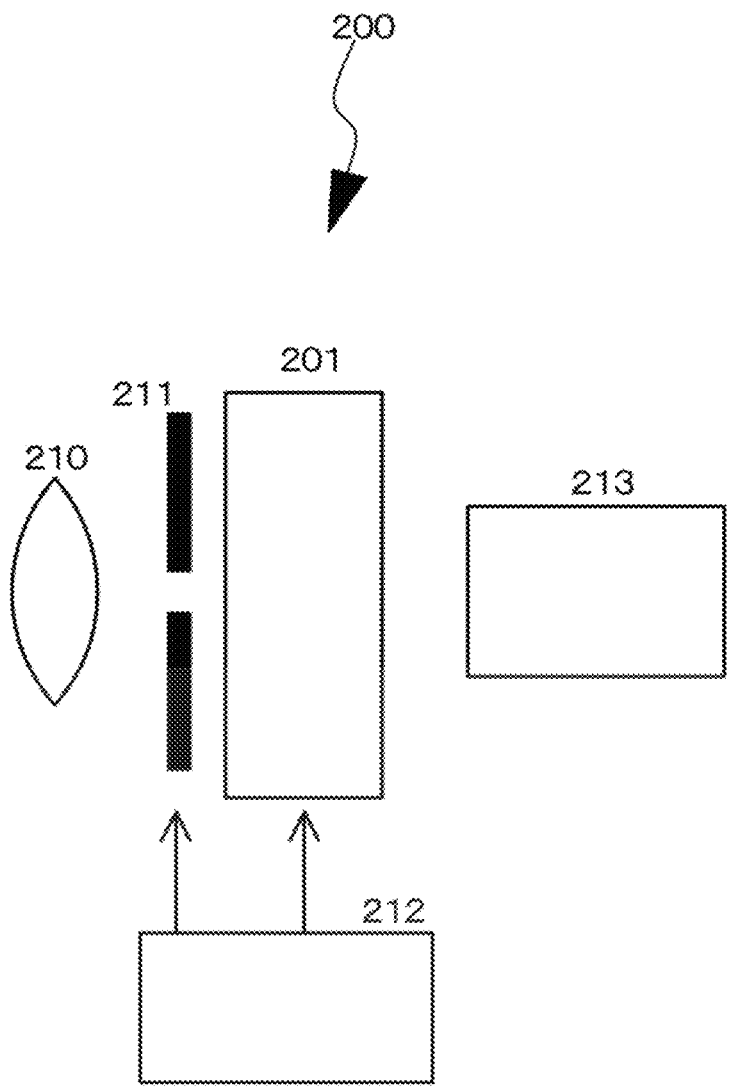
FIG. 41 is a conceptual diagram of an example in which a solid-state image sensor configured from the solid-state image sensor of the present disclosure is used in electronic equipment (camera).

An example in which a solid-state image sensor 201 configured from the solid-state image sensor of the present disclosure is used in electronic equipment (camera) 200 is depicted as a conceptual diagram in FIG. 41. The electronic equipment 200 includes a solid-state image sensor 201, an optical lens 210, a shutter device 211, a driving circuit 212, and a signal processing circuit 213. The optical lens 210 forms an image of image light (incident light) from an imaging target on an imaging plane of the solid-state image sensor 201. Consequently, signal charge is accumulated for a fixed period of time into the solid-state image sensor 201. The shutter device 211 controls the light irradiation period and the light blocking period to the solid-state image sensor 201. The driving circuit 212 supplies a driving signal for controlling transfer operation and so forth of the solid-state image sensor 201 and shutter operation of the shutter device 211. In response to a driving signal (timing signal) supplied from the driving circuit 212, signal transfer of the solid-state image sensor 201 is performed. The signal processing circuit 213 performs various signal processes. A video signal for which the signal processes have been performed is stored into a storage medium such as a memory or is outputted to a monitor. In such electronic equipment 200 as described above, since refinement of the pixel size and improvement of the transfer efficiency of the solid-state image sensor 201 can be achieved, the electronic equipment 200 whose improvement in pixel characteristic is achieved can be obtained. The electronic equipment 200 to which the solid-state image sensor 201 can be applied is not limited to a camera but can be applied to an imaging sensor such as a camera module for mobile equipment such as a digital still camera or a mobile phone.

Figure 42:
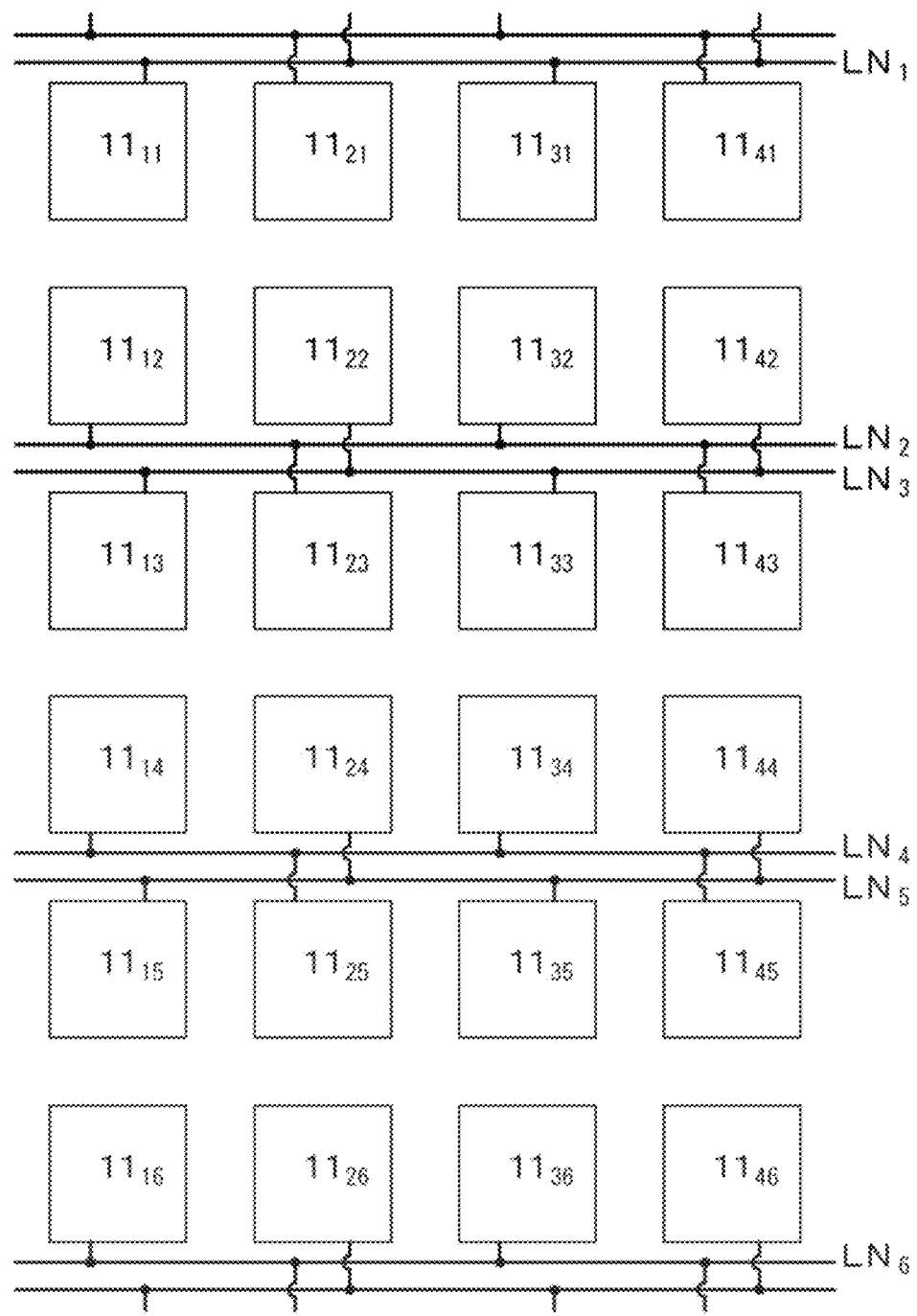
FIG. 42 is a conceptual diagram of part of the solid-state image sensor for illustrating a driving method for an example of the solid-state image sensor of the present disclosure.

In a case where P=2 and Q=2 are satisfied in the solid-state image sensor of the embodiment 3 or the solid-state image sensor of the embodiment 4, a driving method described below can be adopted. In other words, as depicted in a schematic view of FIG. 42, four imaging elements $11_{2p+1,2q+1}$, $11_{2p+1,2q+2}$, $11_{2p+2,2q+1}$, and $11_{2p+2,2q+2}$ which configure one imaging element block (where p is 0 or a positive integer and q is 0 or a positive integer) are assumed. Here, the charge accumulating electrode 24 of the imaging element $11_{2p+1,2q+1}$ is connected to a (2q+1)th horizontal driving line $L_{2q+1}$. The charge accumulating electrode 24 of the imaging element $11_{2p+1,2q+2}$ is connected to a (2q+2)th horizontal driving line $L_{2q+2}$. The charge accumulating electrode 24 of the imaging element $11_{2p+2,2q+1}$ is connected to a (2q)th horizontal driving line $L_{2q}$. The charge accumulating electrode 24 of the imaging element $11_{2p+2,2q+2}$ is connected to a (2q+3)th horizontal driving line $L_{2q+3}$.

By configuring the solid-state image sensor in such a manner as described above, while usually four horizontal driving lines are required to drive charge accumulating electrodes in four imaging elements that configure one imaging element block, the number of horizontal driving lines can be reduced to two. Further, by suitably driving the four horizontal driving lines $L_{2q}$, $L_{2q+1}$, $L_{2q+2}$, and $L_{2q+3}$, charge in the imaging elements $11_{2p+1,2q+1}$, $11_{2p+1,2q+2}$, $11_{2p+2,2q+1}$, and $11_{2p+2,2q+2}$ can be read out.

The technology according to the present disclosure (present technology) can be applied to various products. For example, the technology according to the present disclosure may be implemented as an apparatus that is incorporated in any of various kinds of mobile bodies such as an automobile, an electric automobile, a hybrid electric automobile, a motorcycle, a bicycle, a personal mobility, an airplane, a drone, a ship, and a robot.

Figure 44:
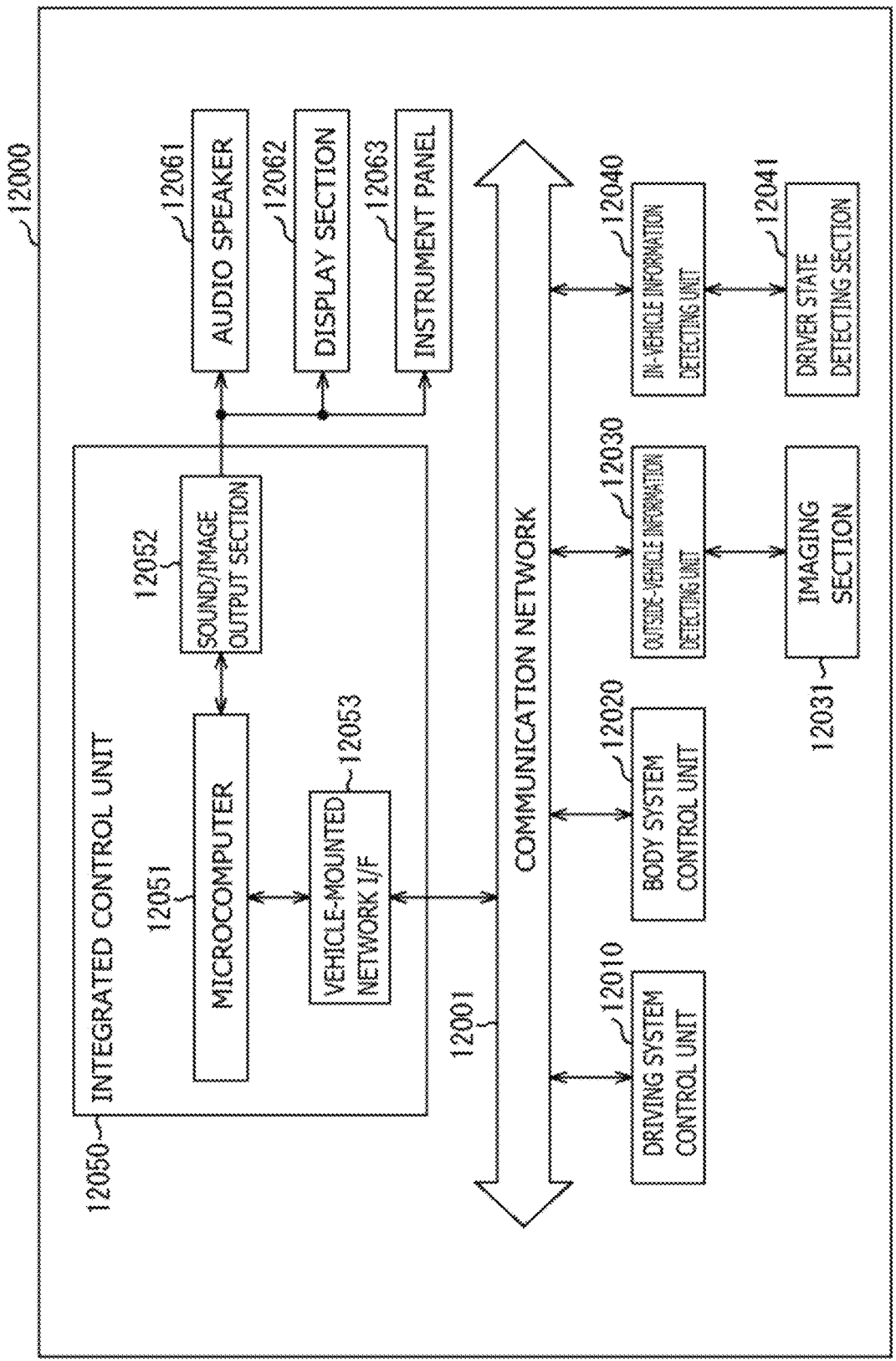
FIG. 44 is a block diagram depicting an example of schematic configuration of a vehicle control system.

FIG. 44 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 44, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 44, an audio speaker 12061, a display section 12062, and an instrument panel 12063 are illustrated as the output device. The display section 12062 may, for example, include at least one of an on-board display and a head-up display.

Figure 45:
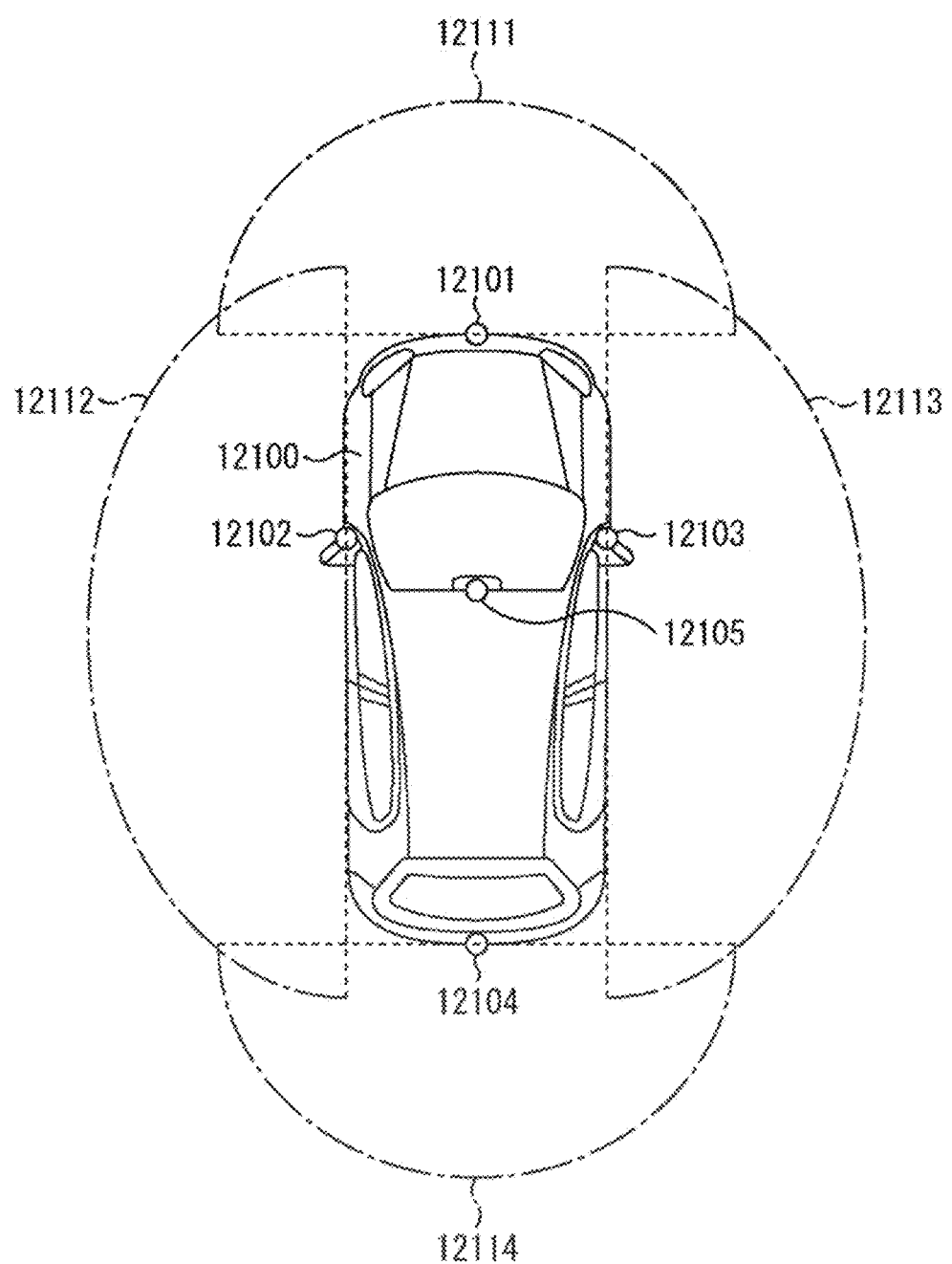
FIG. 45 is a diagram of assistance in explaining an example of installation positions of an outside-vehicle information detecting section and an imaging section.

FIG. 45 is a diagram depicting an example of the installation position of the imaging section 12031.

In FIG. 45, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 45 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Further, for example, the technology according to the present disclosure may be applied to an endoscopic surgery system.

Figure 46:
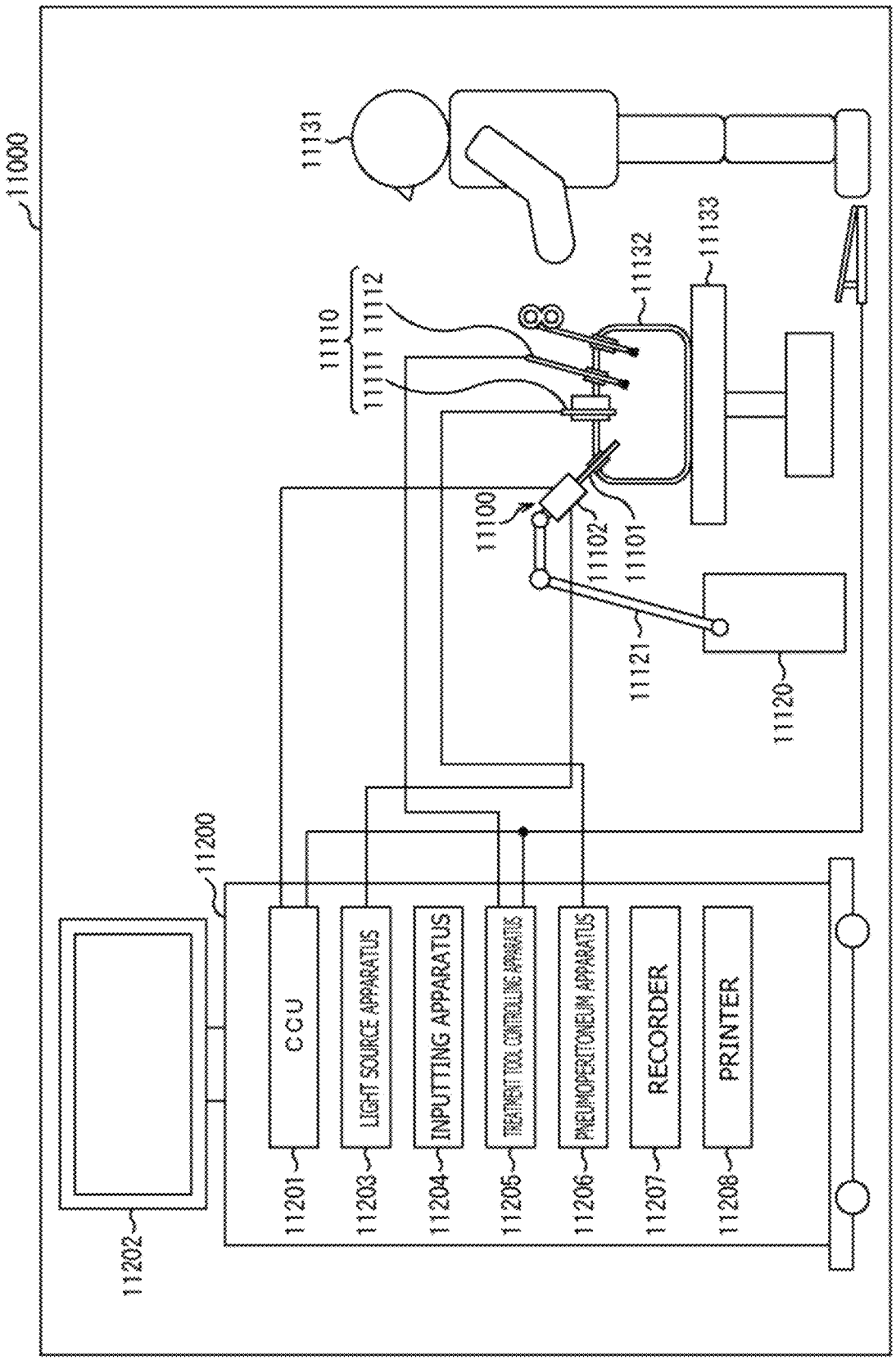
FIG. 46 is a view depicting an example of a schematic configuration of an endoscopic surgery system.

FIG. 46 is a view depicting an example of a schematic configuration of an endoscopic surgery system to which the technology according to an embodiment of the present disclosure (present technology) can be applied.

In FIG. 46, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 47:
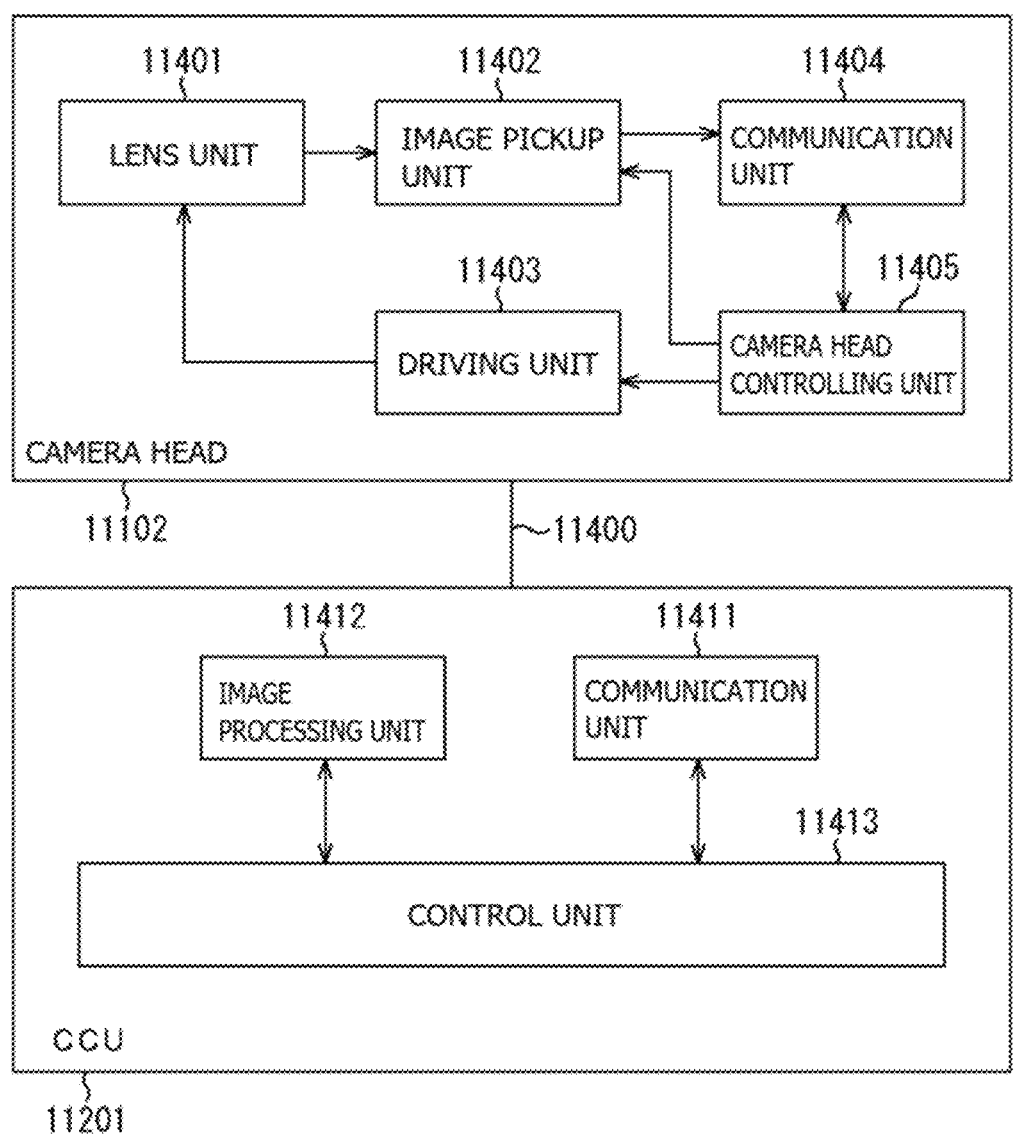
FIG. 47 is a block diagram depicting an example of a functional configuration of a camera head and a camera control unit (CCU).

FIG. 47 is a block diagram depicting an example of a functional configuration of the camera head 11102 and the CCU 11201 depicted in FIG. 46.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

It is to be noted here that, although an endoscopic surgery system is described as an example, the technology according to the present disclosure may be applied further, for example, to a microscopic surgery system and so forth.

It is to be noted that the present disclosure can take such configurations as described below.

[A01]

<<Solid-State Image Sensor>>

A solid-state image sensor including:

a plurality of imaging element blocks each configured from a plurality of imaging elements, in which each of the imaging elements includes a first electrode, a charge accumulating electrode arranged in a spaced relation from the first electrode, a photoelectric conversion portion contacting with the first electrode and formed above the charge accumulating electrode with an insulating layer interposed therebetween, and a second electrode formed on the photoelectric conversion portion, the first electrode and the charge accumulating electrode are provided on an interlayer insulating layer, and the first electrode is connected to a connection portion provided in the interlayer insulating layer.

[A02]

The solid-state image sensor according to [A01], in which the imaging element block is configured from P×Q (where, P≥2 and Q≥1) imaging elements including P imaging elements along a first direction and Q imaging elements along a second direction different from the first direction.

[A03]

<<Solid-State Image Sensor of the First Configuration>>

The solid-state image sensor according to [A02], in which P=2 and Q=1 are satisfied, and first electrodes individually configuring two imaging elements along the first direction are connected to the connection portion provided in the interlayer insulating layer.

[A04]

The solid-state image sensor according to [A03], in which the imaging element block is surrounded by a continuous isolation electrode.

[A05]

The solid-state image sensor according to [A04], in which a continuous second isolation electrode extending along the second direction from the isolation electrode is provided between the two imaging elements along the first direction.

[A06]

The solid-state image sensor according to [A03], in which a second isolation electrode extending along the second direction is provided between the two imaging elements along the first direction.

[A07]

<<Solid-State Image Sensor of the Second Configuration>>

The solid-state image sensor according to [A02], in which P=2 is satisfied, and Q is a natural number equal to or greater than 2, and first electrodes individually configuring two imaging elements along the first direction are connected to the connection portion provided in the interlayer insulating layer.

[A08]

The solid-state image sensor according to [A07], in which the imaging element block is surrounded by a continuous isolation electrode.

[A09]

The solid-state image sensor according to [A08], in which a continuous second isolation electrode extending along the second direction from the isolation electrode is provided between the two imaging elements along the first direction.

[A10]

The solid-state image sensor according to [A07], in which a second isolation electrode extending along the second direction is provided between the two imaging elements along the first direction.

[A11]

<<Solid-State Image Sensor of the 3Ath Configuration>>

The solid-state image sensor according to [A02], in which P=2 and Q=2 are satisfied, a first electrode configuring two imaging elements along the second direction is shared, and the shared first electrode is connected to the connection portion provided in the interlayer insulating layer.

[A12]

<<Solid-State Image Sensor of the 3Ath Configuration>>

The solid-state image sensor according to [A02], in which P=2 and Q=2 are satisfied, a first electrode configuring two imaging elements along the first direction is shared, and the shared first electrode is connected to the connection portion provided in the interlayer insulating layer.

[A13]

The solid-state image sensor according to [A11] or [A12], in which the imaging element block is surrounded by a continuous isolation electrode.

[A14]

The solid-state image sensor according to [A13], in which a continuous second isolation electrode extending along the second direction from the isolation electrode is provided between the two imaging elements along the first direction.

[A15]

The solid-state image sensor according to [A11], in which a second isolation electrode extending along the second direction is provided between two imaging elements along the first direction.

[A16]

The solid-state image sensor according to any one of [A01] to [A15], in which the imaging elements are arranged line-symmetrically with respect to a boundary line extending in a second direction between the imaging elements configuring the imaging element block.

[A17]

The solid-state image sensor according to any one of [A04] to [A16], in which a potential of the isolation electrode has a fixed value $V_{ES}$.

REFERENCE SIGNS LIST

10 . . . Imaging element block, 21 . . . First electrode, 22 . . . Second electrode, 23 . . . Photoelectric conversion portion, $23_{up}$ . . . Upper layer photoelectric conversion layer, $23_{DN}$ . . . Lower layer semiconductor layer, 24 . . . Charge accumulating electrode, 25 . . . Transfer controlling electrode (charge transfer electrode), 25A, 26A . . . Connecting portion, 26 . . . Charge discharging electrode, 27 . . . Isolation electrode (lower isolation electrode), 27' . . . Upper isolation electrode, 28 . . . First isolation electrode (lower first isolation electrode), 29 . . . Second isolation electrode (upper second isolation electrode), 41 . . . n-type semiconductor region (second photoelectric conversion portion) configuring second imaging element, 43 . . . n-type semiconductor region (third photoelectric conversion portion) configuring third imaging element, 42, 44, 73 . . . $p^+$ layer, $FD_1$, $FD_2$, $FD_3$, 45C, 46C . . . Floating diffusion region, $TR1_{amp}$ . . . Amplification transistor, $TR1_{rst}$ . . . Reset transistor, $TR1_{sel}$ . . . Selection transistor, 51 . . . Gate portion of reset transistor $TR1_{rst}$, 51A . . . Channel formation region of reset transistor $TR1_{rst}$, 51B, 51C . . . Source/drain region of reset transistor $TR1_{rst}$, 52 . . . Gate portion of amplification transistor $TR1_{amp}$, 52A . . . Channel formation region of amplification transistor $TR1_{amp}$, 52B, 52C . . . Source/drain region of amplification transistor $TR1_{amp}$, 53 . . . Gate portion of selection transistor $TR1_{sel}$, 53A . . . Channel formation region of selection transistor $TR1_{sel}$, 53B, 53C . . . Source/drain region of selection transistor $TR1_{sel}$, $TR2_{trs}$ . . . Transfer transistor, 45 . . . Gate portion of transfer transistor, $TR2_{rst}$ . . . Reset transistor, $TR2_{amp}$ . . . Amplification transistor, $TR2_{sel}$ . . . Selection transistor, $TR3_{trs}$ . . . Transfer transistor, 46 . . . Gate portion of transfer transistor, $TR3_{rst}$ . . . Reset transistor, $TR3_{amp}$ . . . Amplification transistor, $TR3_{sel}$ . . . Selection transistor, $V_{DD}$ . . . Power supply, $RST_1$, $RST_2$, $RST_3$ . . . Reset line, $SEL_1$, $SEL_2$, $SEL_3$ . . . Selection line, 117, $VSL_1$, $VSL_2$, $VSL_3$ . . . Signal line, $TG_2$, $TG_3$ . . . Transfer gate line, $V_{OA}$, $V_{OB}$/$V_{OT}$/$V_{OU}$ . . . Wiring, 61 . . . Contact hole portion, 62 . . . Wiring layer, 63 . . . Connection portion, 64 . . . Wiring layer, 65 . . . Connection hole, 66 . . . Pad portion, 67, 68 . . . Connecting portion, 70 . . . Semiconductor substrate, 70A . . . First face (front face) of semiconductor substrate, 70B . . . Second face (rear face) of semiconductor substrate, 71 . . . Element isolation region, 72 . . . Insulating material film, 74 . . . $HfO_2$ film, 75 . . . Insulating film, 76 . . . Interlayer insulating film, 81 . . . Interlayer insulating layer, 82 . . . Insulating layer, 83 . . . Protective layer, 84 . . . Opening, 85 . . . Second opening, 90 . . . On-chip microlens, 91 . . . Various imaging element components positioned below interlayer insulating layer, 92 . . . Shading layer, 100 . . . Solid-state image sensor, 101 . . . Stacked type imaging element, 111 . . . Imaging region, 112 . . . Vertical driving circuit, 113 . . . Column signal processing circuit, 114 . . . Horizontal driving circuit, 115 . . . Outputting circuit, 116 . . . Driving controlling circuit, 118 . . . Horizontal signal line, 200 . . . Electronic equipment (camera), 201 . . . Solid-state image sensor, 210 . . . Optical lens, 211 . . . Shutter device, 212 . . . Driving circuit, 213 . . . Signal processing circuit

What is claimed is:

1. A solid-state image sensor, comprising:
a plurality of imaging element blocks each configured from a plurality of imaging elements,
wherein each of the imaging elements includes:
 a first electrode;
 a charge accumulating electrode arranged in a spaced relation from the first electrode;
 a photoelectric conversion portion contacting the first electrode and formed above the charge accumulating electrode, wherein an insulating layer is interposed between the photoelectric conversion portion and the charge accumulating electrode; and
 a second electrode formed on the photoelectric conversion portion, wherein the first electrode and the charge accumulating electrode are provided on an interlayer insulating layer,
wherein at least one of the imaging element blocks is configured from P×Q (where, P≥2 and Q≥1) imaging elements including P imaging elements along a first direction and Q imaging elements along a second direction different from the first direction, and
wherein the first electrode of a first one of the imaging elements and the first electrode of a second one of the imaging elements are connected to a common connection portion provided in the interlayer insulating layer.

2. The solid-state image sensor according to claim 1, wherein
P=2 and Q=1 are satisfied.

3. The solid-state image sensor according to claim 2, wherein the at least one imaging element block is surrounded by a continuous first isolation electrode.

4. The solid-state image sensor according to claim 3, wherein a continuous second isolation electrode extending along the second direction from the first isolation electrode is provided between the first one of the imaging elements and the second one of the imaging elements along the first direction.

5. The solid-state image sensor according to claim 2, wherein an isolation electrode extending along the second direction is provided between the first one of the imaging elements and the second one of the imaging elements along the first direction.

6. The solid-state image sensor according to claim 1, wherein P=2 is satisfied, and Q is a natural number equal to or greater than 2.

7. The solid-state image sensor according to claim 6, wherein the at least one imaging element block is surrounded by a continuous first isolation electrode.

8. The solid-state image sensor according to claim 7, wherein a continuous second isolation electrode extending along the second direction from the first isolation electrode is provided between the first one of the imaging elements and the second one of the imaging elements along the first direction.

9. The solid-state image sensor according to claim 6, wherein an isolation electrode extending along the second direction is provided between the first one of the imaging elements and the second one of the imaging elements along the first direction.

10. The solid-state image sensor according to claim 1,
wherein P=2 and Q=2 are satisfied, and
wherein the first one of the imaging elements and the second one of the imaging elements are adjacent to one another along the second direction.

11. The solid-state image sensor according to claim 1,
wherein P=2 and Q=2 are satisfied, and
wherein the first one of the imaging elements and the second one of the imaging elements are adjacent to one another along the first direction.

12. The solid-state image sensor according to claim 10, wherein the at least one imaging element block is surrounded by a continuous first isolation electrode.

13. The solid-state image sensor according to claim 12, wherein a continuous second isolation electrode extending along the second direction from the first isolation electrode is provided between the first one of the imaging elements and the second one of the imaging elements along the first direction.

14. The solid-state image sensor according to claim 10, wherein an isolation electrode extending along the second direction is provided between two imaging elements along the first direction.

15. The solid-state image sensor according to claim 1, wherein the first one of the imaging elements and the second one of the imaging elements are arranged line-symmetrically with respect to a boundary line extending in the second direction between the first one of the imaging elements and the second one of the imaging elements configuring the at least one imaging element block.

16. The solid-state image sensor according to claim 3, wherein a potential of the first isolation electrode has a fixed value $V_{ES}$.

17. The solid-state image sensor according to claim 11, wherein the imaging element block is surrounded by a continuous first isolation electrode.

* * * * *